(12) United States Patent
Saldana et al.

(10) Patent No.: US 7,481,695 B2
(45) Date of Patent: Jan. 27, 2009

(54) POLISHING APPARATUS AND METHODS HAVING HIGH PROCESSING WORKLOAD FOR CONTROLLING POLISHING PRESSURE APPLIED BY POLISHING HEAD

(75) Inventors: Miguel A. Saldana, Fremont, CA (US); Damon Vincent Williams, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1736 days.

(21) Appl. No.: 09/748,708

(22) Filed: Dec. 22, 2000

(65) Prior Publication Data

US 2002/0146970 A1 Oct. 10, 2002

Related U.S. Application Data

(63) Continuation-in-part of application No. 09/644,135, filed on Aug. 22, 2000, now Pat. No. 6,585,572, and a continuation-in-part of application No. 09/668,667, filed on Sep. 22, 2000, now Pat. No. 6,652,357.

(51) Int. Cl.
  *B24B 5/00* (2006.01)
(52) U.S. Cl. ............... 451/5; 451/41; 451/285; 700/2; 700/95
(58) Field of Classification Search .......... 451/41, 451/285–290, 28, 57, 56, 11, 5, 8, 9, 10; 156/636.1, 637.1; 216/88; 437/225; 438/692–693; 700/2, 4, 95
See application file for complete search history.

(56) References Cited

U.S. PATENT DOCUMENTS 3,254,454 A 6/1966 Cetrangolo (Continued)

FOREIGN PATENT DOCUMENTS

EP 0 331 747 A1 3/1981

(Continued)

OTHER PUBLICATIONS

Weiderman and Kamenoff, "*Hartstone Uniprocessor Benchmark: Definitions and Experiments for Real-Time Systems*", p. 353-382, Journal of Real-Time Systems 4, (1992), The Netherlands.

(Continued)

*Primary Examiner*—Jacob K. Ackun, Jr.
(74) *Attorney, Agent, or Firm*—Martine Penilla & Gencarella, LLP

(57) ABSTRACT

CMP systems and methods implement instructions for moving a polishing pad relative to a wafer and a retainer ring and for applying pressure for CMP operations. Feedback of polishing pad position is coordinated with determinations of desired inputs of variable forces by which changing areas of the wafer, a pad conditioning puck, and the retainer ring are separately urged into contact with the polishing pad so that the pressure on each such area is separately controlled. Processing workload is evaluated according to criteria related to the characteristics of the instructions. If none of the criteria is exceeded, a central CMP processor is used for the processing. If any of the criteria is exceeded, the force determinations are made separately from the central CMP processor by a force controller, and the central processor manages data transfer to the force controller.

17 Claims, 62 Drawing Sheets

U.S. PATENT DOCUMENTS

| | | |
|---|---|---|
| 3,564,776 A | 2/1971 | Aspden |
| 3,589,078 A | 6/1971 | Bala et al. |
| 3,874,123 A | 4/1975 | Hopkins et al. |
| 3,979,239 A | 9/1976 | Walsh |
| 4,128,968 A | 12/1978 | Jones |
| 4,144,099 A | 3/1979 | Edmonds et al. |
| 4,197,676 A | 4/1980 | Sauerland |
| 4,232,485 A | 11/1980 | Eadon-Allen |
| 4,244,775 A | 1/1981 | D'Asaro |
| 4,358,338 A | 11/1982 | Downey et al. |
| 4,403,453 A | 9/1983 | Cave et al. |
| 4,419,848 A | 12/1983 | Dischert |
| 4,462,860 A | 7/1984 | Szmanda |
| 4,600,469 A | 7/1986 | Fusco et al. |
| 4,671,851 A | 6/1987 | Beyer et al. |
| 4,693,036 A | 9/1987 | Mori |
| 4,789,648 A | 12/1988 | Chow et al. |
| 4,793,895 A | 12/1988 | Kaanta et al. |
| 4,879,258 A | 11/1989 | Fisher |
| 4,956,944 A | 9/1990 | Ando et al. |
| 5,104,421 A | 4/1992 | Takizawa et al. |
| 5,287,663 A | 2/1994 | Pierce et al. |
| 5,486,129 A * | 1/1996 | Sandhu et al. ................. 451/5 |
| 5,508,077 A | 4/1996 | Chen et al. |
| 5,527,423 A | 6/1996 | Neville et al. |
| 5,542,874 A | 8/1996 | Chikaki |
| 5,547,417 A | 8/1996 | Breivogel et al. |
| 5,599,423 A | 2/1997 | Parker et al. |
| 5,631,839 A | 5/1997 | Lemoine ................. 364/468.15 |
| 5,665,201 A | 9/1997 | Sahota |
| 5,672,095 A | 9/1997 | Morimoto et al. |
| 5,816,895 A * | 10/1998 | Honda ........................ 451/41 |
| 5,888,120 A | 3/1999 | Doran |
| 5,899,798 A | 5/1999 | Trojan et al. ................. 451/259 |
| 5,919,082 A | 7/1999 | Walker et al. |
| 5,951,368 A * | 9/1999 | Watanabe et al. ............. 451/5 |
| 5,957,763 A | 9/1999 | Anderson, III et al. |
| 5,958,148 A | 9/1999 | Holzapfel et al. |
| 5,961,369 A | 10/1999 | Bartels et al. |
| 5,969,521 A | 10/1999 | Kurita et al. |
| 5,972,162 A | 10/1999 | Cesna |
| 5,974,681 A | 11/1999 | Gonzalez-Martin et al. |
| 5,975,094 A | 11/1999 | Shurtliff |
| 5,975,986 A | 11/1999 | Allen et al. |
| 5,975,991 A | 11/1999 | Karlsrud |
| 5,980,366 A | 11/1999 | Waddle et al. |
| 5,980,769 A | 11/1999 | Yanagisawa et al. |
| 5,985,094 A | 11/1999 | Mosca ........................ 156/345 |
| 5,989,104 A | 11/1999 | Kim et al. |
| 5,993,289 A | 11/1999 | Allen et al. |
| 5,993,302 A | 11/1999 | Chen et al. |
| 5,997,390 A | 12/1999 | Hosé |
| 6,001,005 A | 12/1999 | Anderson, III et al. |
| 6,012,964 A | 1/2000 | Arai et al. |
| 6,022,807 A | 2/2000 | Lindsey, Jr. et al. |
| 6,030,280 A | 2/2000 | Fruitman |
| 6,030,488 A | 2/2000 | Izumi et al. |
| 6,033,521 A | 3/2000 | Allen et al. |
| 6,038,082 A | 3/2000 | Takatsuki |
| 6,039,638 A | 3/2000 | Nagayama et al. |
| 6,040,244 A | 3/2000 | Arai et al. |
| 6,041,465 A | 3/2000 | Yashiki et al. |
| 6,045,431 A | 4/2000 | Cheprasov et al. |
| 6,048,259 A | 4/2000 | Asai |
| 6,056,632 A | 5/2000 | Mitchel et al. |
| 6,058,950 A | 5/2000 | Fujii et al. |
| 6,059,636 A * | 5/2000 | Inaba et al. ................. 451/5 |
| 6,062,949 A | 5/2000 | Yashiki et al. |
| 6,062,954 A | 5/2000 | Izumi |
| 6,066,230 A | 5/2000 | Arai |
| 6,068,545 A | 5/2000 | Arai |
| 6,074,275 A | 6/2000 | Yashiki et al. |
| 6,074,277 A | 6/2000 | Arai |
| 6,089,961 A | 7/2000 | Cesna et al. |
| 6,093,087 A | 7/2000 | Hakomori et al. |
| 6,095,900 A | 8/2000 | Fruitman et al. |
| 6,102,779 A | 8/2000 | Cesna et al. |
| 6,102,784 A | 8/2000 | Lichner |
| 6,106,379 A | 8/2000 | Mosca |
| 6,106,662 A | 8/2000 | Bibby, Jr. et al. |
| 6,110,026 A | 8/2000 | Arai |
| 6,113,465 A | 9/2000 | Kim et al. |
| 6,113,468 A | 9/2000 | Natalicio |
| 6,113,478 A | 9/2000 | Anderson, III et al. |
| 6,139,400 A | 10/2000 | Sato et al. ................. 451/10 |
| 6,162,112 A * | 12/2000 | Miyazaki et al. ............. 451/36 |
| 6,257,953 B1* | 7/2001 | Gitis et al. ................. 451/5 |
| 6,270,392 B1* | 8/2001 | Hayashi et al. ................. 451/5 |
| 6,402,588 B1* | 6/2002 | Matsuo et al. ................. 451/5 |

FOREIGN PATENT DOCUMENTS

| | | |
|---|---|---|
| EP | 0 055 782 A1 | 1/1982 |
| EP | 0 150 074 A2 | 7/1985 |
| EP | 0 150 074 B1 | 7/1985 |
| EP | 0 180 175 A2 | 5/1986 |
| EP | 0223920 A2 | 7/1986 |
| EP | 0223920 B1 | 7/1986 |
| EP | 0 272 531 A1 | 6/1988 |
| EP | 0 272 531 B1 | 6/1988 |
| GB | 2324750 A | 4/1998 |
| GB | 2 345 013 A1 | 6/2000 |
| JP | 53-68493 | 6/1978 |
| JP | 56-140632 | 11/1981 |
| JP | 57-170538 | 10/1982 |
| JP | 7-45565 | 2/1995 |
| JP | 7-111256 | 4/1995 |
| JP | 7-266220 | 10/1995 |
| JP | 09-153738 | 11/1997 |
| JP | H11-156711 | 6/1999 |
| JP | 11-31671 | 11/1999 |
| WO | WO 82/03038 | 9/1982 |
| WO | WO 97/40525 | 10/1997 |

OTHER PUBLICATIONS

M. Levy, "*At last: benchmarks you can believe*", p. 59, 60, 62, 64, 66, 67, and 68, (PCT 230) Electrical Design News, (Nov. 1998), Newton, MA.

U. Schmid, "*Monitoring Distributed Real-Time Systems*", p. 33-56, 8359 Real-Time Systems, (Jul. 1994), No. 1, Dordrecht, NE.

* cited by examiner

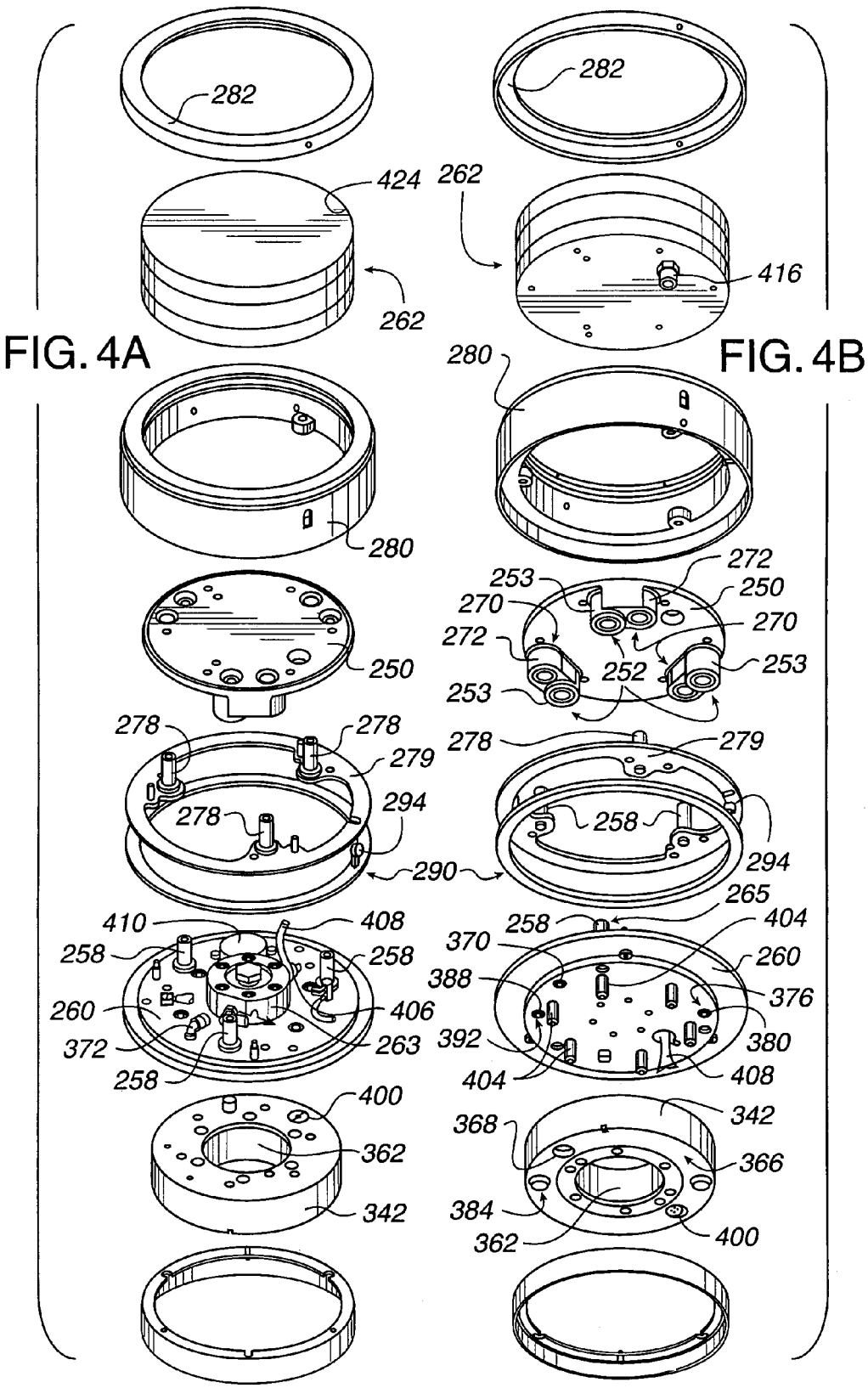

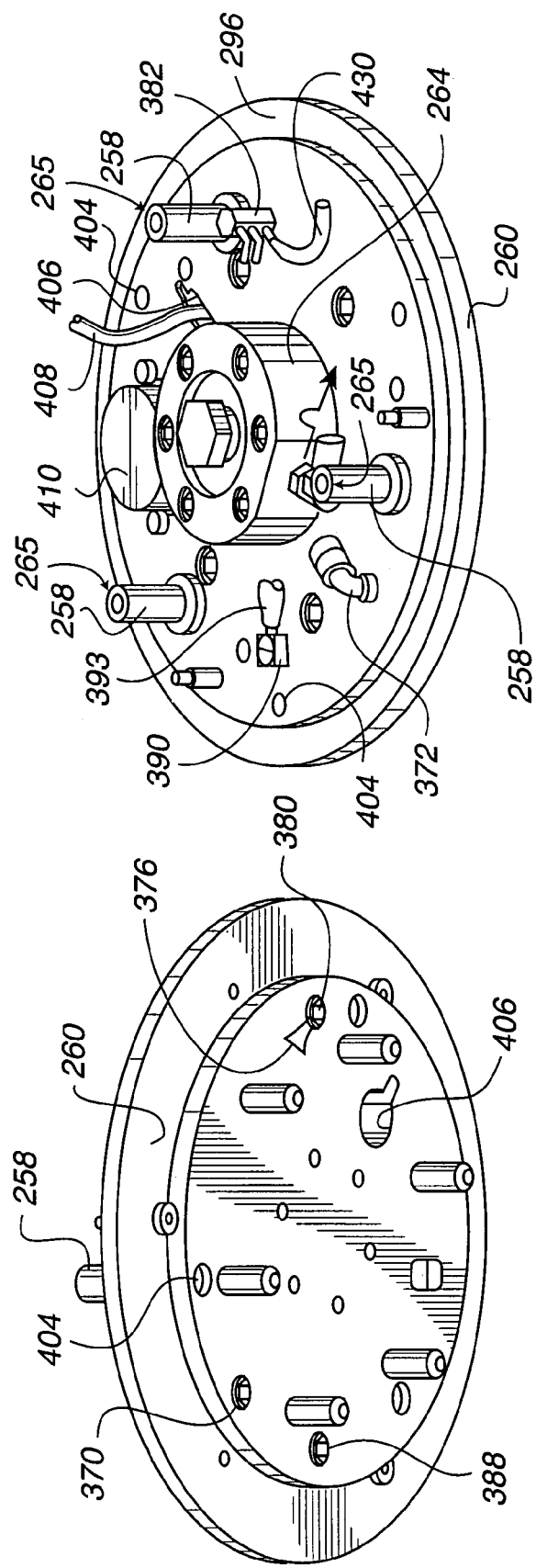

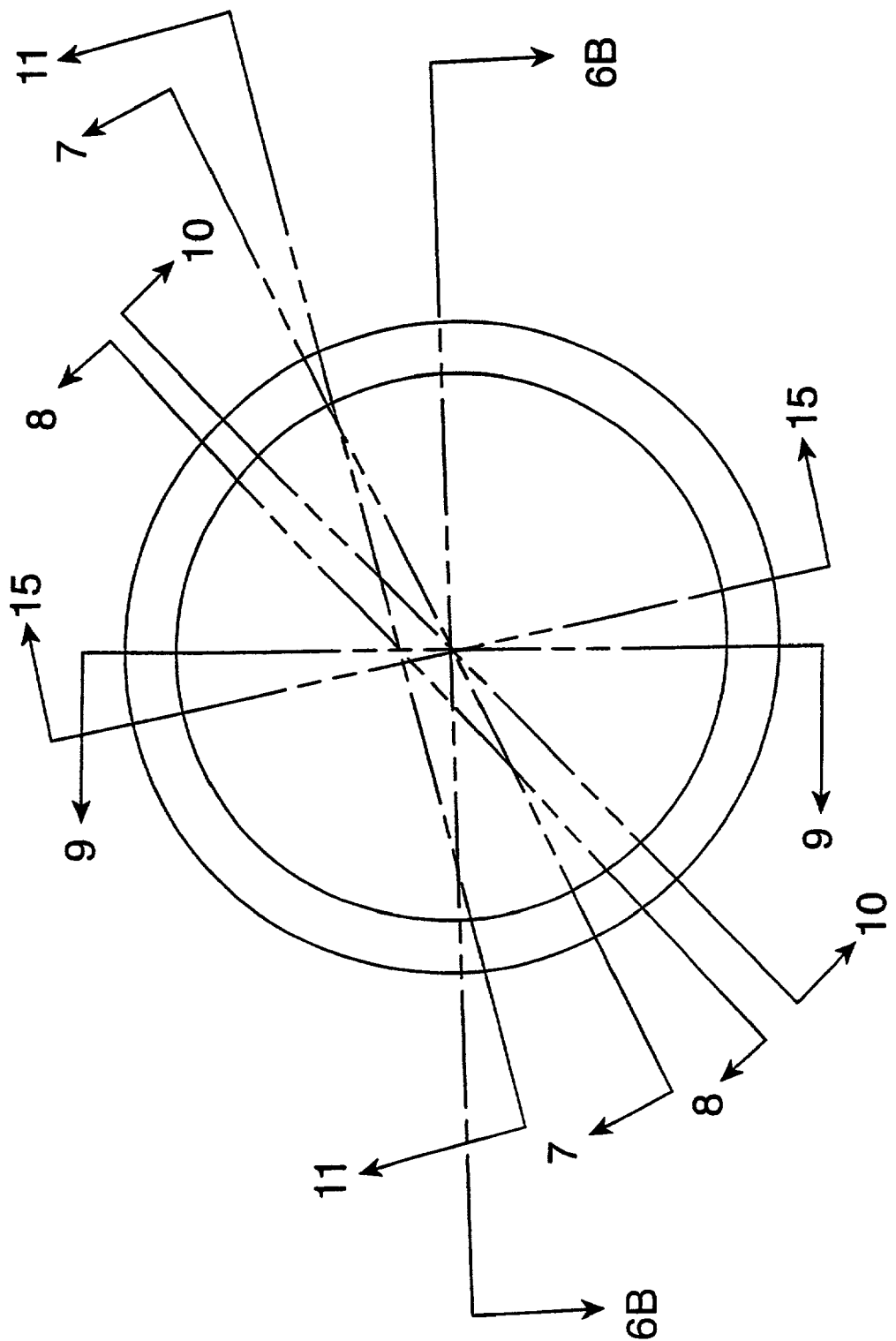

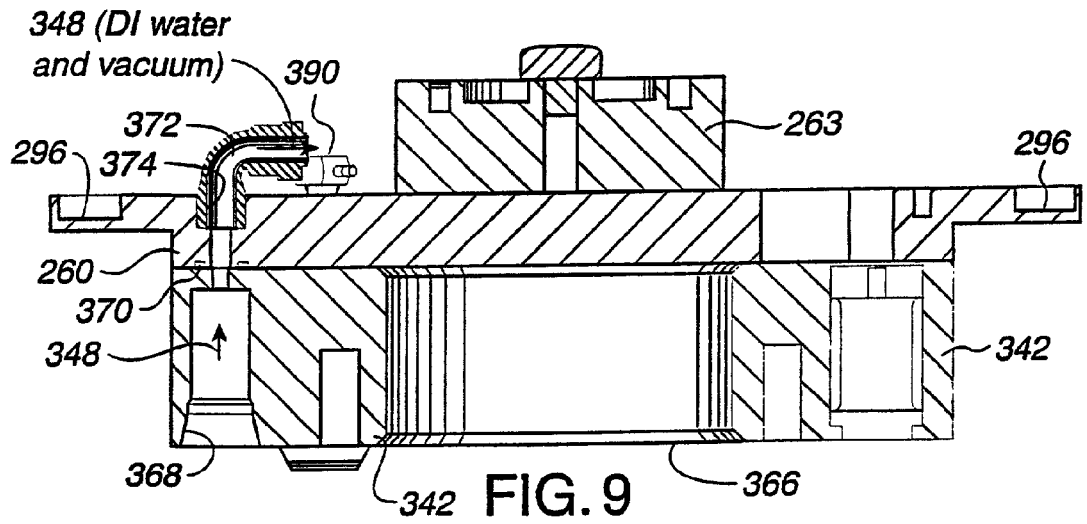
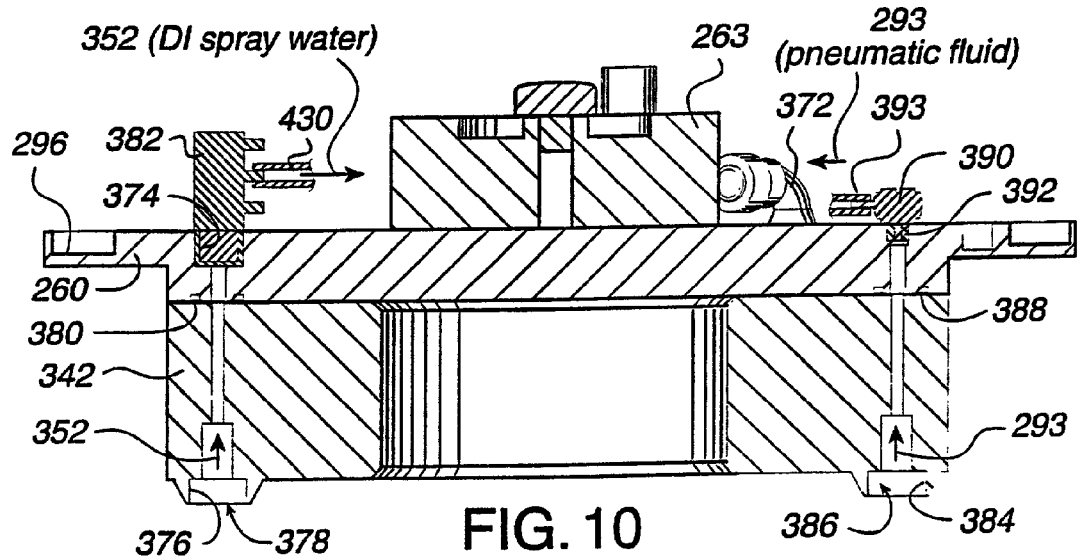
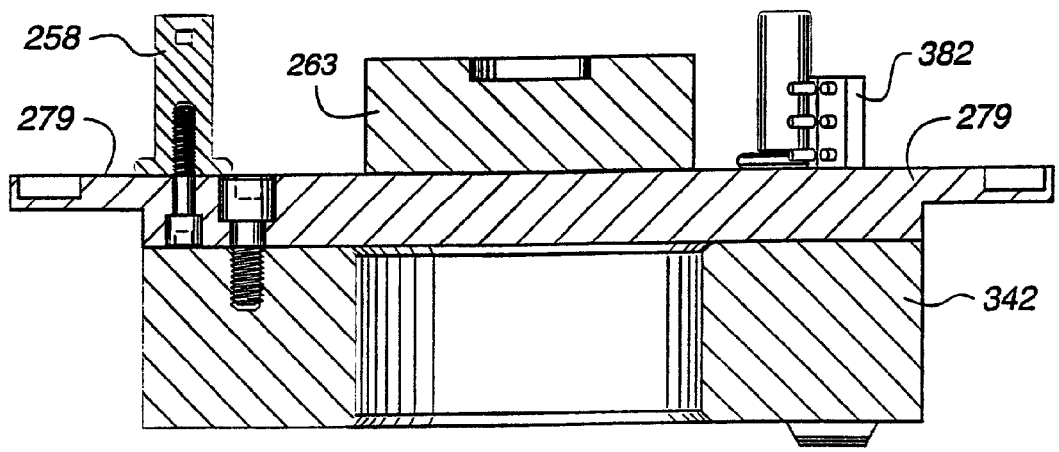

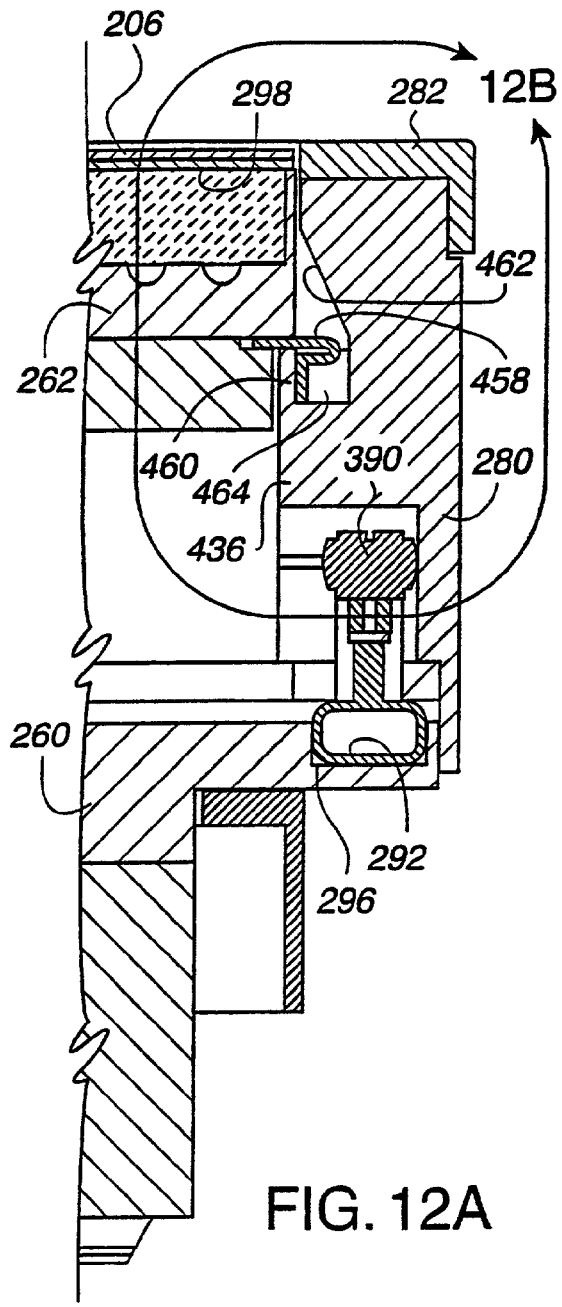
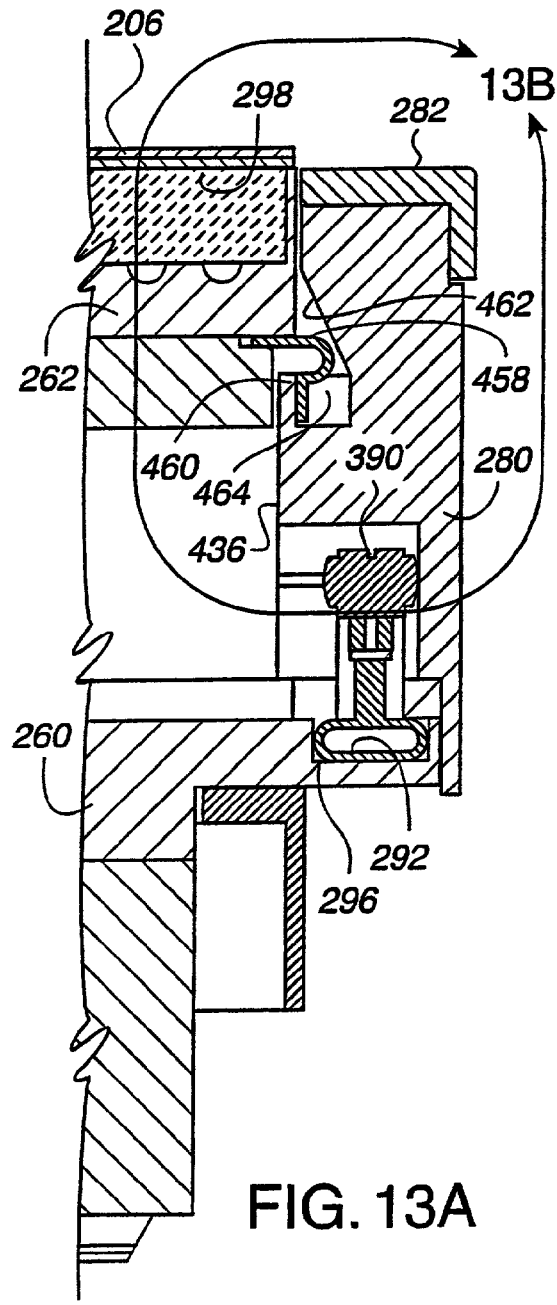
FIG. 12A
FIG. 13A

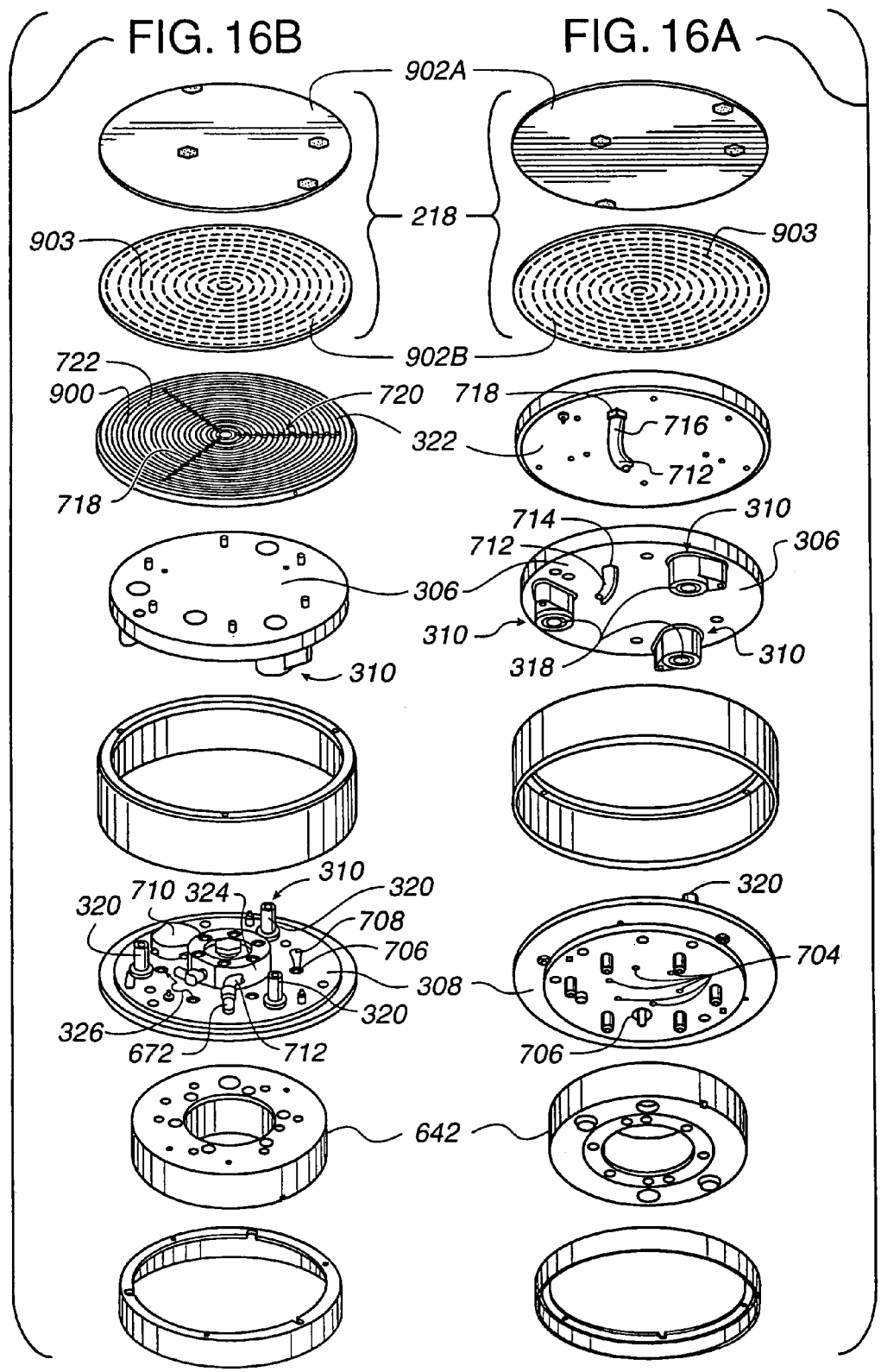

POLISHING APPARATUS AND METHODS HAVING HIGH PROCESSING WORKLOAD FOR CONTROLLING POLISHING PRESSURE APPLIED BY POLISHING HEAD

CROSS REFERENCE TO RELATED APPLICATIONS

This Application claims 35 U.S.C. § 120 priority based on, and is a continuation-in-part (CIP) of: (1) U.S. patent application Ser. No. 09/664,135, filed Aug. 22, 2000, entitled "SUBAPERTURE CHEMICAL MECHANICAL POLISHING SYSTEM," by Miguel A. Saldana, John M. Boyd, Yehiel Gotkis, and Aleksander A. Owczarz, now U.S. Pat. No. 6,585,572 issued Aug. 1, 2003 (the First Parent Application); and (2) U.S. patent application Ser. No. 09/668,667, filed Sep. 22, 2000, entitled "APPARATUS AND METHODS FOR CONTROLLING RETAINING RING AND WAFER HEAD TILT FOR CHEMICAL MECHANICAL POLISHING," by Damon Vincent Williams, now U.S. Pat. No. 6,652,357 issued Nov. 25, 2003 (the Second Parent Application), each U.S. Patent Application is hereby incorporated by reference. Additionally, this Application is also related to U.S. patent application Ser. No. 09/493,978, filed Jan. 28, 2000, entitled "SYSTEM METHOD FOR CONTROLLED POLISHING AND PLANARIZATION OF SEMICONDUCTOR WAFERS," by Rod Kistler and Yehiel Gotkis, now U.S. Pat. No. 6,340,326 issued Jan. 27, 2002, and such related application is hereby incorporated by reference.

BACKGROUND OF THE INVENTION

1. Field of the Invention

The present invention relates generally to chemical mechanical polishing (CMP) systems and techniques for improving the performance and effectiveness of CMP operations. Specifically, the present invention relates to controlling the forces applied to carrier heads for wafers and pad conditioning pucks, and to retaining rings on such carrier heads, to separately apply programmably variable respective pressures on respective ones of the wafers, pad conditioning pucks, and retaining rings with or independently of changes in the value of the contact areas on which the forces are applied, to foster repeatable CMP operations on successively polished wafers.

2. Description of the Related Art

In the fabrication of semiconductor devices, there is a need to perform CMP operations, including polishing, buffing and wafer cleaning. For example, a typical semiconductor wafer may be made from silicon and may be a disk that is 200 mm or 300 mm in diameter. For ease of description, the term "wafer" is used below to describe and include such semiconductor wafers and other planar structures, or substrates, that are used to support electrical or electronic circuits.

Typically, integrated circuit devices are in the form of multi-level structures fabricated on such wafers. At the wafer level, transistor devices having diffusion regions are formed. In subsequent levels, interconnect metallization lines are patterned and electrically connected to the transistor devices to define the desired functional device. Patterned conductive layers are insulated from other conductive layers by dielectric materials. As more metallization levels and associated dielectric layers are formed, the need to planarize the dielectric material increases. Without planarization, fabrication of additional metallization layers becomes substantially more difficult due to the higher variations in the surface topography. In other applications, metallization line patterns are formed in the dielectric material, and then metal CMP operations are performed to remove excess metallization.

In a typical CMP system, a wafer is mounted on a carrier with a surface of the wafer exposed. The carrier and the wafer rotate in a direction of rotation. The CMP process may be achieved, for example, when the exposed surface of the rotating wafer and a polishing pad are urged toward each other by a force, and when the exposed surface and the polishing pad move or rotate in a polishing pad direction. Some CMP processes require that a significant force be used at the time the rotating wafer is being polished by the polishing pad.

Several problems may be encountered while using a typical CMP system. One recurring problem is called "edge-effect," which is caused when the CMP system polishes an edge of the wafer at a different rate than other regions of the wafer. The edge-effect is characterized by a non-uniform profile on the exposed surface of the wafer. The problems associated with edge-effect can be divided to two distinct categories. The first category relates to the so-called "pad rebound effect" resulting from the initial contact of the polishing pad with the edge of the wafer. When the polishing pad initially contacts the edge of the wafer, the pad rebounds (or bounces off) the edge, such that the pad may assume a wave-like shape. The wave-like shape may produce non-uniform profiles on the exposed surface of the wafer.

The second category is the "burn-off" effect. The burn-off effect occurs when a sharper edge of the wafer is excessively polished as it makes contact with the surface of the polishing pad. This happens because a considerable amount of pressure is exerted on the edge of the wafer as a result of the surface of the pad applying the force on a very small contact area of the exposed surface of the wafer (defined as the edge contact zone). As a consequence of the burn-off effect, the edges of the resulting polished wafers exhibit a burn ring that renders the edge region unusable for fabricating silicon devices.

Another shortcoming of conventional CMP systems is an inability to polish the surface of the wafer along a desired finishing layer profile. Ordinarily, the exposed surface of a wafer that has undergone some fabrication tends to be of a different thickness in the center region and varies in thickness out to the edge. In a typical conventional CMP system, the pad surface covers the entire exposed surface of the wafer. Such pad surface is designed to apply a force on a so-called "finishing layer" portion of the exposed surface of the wafer. As a result, all the regions of the finishing layer are polished until the finishing layer is substantially flat. Thus, the surface of the pad polishes the finishing layer irrespective of the wavy profile of the finishing layer, thereby causing the thickness of the finishing layer to be non-uniform. Some circuit fabrication applications require that a certain thickness of material be maintained in order to build a working device. For instance, if the finishing layer were a dielectric layer, a certain thickness would be needed in order to define metal lines and conductive vias therein.

These problems of prior CMP operations, and an unsolved need in the CMP art for a CMP system that enables precision and controlled polishing of specifically targeted wafer surface regions, while substantially eliminating damaging edge-effects, pad rebound effects, and edge burn-off effects, are discussed in the First Parent Application identified above.

In such First Parent Application, a CMP system follows the topography of layer surfaces of the exposed surface of the wafer so as to create a CMP-processed layer surface which has a uniform thickness throughout. Such CMP system implements a rotating carrier in a subaperture polishing configuration, eliminating the above-mentioned drawbacks, edge-effects, pad rebound effects, and edge burn-off effects. For example, one embodiment of such CMP system includes a preparation head, such as a polishing head, designed to be applied to a portion of the wafer, wherein the portion is less than an entire portion of the surface of the wafer. Although such CMP system avoids the above-described edge-effects, pad rebound effects, and edge burn-off effects, the application of such preparation head in this manner applies a force to the exposed surface of the wafer and to the carrier at a location that is eccentric with respect to an initial orientation of the wafer and the carrier. The initial orientation includes an initial orientation of central axes of the wafer and of the carrier (which are coaxial and positioned substantially vertically). The initial orientation also includes an initial orientation of the exposed surface of the wafer (which is positioned at an initial angle of ninety degrees with respect to the initial substantially vertical orientation of the central axes of the wafer and the carrier). The term "substantially vertical" means true vertical, and includes true vertical plus or minus normal mechanical tolerances from true vertical, such as those tolerances typical in bearings used in spindles and other supports for such carriers.

As may be understood from the above discussion of the edge-effects, pad rebound effects, and edge burn-off effects, it would be undesirable for such eccentric force to cause the central axes of the wafer and the carrier to depart from the initial orientation and to tilt, or assume a tilted orientation. Such tilting or tilted orientation would occur when such central axes of the wafer and/or the carrier depart from true vertical more than the above-described normal mechanical tolerances from true vertical, e.g., by a number of degrees. Such initial orientation of the central axes of the wafer and the wafer carrier is the orientation that must be maintained during polishing under the action of such eccentric force to achieve the desired planarization of the exposed surface of the wafer. In other words, tilting allowed by gimbals must be avoided if the desired planarization of the exposed surface of the wafer is to be achieved.

The Second Parent Application filled many of these needs by providing CMP systems and methods which implement solutions to the above-described problems. Thus, the Parent Application provided structure and operations to facilitate making repeatable measurements of the eccentric forces. In such systems and methods, a force applied to a carrier, such as a wafer or puck carrier, may be accurately measured even though such force is eccentrically applied to such carrier. In one embodiment of the systems and methods of the present invention, an initial coaxial relationship between an axis of rotation and a carrier axis is maintained during application of the eccentric force, such that a sensor is enabled to make repeatable measurements, as defined below, of the eccentric forces, and the carrier may be a wafer or a puck carrier. Also, in such Second Parent Application, a linear bearing assembly was assembled with a retainer ring in conjunction with a force actuator, or motor, for moving the ring relative to the wafer mounted on the carrier. Such moving enables an exposed surface of the wafer and a surface of the retainer ring to be engaged by the polishing pad to be coplanar during the polishing operation.

Although such Second Parent Application provided structure and operations to facilitate making such repeatable measurements of the eccentric forces, there was no discussion of how to control such forces and the resulting pressures on the wafer, the conditioning pad, and the retaining ring. In particular, there was no discussion of how to control the eccentric forces in relation to the changing areas of the wafer, the retaining ring, and the conditioning head as the polishing head moved relative to the wafer, the retaining ring, and the conditioning head during a polishing operation. Moreover, there was no discussion of ways to reduce the costs of systems that control the eccentric forces in relation to the changing areas of the wafer, the retaining ring, and the conditioning head as the polishing head moved relative to the wafer, the retaining ring, and the conditioning head during a polishing operation.

What is needed then, is a CMP system and method in which forces to be applied to a carrier, such as a wafer or puck carrier, and to a retaining ring of such carrier, may be accurately controlled even though the polishing head moves relative to such wafer, puck carrier, and retaining ring during the polishing operation. Moreover, since such relative movement causes a polishing pad to contact different areas of the wafer, puck carrier, and retaining ring at different times during the polishing operation, what is also needed is a way to relate such forces to the area contacted by the pad at any particular time. Additionally needed is a way to cost-effectively determine such force-area relations.

Further, in the Second Parent Application there was disclosed a way of providing an accurate indication of an amount of such eccentric force. Such an accurate indication was said to be a repeatable measurement technique that may be described in terms of "equal eccentric forces." Such equal eccentric forces are eccentric forces having the same value as applied by a pad, such as a polishing pad, to a carrier for a wafer or pad conditioner puck. The repeatable measurement technique was said to be one which, for all such equal eccentric forces, the loss of force within the measurement system and within the system for supporting the carrier, will be substantially the same, i.e., repeatable. What is also needed then, is a CMP system and method in which such forces that are measured by the repeatable measurement technique may be accurately controlled so that each separate area of contact between the polishing pad and the wafer, and between the polishing pad and the puck, and between the polishing pad and the retaining ring, may receive a desired pressure during the polishing operation. Moreover, what is needed is to apply such desired pressure even though, for example, such movement of the polishing head causes the polishing pad to contact different areas of the wafer, the puck carrier, and the retaining ring at different times during the polishing operation.

SUMMARY OF THE INVENTION

Broadly speaking, the present invention fills these needs by providing CMP systems and methods which implement solutions to the above-described problems, wherein structure and operations implement a recipe or set of instructions for moving the polishing head relative to the carriers and to the retaining ring, and wherein feedback of polishing head position is coordinated with determinations of desired inputs of the variable forces by which changing areas of the wafer, the conditioning puck, and the retaining ring are separately urged into contact with the polishing pad so that the pressure on each such area may be controlled. For such determinations, the value of each such separate contact area of each of the wafer, the conditioning puck, and the retaining ring is determined based on the feedback of the polishing head position. Each such contact area has a value related to the actual position of the polishing head relative to the respective wafer, conditioning puck, and retaining ring. Such actual positions are used to determine the value of each of the respective separate contact areas. For each respective pair of contact area and pressure to be applied to that contact area, a force signal is output to represent a corresponding force. Each respective force signal controls the force by which the respective wafer, conditioning puck, and retaining ring are separately urged into contact with the polishing pad at the particular time at which the actual position is measured. Further, by suitable measurement techniques (e.g., those of the Second Parent Application), the actual amounts of such forces on the wafer and on the conditioning puck are measured. Actual force signals representing the actual measured forces are applied to a feedback loop to assure that the actual forces comply with the desired inputs of the variable forces by which the wafer, the conditioning puck, and the retaining ring are to be separately urged into contact with the polishing pad.

One aspect of the systems and methods of the present invention implements a set of instructions for moving the polishing head relative to the carriers and to the retainer ring, and such implementation is coordinated with determinations of desired inputs of the variable forces by which changing areas of the wafer, the conditioning puck, and the retaining ring are separately urged into contact with the polishing pad so that the pressure on each such area may be controlled.

In another aspect of the systems and methods of the present invention, an operational recipe of basic CMP operations is established. One or more parameters of an edited form of the recipe may be included in a processor guideline. The processor guideline is used to determine whether a processor alone, or a processor in conjunction with a separate force controller, may receive data representing the position of the polishing head relative to the carriers and to the retainer ring, and in coordination with inputs of the desired pressures, may compute determinations of desired inputs of the variable forces by which changing areas of the wafer, the conditioning puck, and the retaining ring are separately urged into contact with the polishing pad to control the pressure on each such area.

In still another aspect of the systems and methods of the present invention, in the use of the separate force controller, the parameters of a recipe for CMP operations are edited to develop a command set that is used to prepare an initialization string for the force controller, so that upon input to the force controller of data as to the position of the polishing pad and data representing the desired pressures, the force controller computes the desired variable forces that correspond to actual movements of the polishing head.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIG. 1C-2 is a plan view schematically showing an aspect of the present invention in which the initial position of the polishing head is illustrated, identifying the contact area of a polishing pad of the polishing head and the retainer ring carried by the wafer carrier;

FIG. 1C-3 is a plan view schematically showing an aspect of the present invention in which the initial position of the polishing head is illustrated, identifying the contact area of a polishing pad of the polishing head and the pad conditioning puck carried by a puck carrier;

FIG. 1D-1 is a plan view schematically showing an aspect of the present invention in which a second position of the polishing head is illustrated, identifying the contact area of a polishing pad of the polishing head and the wafer carried by the wafer carrier;

FIG. 1D-2 is a plan view schematically showing an aspect of the present invention in which the second position of the polishing head is illustrated, identifying the contact area of a polishing pad of the polishing head and the retainer ring carried by the wafer carrier;

FIG. 1D-3 is a plan view schematically showing an aspect of the present invention in which the second position of the polishing head is illustrated, identifying a contact area of a polishing pad of the polishing head and the pad conditioning puck carried by a puck carrier;

FIG. 1E-1 is a plan view schematically showing an aspect of the present invention in which a third position of the polishing head is illustrated, identifying the contact area of a polishing pad of the polishing head and the wafer carried by the wafer carrier;

FIG. 1E-2 is a plan view schematically showing an aspect of the present invention in which the third position of the polishing head is illustrated, identifying the contact area of a polishing pad of the polishing head and the retainer ring carried by the wafer carrier;

FIG. 1E-3 is a plan view schematically showing an aspect of the present invention in which the third position of the polishing head is illustrated, identifying a contact area of a polishing pad of the polishing head and the pad conditioning puck carried by a puck carrier;

FIGS. 4A and 4B are exploded perspective views of the first embodiment, illustrating in FIG. 4B the bottoms of the structural elements and in FIG. 4A the tops of the structural elements;

FIGS. 5A-1 through 5A-3 are enlarged perspective views of various ones of the structural elements shown on the right side of FIG. 4;

FIGS. 5B-1 through 5B-3 are enlarged perspective views of various ones of the structural elements shown in FIG. 4B;

FIG. 6A is a plan view of the wafer carrier, showing various lines at which sections are taken to illustrate internal structure;

FIG. 9 is a cross section taken along line 9-9 in FIG. 6A through a fluid connector, wherein the connector supplies DI water and vacuum to the vacuum chuck;

FIG. 10 is a cross section taken along line 10-10 in FIG. 6A through a fluid manifold and load cell plate, illustrating one of six DI water conduits from the manifold to six separate nozzles in a retaining ring base for supplying DI wafer wash water;

FIG. 11 is a cross sectional side elevational view of the chuck bearing and load cell plate illustrating the plate assembled by screws to an upper section of the RTC;

FIG. 12A is a cross sectional view of an enlarged portion of FIG. 7 showing the retainer ring base in a full engage to position and locate the wafer on the vacuum chuck prior to the CMP operations; wherein

FIG. 13A is a cross sectional view of an enlarged portion of FIG. 7 showing the retainer ring in a disengaged position away from the wafer to facilitate removal of the wafer from the wafer carrier, wherein

FIG. 14A is a cross sectional view of an enlarged portion of FIG. 7 showing the retainer ring base in a polishing position to facilitate spraying DI water onto a base of the wafer while the exposed surface of the wafer is polished, wherein

FIGS. 16A and 16B are exploded perspective views of the first embodiment, illustrating in FIG. 16A the bottoms of the structural elements and in FIG. 16B the tops of the structural elements;

DETAILED DESCRIPTION OF THE PREFERRED EMBODIMENTS

Figure 1A:
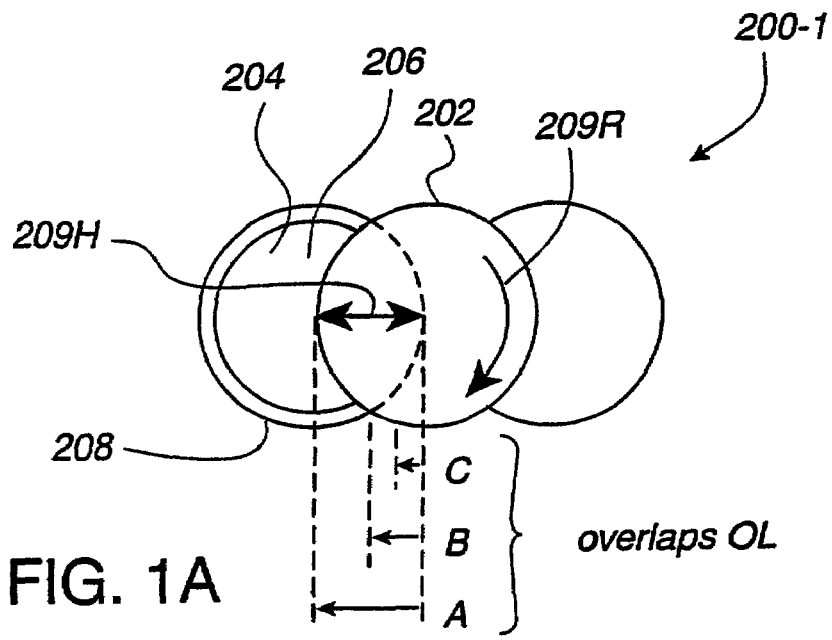
FIG. 1A is a plan view schematically showing a first embodiment of the present invention in which one polishing head contacts both a wafer carried by a wafer carrier and a puck carried by a polishing pad conditioner, the contacts each being eccentrically with respect to a central axis of each of the carriers.

An invention is described for a CMP system, and methods, that provide solutions to the above-described problems. Structures and operations implement a set of instructions for providing relative movement between the polishing head and the carriers and the retainer ring. The relative movement is in coordination with processed determinations of desired inputs of the variable forces by which contact areas of the wafer, the conditioning puck, and the retaining ring are separately urged into contact with the polishing pad so that the pressure on each such area may be controlled. For such determinations, the value of each such separate contact area of each of the wafer, the conditioning puck, and the retaining ring is initially determined. Each such contact area has a value related to the actual position of the polishing head relative to the respective wafer, conditioning puck, and retaining ring. The actual positions of the polishing head are measured. Such actual positions are then used to determine the value of each of the respective separate contact areas. For each respective pair of contact area and pressure to be applied to that contact area at a particular time TN, processed data is output representing a force signal. Each respective force signal controls the force by which the respective wafer, conditioning puck, and retaining ring are separately urged into contact with the polishing pad at the particular time TN at which the actual position is measured.

The processing of the data representing the forces, and of the polishing head positions with respect to the resulting contact areas, may be performed by a central processor, or separately by a force controller, according to operational criteria in a processor guideline. The processor guideline relates to the level of processing workload, and may be used to determine whether the central processor alone, or the processor in conjunction with the separate force controller, is suitable for processing the data representing the forces. The operational criteria may include the timing of variations of polishing pressures, e.g., pressure ramps, as one type of operational criteria that may result in a high processing workload. Other operational criteria relate to the rate at which the position of the polishing pad changes relative to the wafer, and/or to the pad conditioning puck.

Further, by suitable measurement techniques (e.g., those of the Second Parent Application), the actual amounts of such forces on the wafer and on the conditioning puck are measured. Actual force signals representing the actual measured forces are applied to a feedback loop to assure that the actual forces comply with the desired inputs of the variable forces by which the wafer, the conditioning puck, and the retaining ring are to be separately urged into contact with the polishing pad.

In the following description, numerous specific details are set forth in order to provide a thorough understanding of the present invention. It will be understood, however, to one skilled in the art, that the present invention may be practiced without some or all of these details. In other instances, well known process operations and structure have not been described in detail in order not to obscure the present invention.

Figure 1B:
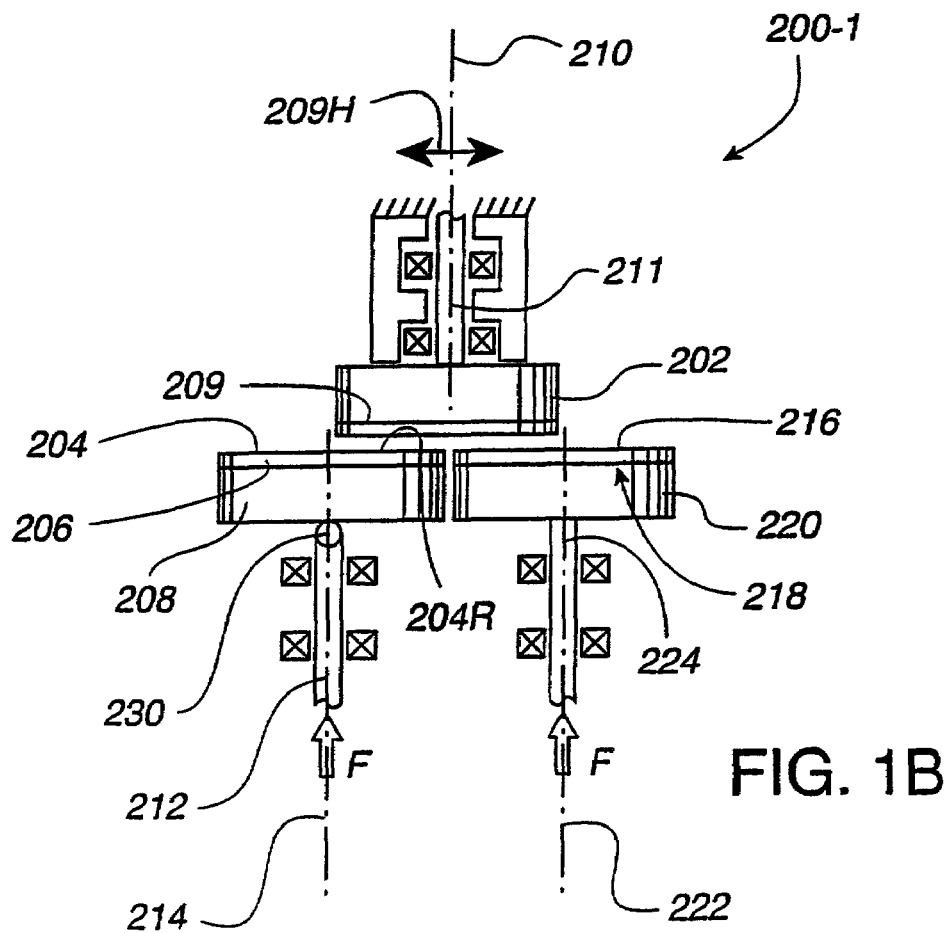
FIG. 1B is an elevation view schematically showing the first embodiment depicted in FIG. 1A, illustrating the central axes of the carriers and eccentric forces resulting from the eccentric contacts.
Figure 2A:
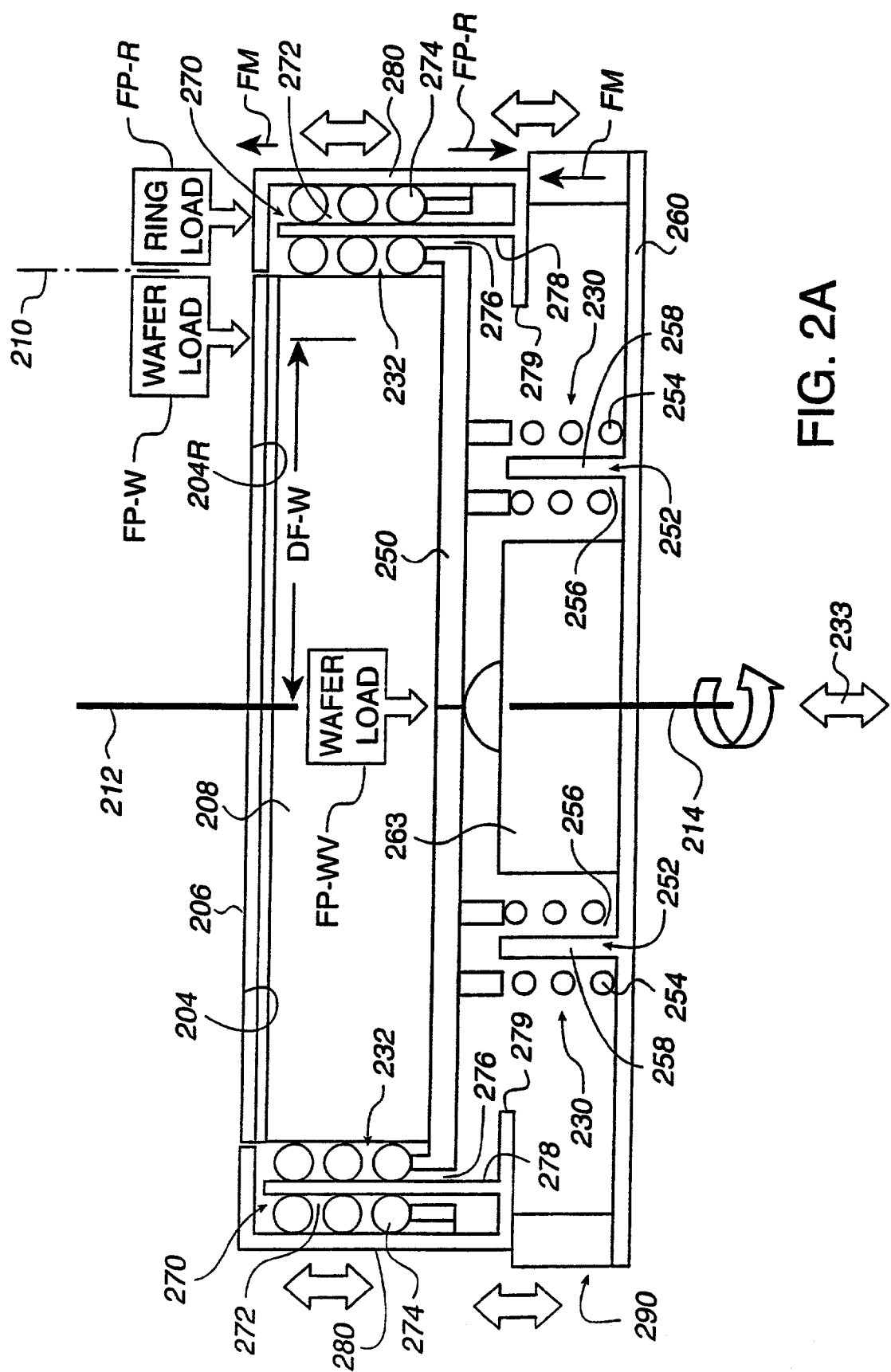
FIG. 2A is an elevation view schematically showing the wafer carrier of the first embodiment, illustrating two separate linear bearing structures, one assembly limiting the direction of relative movement between a main bearing housing and a chuck bearing plate, and a second assembly limiting the direction of relative movement between the main bearing plate and a retaining ring bearing plate.

Referring to FIGS. 1A, 1B and 2A, there is schematically shown a first embodiment of the present invention, including a subaperture CMP system 200-1. The embodiment of FIGS. 1A, 1B and 2A includes a preparation carrier, or polishing head, 202 which is configured to polish an exposed surface 204 of a wafer 206 mounted on a carrier 208, such as a wafer carrier. The wafer 206 may be any of the wafers described above, for example. The polishing head 202 is designed to polish the surface 204 of the wafer 206 utilizing a polishing pad 209, which may include pads sold by Linear Polisher Technology (LPT), rotary CMP pad materials, fixed abrasive pad materials, etc. In general, any pad material that enables the desired polishing levels and precision can be used for the pad 209. As described in more detail below, the features for making repeatable measurements of the forces identified below, reduce the need for the material of such pads 209 to compensate for mechanical tolerances discussed below.

One motion of the polishing head 202, and of the pad 209 on the head 202, for performing polishing of the wafer 206, for example, or for enabling the pad 209 to be conditioned, is rotation (see arrow 209R) around respective co-axial axes 210 and 211 of the head 202 and the pad 209. Generally, the head 202 is mounted to prevent movement parallel to such coaxial axes 210 and 211, i.e., to prevent movement either toward or away from the respective wafer carrier 208, for example.

Another motion of the polishing head 202 and of the pad 209 on the head 202 for performing polishing of the wafer 206, for example, or for enabling the head 202 and the pad 209 to be conditioned, is movement horizontally (see arrow 209H). It may be understood from the arrows 209H in FIGS. 1A and 1B, for example, that a force may be applied by the polishing pad 209 to certain structure. For example, a force FP-W may be applied by the pad 209 of the polishing head 202 to the wafer 206 (and thus to the wafer carrier 208) at different locations on the wafer 206. Such locations are indicated by the displacement DF-W measured from the axis 212 or 214. These motions may occur at any time "TN" during a CMP cycle. A time TN is referred to below to generally designate any instant of time during a CMP cycle, or during a step in a CMP cycle, whereas a particular time TN is designated by "T" followed by a number, e.g., an initial time T0, or a later time T1. These motions of the pad 209 and the wafer 206 may be referred to as relative movement between the pad 209 and the wafer 206, indicating that in other configurations of the system 200-1, for example, the wafer 206 may be moved (e.g., horizontally) and the pad 209 held against horizontal movement.

The subaperture configuration of the system 200-1 introduces flexibility into the polishing operation by utilizing different or same removal rates on different regions of the exposed surface 204 of the wafer 206. Unlike the above-described conventional CMP systems wherein an entire polishing pad 209 is in contact with the entire exposed surface of the wafer, in the subaperture CMP system 200-1, at any given time TN, the size, or value, of an area of a contact surface of the polishing pad 209 (of the preparation head 202) that is in contact with the exposed surface 204 of the wafer 206 may vary. In addition, in the subaperture CMP system 200-1, by preventing movement of the preparation head 202 toward the wafer carrier 208, movement (see up portion of arrow 233, FIG. 2A) of the wafer carrier 208 toward the polishing head 202 results in applying a force FP-W only to selected regions 204R of the exposed surface 204 of the wafer 206, thereby removing excess materials from those selected regions 204R, exclusively, at a particular time TN. Further, as shown in FIG. 2A, one such selected region 204R of the exposed surface 204 of the wafer 206 is displaced horizontally from, or eccentric relative to, a central axis 212 of the wafer carrier 208. The central axis 212 is concentric with a central axis 214 of the wafer 206 carried by the carrier 208. As shown, the displacement of the force FP-W is indicated by DF-W, which is measured horizontally in FIGS. 1A, 1B and 2A. It may be understood from the arrow 209H that the polishing head 202 may move horizontally and contact different ones of the selected regions 204R of the exposed surface 204.

Referring to FIGS. 1C-1 through 1C-3, 1D-1 through 1D-3, and 1E-1 through 1E-3, for example, those different ones of the regions 204R may be identified according to the structure that contacts the pad 209 of the polishing head 202. Thus, the areas of the regions 204R are generally referred to as contact areas, and are generally identified by "AP" to designate the contact area of the pad 209 with any structure. A letter is added to "AP" to designate other contacted structure. For example, "APW" designates a pad-wafer contact area, "APC" designates a pad-conditioning puck contact area, and "APRR" designates a pad-retainer ring contact area. Also, the value, or amount, of those areas AP of such contacted exposed regions 204R will vary according to the value of the displacement DF-W.

In accordance with the present invention, the value or amount of the polishing pressure may be a function of one or more of many variables, or may be a constant value (e.g., a constant value during the time in which a step of a CMP cycle is performed. Thus, for a polishing pressure having a constant value, for example, as the area APW varies the value of the force FP-W applied by the polishing head 202 to the wafer 206 must be varied according to the amount of movement of the polishing head 202 relative to the wafer 206 to maintain the pressure applied to the area APW constant. Whether the polishing pressure is constant or varies, for purposes of description, it is to be understood that each force FP-W, is an average force applied by the polishing pad 209 on the contacted area APW of the region 204R, and this average force is said to be applied at the center of such area APW.

In the phrase "initial orientation", the word "initial" designates the above-described orientation that occurs at a time TOPW just before "touchdown". At touchdown the pad 209 of the polishing head 202 first engages the exposed surface 204 of the wafer 206. Thus, at the time TOPW there is initially no force FP-W applied by the pad 209 on the wafer 206. In the examples below, touchdown is at time T0, and later times during a CMP cycle may be indicated as times T1, T2, etc., or times T*a*, T*b*, etc. to designate times T during pressure ramp-up, for example.

Figure 2B:
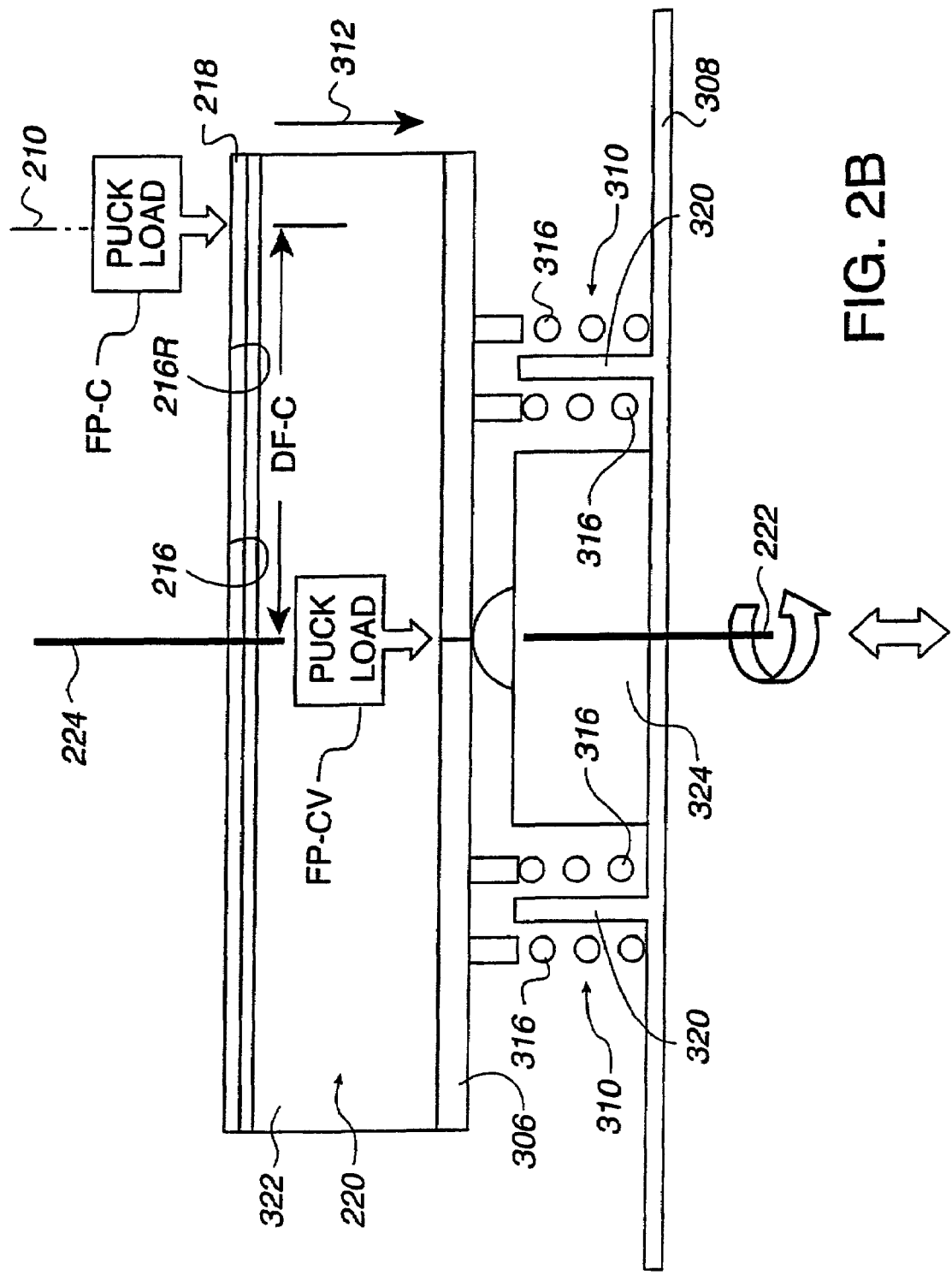
FIG. 2B is an elevation view schematically showing the pad conditioning head of the second embodiment, illustrating linear bearing structures for limiting the direction of relative movement between a main bearing housing and a chuck bearing and load cell plate.

FIGS. 1A, 1B and 2B also show that in the use of the subaperture configuration of the CMP system 200-1, at any given time TN, such as time T1, there may be a variation in the size of the contact area APC of contact between the surface of the polishing pad 209 and an exposed surface 216 of a polishing pad conditioning puck 218 mounted on a pad conditioning head 220. Such time T1 is after the touchdown time T0 at which the pad 209 first contacts the puck 218. In addition, in the subaperture CMP system 200-1, with the polishing head 202 held against movement in the direction of the axes 210 and 211, as the pad conditioning head 220 is moved toward the polishing head 202, the polishing pad 209 contacts, and applies another force FP-C (a conditioning force, FIG. 2B) only to selected regions 216R of the puck 218. The selected regions 216R correspond to the contact area APC. One such selected region 216R of the puck 218 of the pad conditioning head 220 is also displaced from, or eccentric relative to, a central axis 222 of the pad conditioning head 220, which is co-axial with a central axis 224 of the puck 218. As shown in FIG. 2B, the displacement of the force FP-C is indicated by DF-C. The displacement DF-C is measured horizontally in FIGS. 1B and 2B and is between the axes 222 and 224, on the one hand, and the axis 210 of the polishing head 202. As described above with respect to the force FP-W being an average force FP-W, the force FP-C is an average force. Similarly, the pressure and area factors relating to the regions 204R apply to the regions 216R.

Further, in the same exemplary situation in which the polishing head 202 is designed to rotate on the axis 210 that is also vertical, as shown in FIG. 1B there is also an initial orientation of the puck 218 and of the pad conditioning head 220. This initial orientation includes a third initial orientation of the central axis 222 of the head 220 and of the central axis 224 of the puck 218. The initial third orientations of the axes 222 and 224 are, for example, substantially vertical when the polishing head 202 is designed to rotate on the axis 210 that is also vertical. Further, in the same exemplary situation in which the polishing head 202 is designed to rotate on the axis 210 that is also vertical, the initial orientation includes a fourth initial orientation of the exposed surface 216 of the puck 218. The fourth initial orientation of the exposed surface 216 is positioned at an angle (a first angle) of ninety degrees with respect to the initial substantially vertical orientation of the respective central axes 222 and 224 of the head 220 and of the puck 218.

In the phrase "initial orientation" as used in this application, the word "initial" also designates the above-described orientation that occurs at a time TOPP just before touchdown, which also refers to the time TN when the pad 209 first engages the region 216R of the exposed surface 216 of the puck 218. Thus, at the time TOPP there is initially no force FP-C (FIG. 2B) applied by the pad 209 on the puck 218.

Reference is further made to FIG. 2A, and to the exemplary situation in which the polishing head 202 is designed to rotate on the axis 210 that is vertical. The CMP system 200-1 includes multiple linear bearing structures 230 and 232 of the wafer carrier 208. In a general sense, the structures 230 and 232 facilitate making repeatable measurements of the eccentric forces FP-W. Thus, the force FP-W applied to the wafer carrier 208 may be accurately measured, as defined above, even though such force FP-W is eccentrically applied to such carrier 208. In more detail, the structures 230 and 232 enable the providing of the above defined accurate indication of an amount of such eccentric force FP-W.

Describing the term "accurate indication" in view of FIG. 2A, for example, the referenced repeatable measurement technique may be described in terms of many of the exemplary forces FP-W which from one time T1 to another time T2 have equal values. By the present invention, each time T1 and T2 at which those equal exemplary forces FP-W are measured, the measured or indicated value is the same within a very small tolerance. Such equal exemplary eccentric forces FP-W are applied by the polishing pad 209 to the wafer carrier 208, for example. It is to be understood that as mechanical devices, the structures 230 and 232 will cause some amount (referred to as a force FF, or a friction force FF) of the equal exemplary eccentric forces FP-W to be lost, such as due to friction. In this context, the referenced repeatable measurement technique is one which, for each such equal exemplary eccentric force FP-W, the loss of force FF within the measurement system and within the system for supporting the carrier, will be substantially the same, i.e., repeatable. Therefore, by providing a minimum of mechanical structure between the exemplary forces FP-W and the structures 230 and 232 as described below, there is no force FF lost in the carrier 208, which leaves only each separate bearing structure 230 and 232 as a source of the force FF for a particular respective measurement.

The structure 230, for example, is resistant to all except a vertical component FP-WV of the force FP-W applied to the wafer 206 and to the carrier 208 at the location that is eccentric with respect to the initial first orientation of the central axis 212 of the wafer carrier 208. The linear bearing 230 assures that the structure of the wafer carrier 208 is not allowed to move in an undesired manner in response to such an eccentric force FP-W. For example, in such CMP system 200-1 such eccentric force FP-W is not allowed to move such wafer carrier 208 nor the wafer 206 relative to the initial first orientations of the respective central axes 212 and 214 of the respective wafer carrier 208 and wafer 206, except as follows. The exception is that the wafer carrier 208 and the wafer 206 are permitted to move only parallel (see arrow 233) to the initial first orientations of those respective central axes 212 and 214. The arrow 233 is parallel to the vertical component FP-WV.

FIG. 2A schematically depicts two of three of the multiple linear bearing structures 230 in more detail, and FIGS. 5A-1 through 5A-3, and FIGS. 5B-1 through 5B-3 show the three multiple linear bearings 230 in more detail. A main bearing housing 250 is provided with a first set 252 of three linear bearings 253. Each bearing includes three sleeves 254, each of which is made from material sold under the trademark FRELON. The FRELON material is impregnated with hard particulate material for both low friction characteristics and increased wear-resistance. Suitable sleeves 254 may have a one-half inch inside diameter and a length of about one and one quarter inches. The sleeves may be linear bearing Model Number FL08 sold by Pacific Bearing, of Rockford, Ill. For illustrative purposes, in FIG. 2A each sleeve 254 is depicted by spaced pairs of circles. Each sleeve 254 is open at a bottom 256 to receive a mating bearing shaft 258 shown in FIG. 2A for illustrative purposes as an upwardly extending line. Each shaft 258 is made from stainless steel material. Suitable shafts 258 may have an outside diameter of about just less than one-half inch so as to provide a clearance of no less than 0.005 inch when the shaft 258 has a size based on the maximum allowable plus tolerance for the shaft 258 and the sleeve has a size based on the maximum allowable minus tolerance. The shaft 258 may be about one and one-quarter inches long. Each shaft 258 extends upwardly from a chuck bearing and load cell plate 260 and extends through the bottom 256 and into one of the sleeves 254. The main bearing housing 250 is fixed to, and carries, a vacuum chuck 262 of the wafer carrier 208. The chuck 262 carries the wafer 206, which during polishing is subjected to the eccentric force FP-W, indicated as a wafer load imposed on the wafer 206.

As described above, FIG. 1B shows the initial orientation of the wafer carrier 208 and the wafer 206 before touchdown of the pad 209 and the exposed surface 204 of the wafer 206. Thus, there is initially no force FP-W applied by the pad 209 on the wafer 206, and initially the respective axes 212 of the wafer carrier 208 and 214 of the wafer 206 are vertical and coaxial in the exemplary situation. It is recalled that in the exemplary situation, the polishing head 202 is designed to rotate on the axis 210 that is vertical, and applies the eccentric force FP-W (FIG. 2A) vertically downwardly on the wafer 206. The structure 230 is linear in the direction of the axis 210 of the polishing head and of the axis 211 of the pad 209. Thus, the structure 230 is resistant to all except the vertical component FP-WV of this eccentric force FP-W applied to the wafer 206 and to the carrier 208.

In detail, set 252 of three bearings linear bearings 253 assures that structure of the wafer carrier 208 is not allowed to move in an undesired manner in response to such an eccentric force FP-W. Thus, the linear bearings 253 assure that such eccentric force FP-W does not move such wafer carrier 208 nor the wafer 206 except vertically, which is parallel to the initial first orientations of the respective central axes 212 and 214 of the respective wafer carrier 208 and wafer 206. As a result, the eccentric wafer load FP-W (shown in FIG. 2A acting on the wafer 206), minus the friction force FF, is transferred to the main bearing housing 250 and is referred to as the permitted vertical force component FP-WV. The force component FP-WV is therefore a net force, after deduction of the force FF.

Figures 2, 5B:
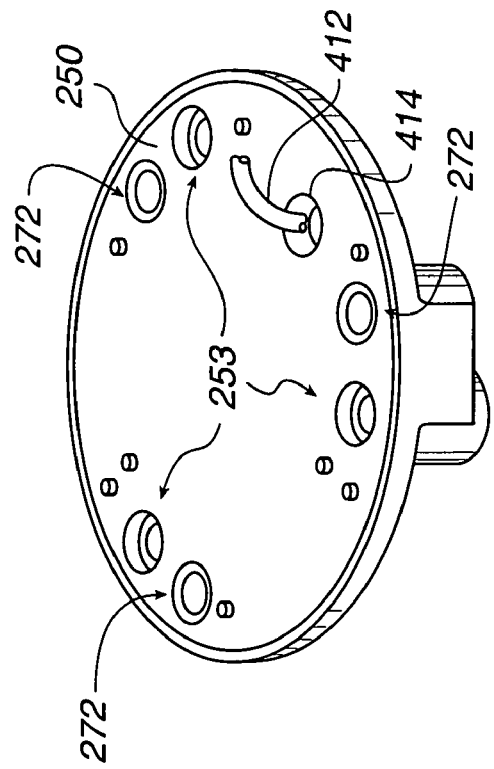

FIGS. 4B, 5B-1 and 5A-2 show the multiple linear bearing structures 230 (shown in FIG. 2A) as including an array 265 of the linear bearings 253. The array 265 is configured to divide the operation of the multiple linear bearing structures 230 into parts having a short length in the direction of the axes 212 and 214 and small diameters relative to the diameters (e.g., eight inches) of the wafers 206 and the pucks 218. Moreover, such division locates the linear bearings 253 of the structures 230 at uniformly spaced intervals around a circular path 266 (FIG. 5B-3). In this manner, as the wafer carrier 208 or the pad conditioning head 220 rotate, there is a rapid succession of individual linear bearings 253, for example, located under the eccentric force FP-W that is to be sensed in the operation of the CMP system 200-1.

Figures 1, 1C:
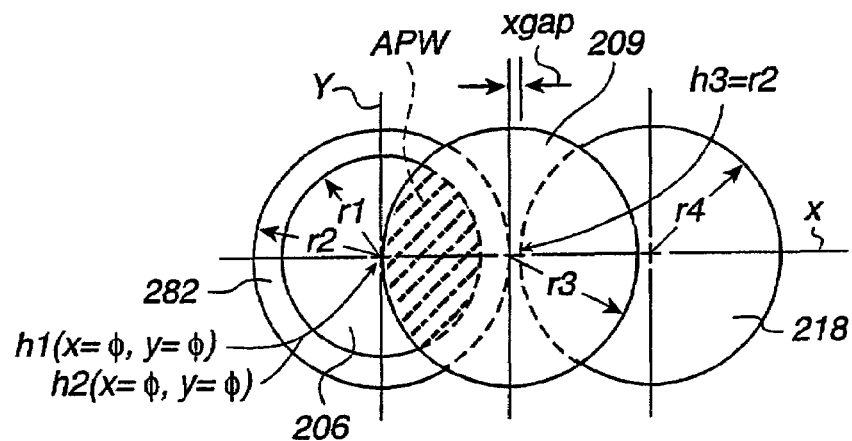
FIG. 1C-1 is a plan view schematically showing an aspect of the present invention in which an initial position of the polishing head is illustrated, identifying a contact area of a polishing pad of the polishing head and the wafer carried by the wafer carrier.

The force FP-WP acts on a load cell 263 (FIGS. 2A and 5B-1). The load cell 263 may be a standard strain gauge such as Model Number LPU-500-LRC sold by Transducer Techniques, of Temecula, Calif. The load cell may have a load sensing range of from about zero pounds of force to 500 pounds of force. More preferably, a more accurate load sensing range may be used, e.g., from about zero to about 400 pounds of force. The load cell 263 is secured to the chuck bearing and load cell plate 260. The permitted movement of the main bearing housing 250 under the action of the force FP-WP is sensed by, or actuates, the load cell 263, which outputs a wafer load signal 264 (FIG. 5B-1) in response to such movement). As described above, to uniformly polish the exposed regions 204R of the wafer 206, for example, controlled amounts of pressure should be applied to the different exposed and contacted regions 204R. As the area APW of the exposed and contacted regions 204R increases, for example, the force FP-W would be increased to have the amounts of pressure be even. Alternatively, based on a polishing pressure profile the force FP-W may be controlled so as to be constant, or vary out of proportion to the variation of the contact area APW, to have the amounts of pressure conform to the polishing pressure profile. The force FP-W applied to the wafer 206 must be accurately controlled to provide the desired polishing. Such control takes into consideration the polishing pad 202 movement in the direction of the arrow 209H during the polishing operations performed on one wafer 206, and a result of such polishing pad movement, which is that the values of the areas APW become different. As described more fully below, processing of the wafer load signal 264 is performed and a force F applied to the plate 260 of the wafer carrier 208 in the upward direction (FIG. 1B) is adjusted as necessary to provide the appropriate force FP-W applied by the polishing pad 209 on the area APW of the wafer 206 to provide the desired polishing pressure.

Figure 7:
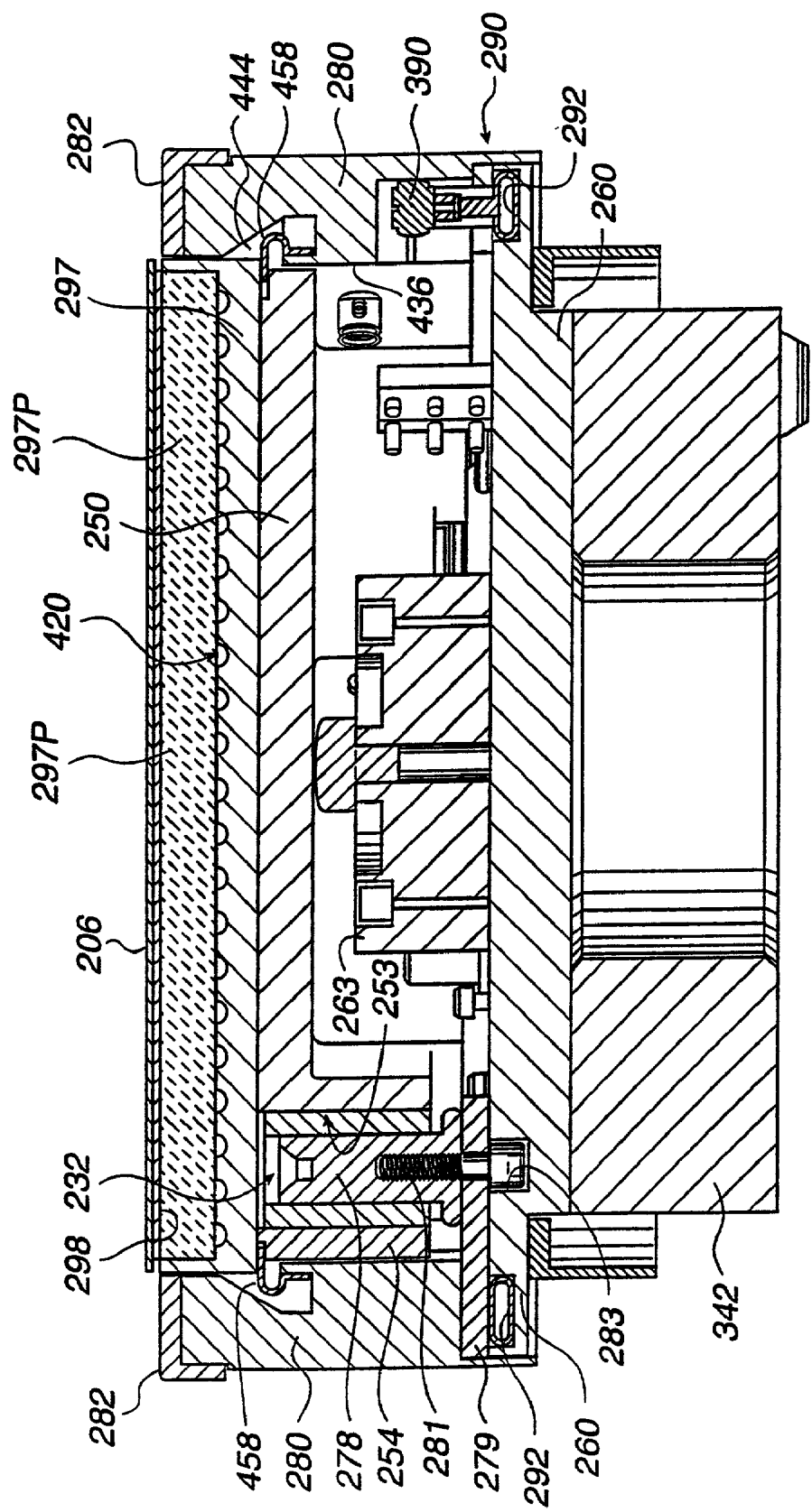
FIG. 7 is a cross sectional elevation view taken on line 7-7 in FIG. 6A showing the main bearing housing movably connected to a retainer ring bearing plate, showing a bearing shaft of the plate in a cylindrical linear bearing on the housing to limit movement of a retainer ring base mounted on the plate.
Figure 15:
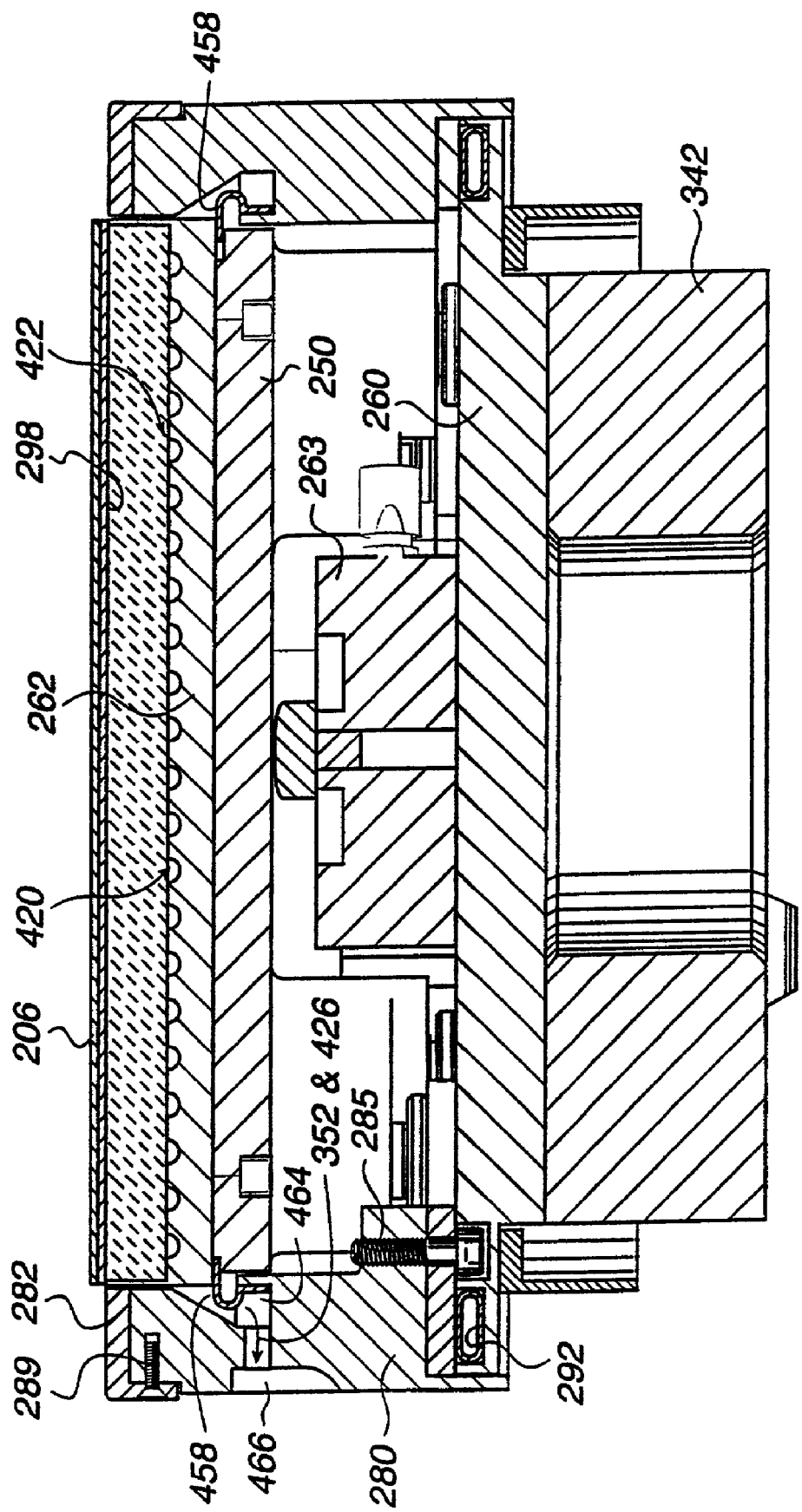
FIG. 15 is a cross section taken along line 15-15 in FIG. 6A through the retainer ing base, illustrating an outlet for removing slurry and DI wafer wash water from the inside of the wafer carrier.

The linear bearing structures 232 are described with reference to FIGS. 1B, 2A, 5A-1 through 5A-3, and 5B-1 and 5B-2. The main bearing housing 250 is provided with a second set 270 of three linear bearings 272, including three sleeves 274 (depicted by spaced pairs of circles). The sleeves 274 have open bottoms 276 to receive mating bearing shafts 278 (depicted as upwardly extending lines). The shafts 278 are mounted on a retainer ring bearing plate 279 by screws 281 received in a bore 283 (FIG. 7). The bore 283 is dimensioned to permit the screw to move with the plate 279 relative to the plate 260, such as for vertical travel of 0.050 inch of the retainer ring 282. The bearings 272 may be the same type bearings as the bearings 253, for example. The retainer ring bearing plate 279 is secured to a retainer ring base 280 by screws 285 (FIG. 15). The base 280 is designed to move vertically as limited by the linear bearings 272 of the second set 270, and is free, for example, to move through the same amount of travel (0.050 inch) as the plate 279. At the top of the retainer ring base 280 a retainer ring 282 is removably provided for contacting the polishing pad 209. The retainer ring 282 is thus mounted for movement independently of the plate 260 and independently of the main bearing housing 250. The retainer ring 282 engages the polishing pad 209, such that the retainer ring 282 may be replaced from time to time as by loosening screws 289 (FIG. 15).

As described above, FIG. 1B shows the initial orientation of the wafer carrier 208. The carrier 208 includes the retainer ring base 280 and the retainer ring 282. The retainer ring base 280 surrounds and is spaced from the vacuum chuck 262. The retainer ring 282 is designed to be engaged by the polishing pad 209 during the wafer polishing operations, and the polishing pad 209 imparts a force FP-R on the retainer ring 282. The force FP-R is eccentric with respect to the axis 212 of the wafer carrier 208.

At a time TOPRR before touchdown, at which the pad 209 of the polishing head 202 engages the retainer ring 282, an outer cylindrical surface 284 is vertical. The surface 284 is defined by the retainer ring base 280 and the retainer ring 282. At such time TOPRR, there is initially no force FP-R applied by the pad 209 on the retainer ring 282, and respective central axes 286 and 288 of the retainer ring base 280 and retainer ring 282 are vertical.

It is recalled that in the exemplary situation, the polishing head 202 is designed to rotate on the axis 210 that is vertical. Thus, the polishing pad 209 applies the eccentric force FP-R vertically downwardly onto the retainer ring 282. Generally, the structure 232 functions in the same manner as the above-described functioning of the structure 230.

Thus the structure 232 is resistant to all except a vertical component (not shown, but identified as FP-RV) of this eccentric force FP-R applied to the retainer ring 282. In detail, the set 270 of three linear bearings 272 assures that structure of the retainer ring 282 is not allowed to move in an undesired manner in response to such an eccentric force FP-R. Thus, the linear bearings 272 assure that such eccentric force FP-R does not move such retainer ring 282, except as follows. The retainer ring 282 is permitted to move vertically, parallel to the initial third orientation of the central axis 212 of the respective wafer carrier 208, which are coaxial. As a result, the eccentric load FP-R (shown in FIG. 2A acting downwardly), minus the force FF relating to the structure 232, is transferred to the retainer ring bearing plate 279 as the permitted vertical force component FP-RV. Referring to FIG. 2A, for example, it may be understood that the motion of the retainer ring 282 (shown in FIG. 1E-3 for example) that is limited by the structure 232 is independent of the motion of the wafer carrier 208 that is limited by the structure 230.

Figures 1, 1C, 2:
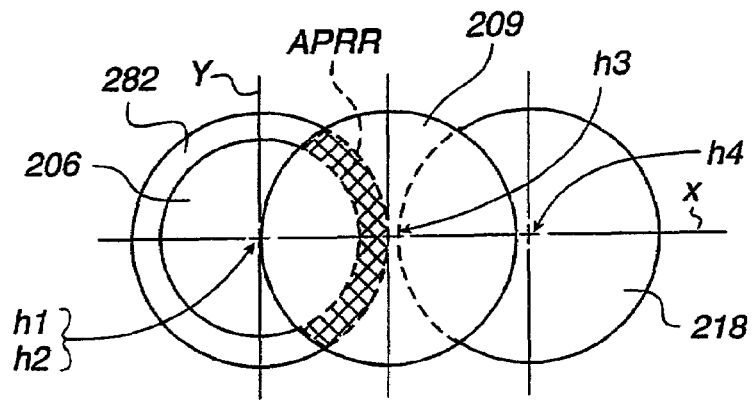
Figures 1, 1C, 2, 3:
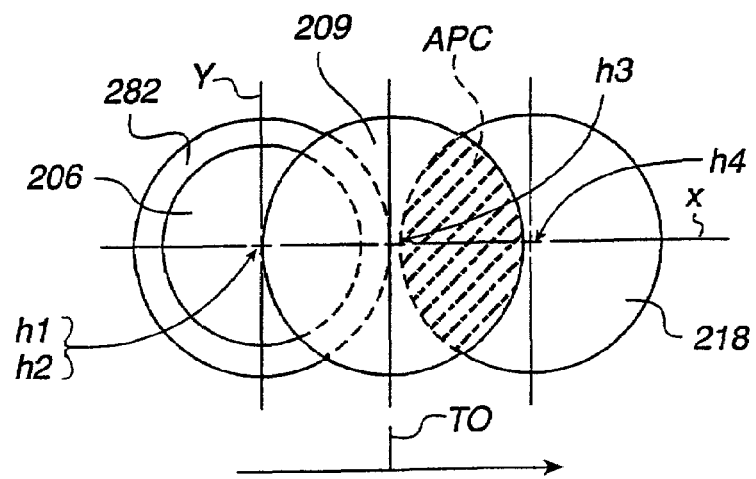

A force actuator, or linear motor, 290 is mounted between the chuck bearing and load cell plate 260 and the retainer ring bearing plate 279. The linear motor 290 may preferably be provided in the form of a sealed cavity, or more preferably in the form of a pneumatic motor, or an electromagnetic unit, or an electromechanical unit. A most preferred linear motor 290 includes structure shown in FIGS. 7, 12A, 13A, and 14A, including a pneumatic bladder 292 supplied with pneumatic fluid 293 (FIG. 8) through an inlet (not shown). As shown in FIGS. 5B-1 and 13A the chuck bearing and load cell plate 260 is provided with an annular groove 296 for receiving the bladder 292. The linear motor 290 is selectively actuated by supplying the fluid 293 to the bladder 292 at different amounts of pressure (PB) according to the amount of a desired stroke of the bladder 292. For example, referring to FIGS. 12A and 12B, a maximum stroke of the bladder 292 may be 0.10 inches measured vertically. Such maximum stroke compares to a vertical dimension (or thickness) of the wafer206, which may be 0.02 inches. For purposes of description, the plate 260 may be said to be fixed in the vertical direction, such that when the fluid 293 is admitted into the bladder 292 the bladder will urge the plate 279 upwardly by a distance corresponding to the particular stroke of the bladder 292 resulting from the pressure of the fluid 293. The bladder 292 will thus move the retainer ring bearing plate 279, and thus move the retainer ring base 280 and the retainer ring 282, up (in this example) relative to the wafer 206 positioned on the vacuum chuck 262, and relative to the pad 209 positioned relative to the retainer ring 282 as shown in FIG. 1C-2, for example.

Figure 13B:
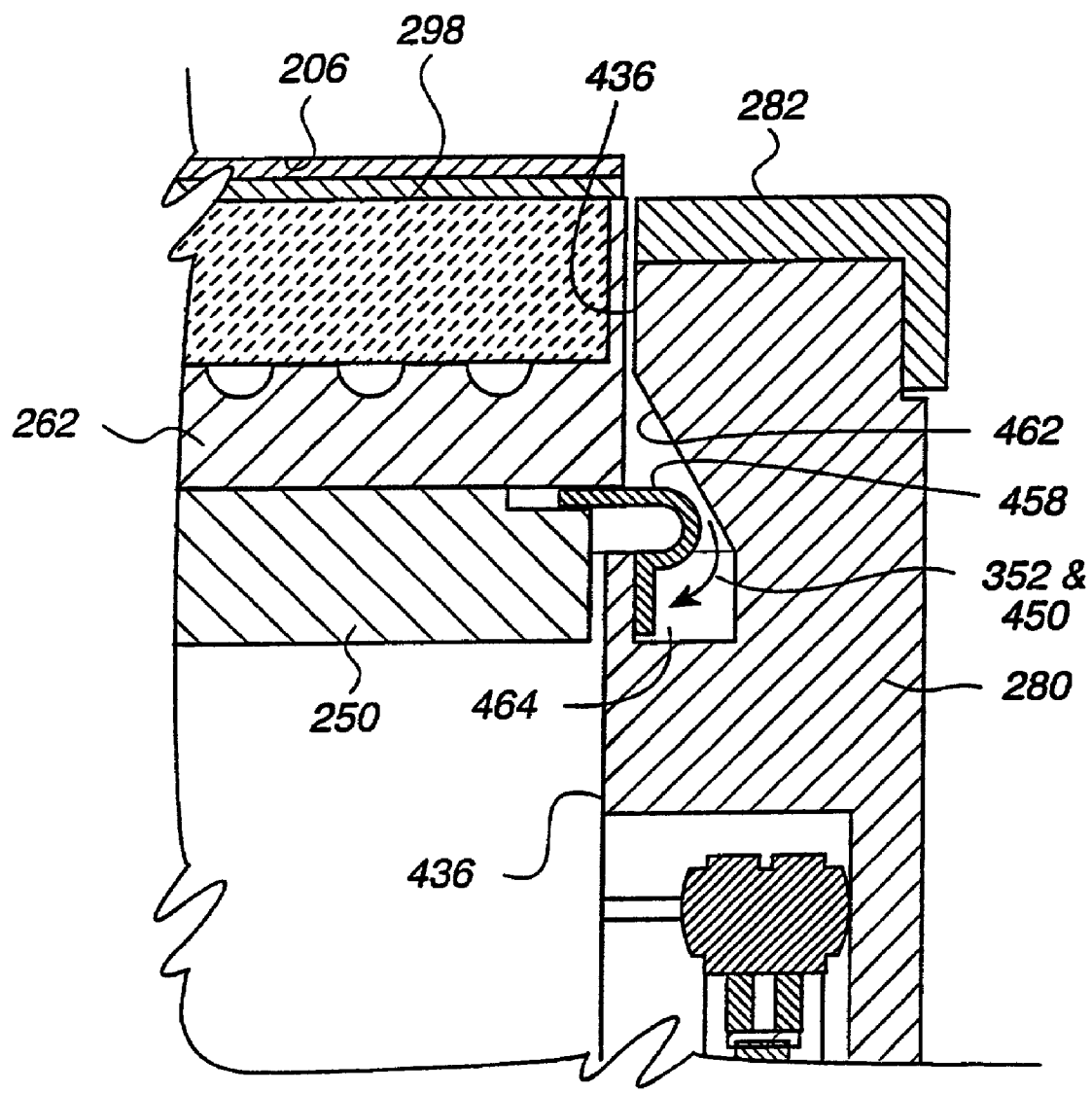
FIG. 13B is a further enlarged portion of FIG. 13A.

The pressure PB of the fluid 293 may be one of many pressures, for example. In a general, preliminary sense, the fluid 293 under pressure is used to move the retainer ring 282 into one of three vertical positions. The pressure PB may be in a range of from about 15 psi. to about seven to ten psi, for example. FIGS. 13A and 13B are cross sections showing the retainer ring 282 in one of the three positions, a disengaged position, in which the retainer ring 282 is away from (below) both the wafer 206 and a carrier film 298 mounted on the vacuum chuck 262. In the disengaged position, the retainer ring 282 does not interfere with removal of the wafer 206 from the chuck 262, and the pressure PB is low relative to the pressure PB required to position the retainer ring 282 in the other positions.

Figure 14A:
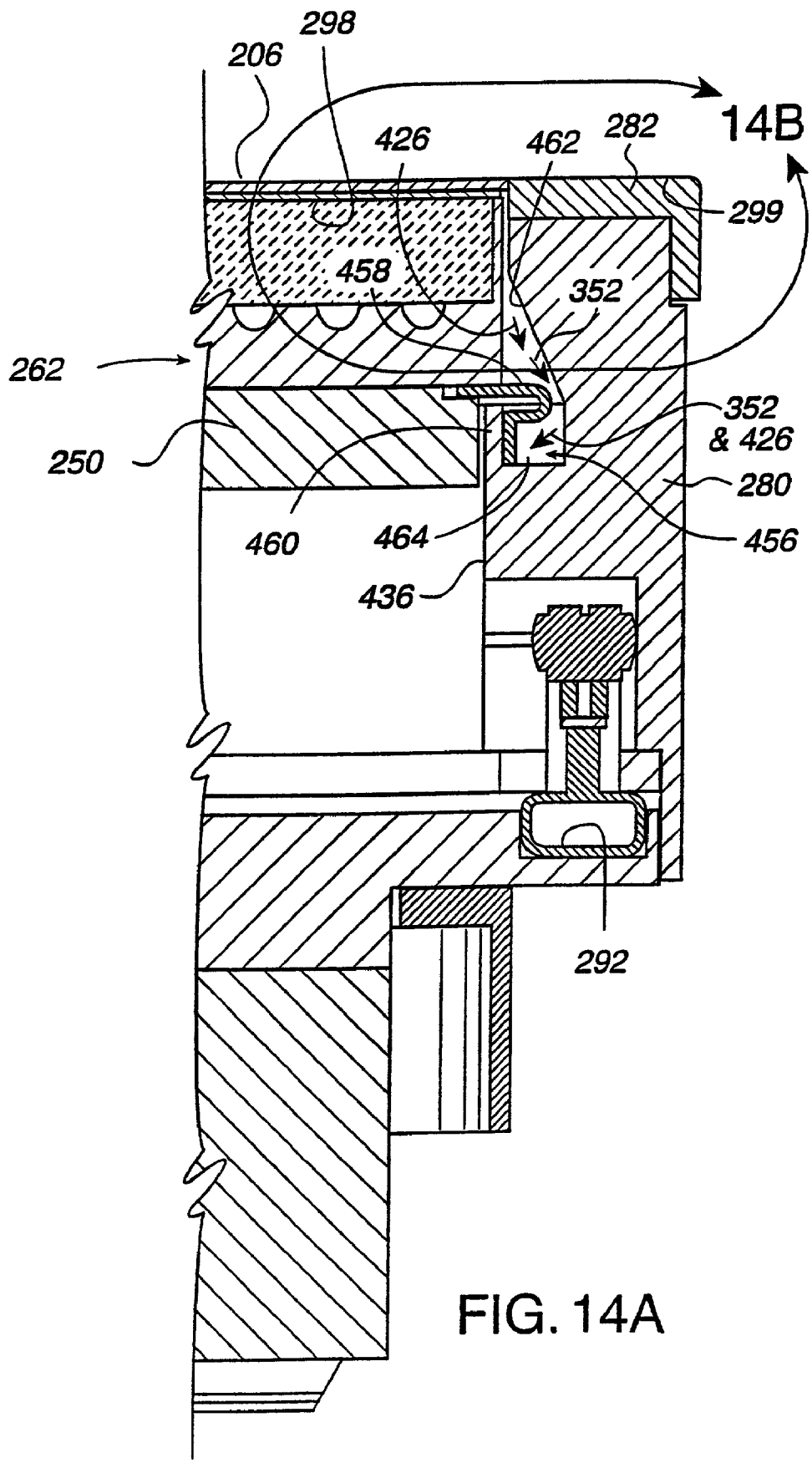
Figure 14B:
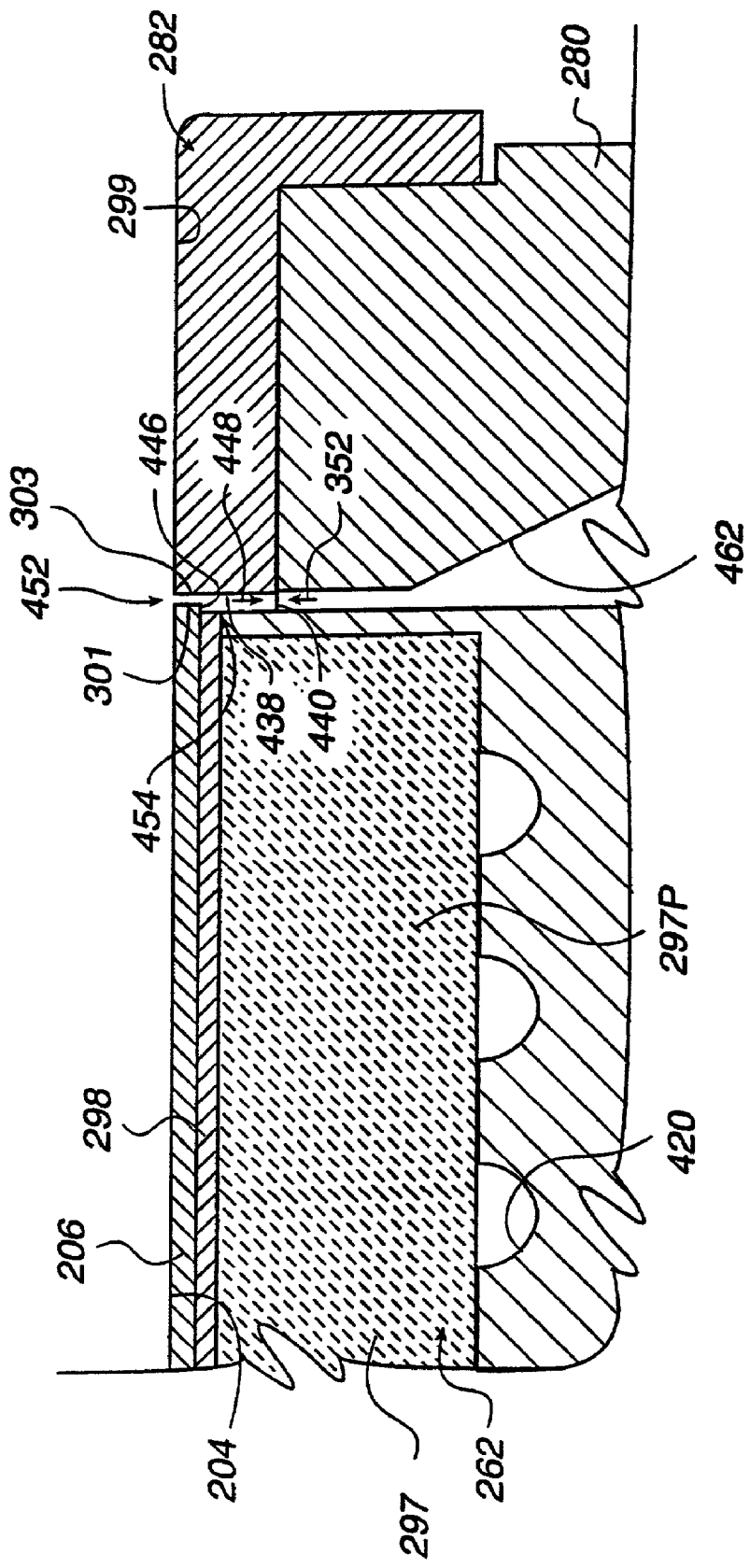
FIG. 14B is a further enlarged portion of FIG. 14A.

The cross-sections shown in FIGS. 14A and 14B depict a next higher one of the three positions of the retainer ring, which is referred to generally as "a" polishing position, which as described below in detail, may be a range of positions parallel to the axes 214 and 212. The general polishing position is the position of the ring 282 during polishing of the wafer 206. In this polishing position, an upper surface 299 of the retainer ring 282 is horizontally aligned with, or coplanar with, the upper (exposed) surface 204 of the wafer 206. As shown in FIG. 14B, in the polishing position, a peripheral edge 301 of the wafer 206 is surrounded by an inner wall 303 of the retainer ring 282, and the surfaces 299 and 204 are coplanar.

Figure 12B:
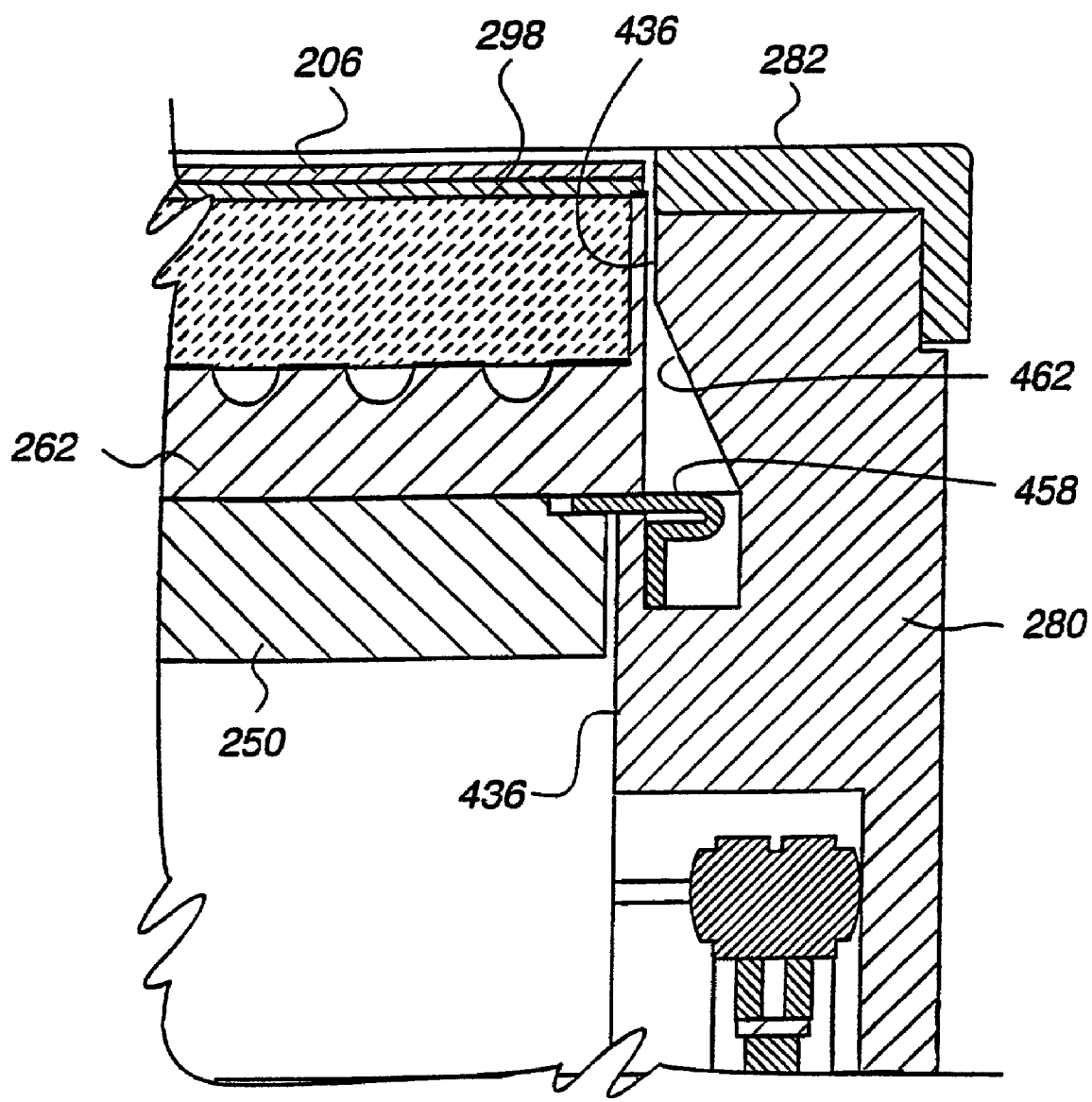
FIG. 12B is a further enlarged portion of FIG. 12A.

As noted, thirdly, FIGS. 12A and 12B show a cross section in which the retainer ring 282 is in a maximum up, or wafer-capture, position suitable for locating the wafer 206 on the carrier film 298 of the vacuum chuck 262 with the axis 214 of the wafer 206 co-axial with the axis 212 of the wafer carrier 208. As shown in FIG. 12B, in the maximum up position, the peripheral edge 301 of the wafer 206 remains surrounded by the inner wall 303 of the retainer ring 282 and the upper surface 299 of the retainer ring 282 is above the exposed surface 204 of the wafer 206 to facilitate ease of placing the wafer 206 on the chuck 262 within the retainer ring 282

In more detail, the ring load force FP-R acts eccentrically on the retainer ring 282 and tends to move the ring 282 eccentrically. However, the linear bearings 272 assure that the movements of the retainer ring 282 and of the base 280 are only vertical, parallel to the initial orientations of the respective central axes 286 and 288 of the respective retainer ring base 280 and retainer ring 282. As a result, only the vertical, downwardly acting component FP-RV of the force FP-R (the component FP-RV being shown in FIG. 2A as a ring load acting vertically on the retainer ring 282) is transferred through the retainer ring base 280 to the retainer ring bearing plate 279. Also, the linear motor 290 applies an upward force FM (FIG. 2A) to the retainer ring bearing plate 279 that supports the shafts 278 of the linear bearings 272. The linear bearings 272 also assure that only a vertical component force, or net force, FM-V of the force FM is effective to move the retainer ring base 280 and the retainer ring 282 against the vertical component FP-RV of the ring load force FP-R. In this manner, the permitted movement of the retainer ring 282 in response to the force FP-R (i.e., movement parallel to the initial position of the axis 212 and 214) is coaxial with (and thus in the same direction as) the permitted movement of the chuck 262 and the wafer 206 on the chuck 262 in response to the force FP-W (i.e., the direction parallel to the initial position of the axis 212 and 214).

As to the noted range of polishing positions of the retainer ring 282, due to the above-described reasons for varying the upward force F (FIG. 1B) applied to the plate 260 of the wafer carrier 208 (e.g., according to the value of the area APW of the exposed and contacted region 204R), it may be understood that it is also necessary to vary the force FM applied by the motor 290 to the retainer ring 282, which will vary the force FP-R applied by the polishing pad 209 on the retainer ring 282. For example, as shown in FIGS. 1A, 1B, 1C-1 through 1C-3, 1D-1 through 1D-3, and 1E-1 through 1E-3, as the polishing pad moves from a far leftward location overlapping the retainer ring 282, and moves to the right, there is a relatively large initial value of the area APRR overlapped by the polishing pad 209. In one example, as the value of the overlapped area APRR varies with such motion 209H, if it is desired to keep the polishing pressure constant on the area APRR of the retainer ring 282 contacted by the polishing pad 209, the force FM must be varied as a function of the relative movement of the polishing pad 209. As a result, the above-described polishing position of the retainer ring 282 is in detail a range of positions determined according to what net force FM-V must be applied by the retainer ring 282 to the pad 209 in order to achieve the desired pressure on the retainer ring 282.

Figure 19A:
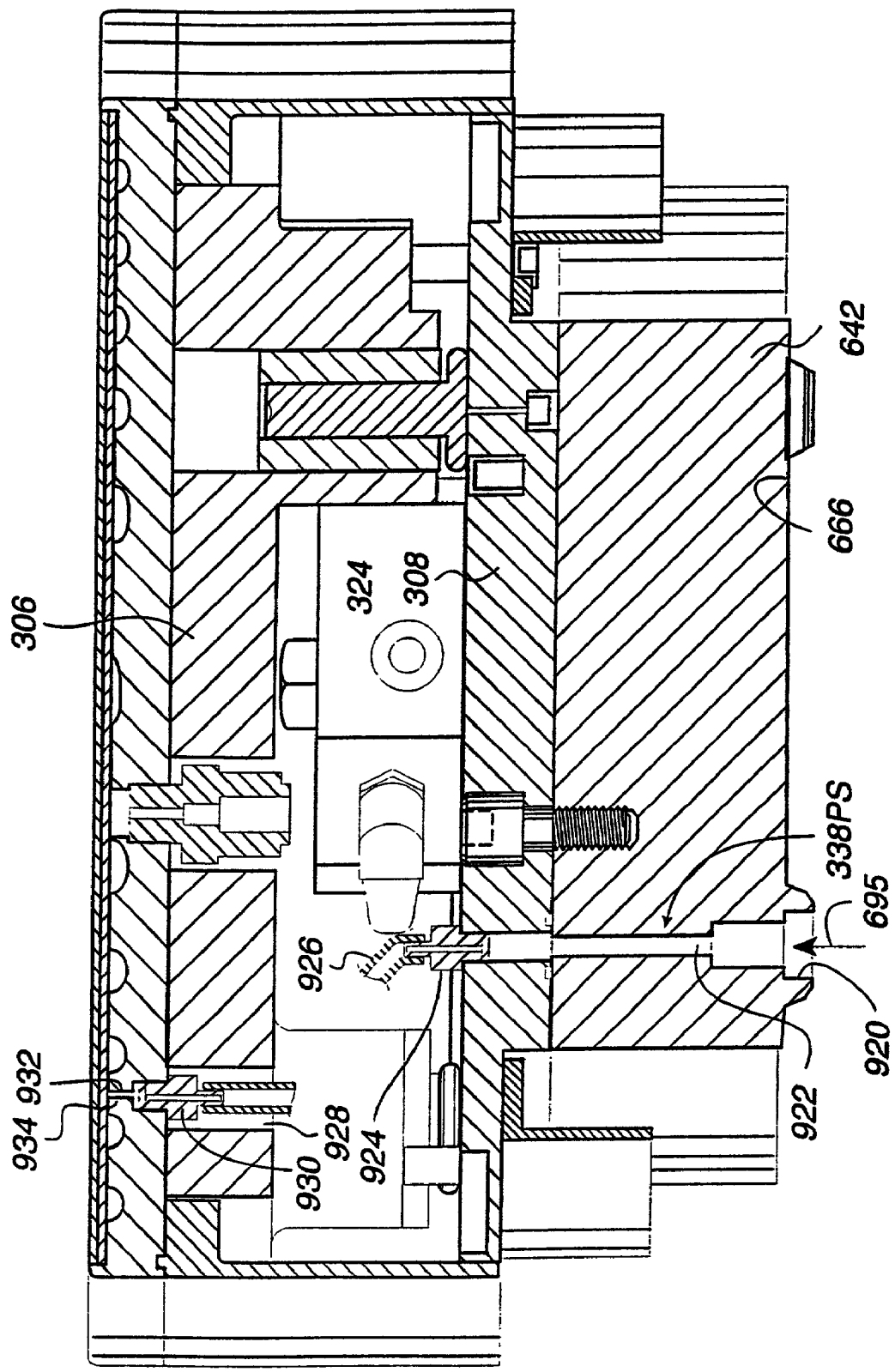
FIG. 19A is a cross section taken along lines 19A-19A in FIG. 18, showing a vacuum conduit to a chuck for determining whether the puck is properly on the chuck.
Figure 19B:
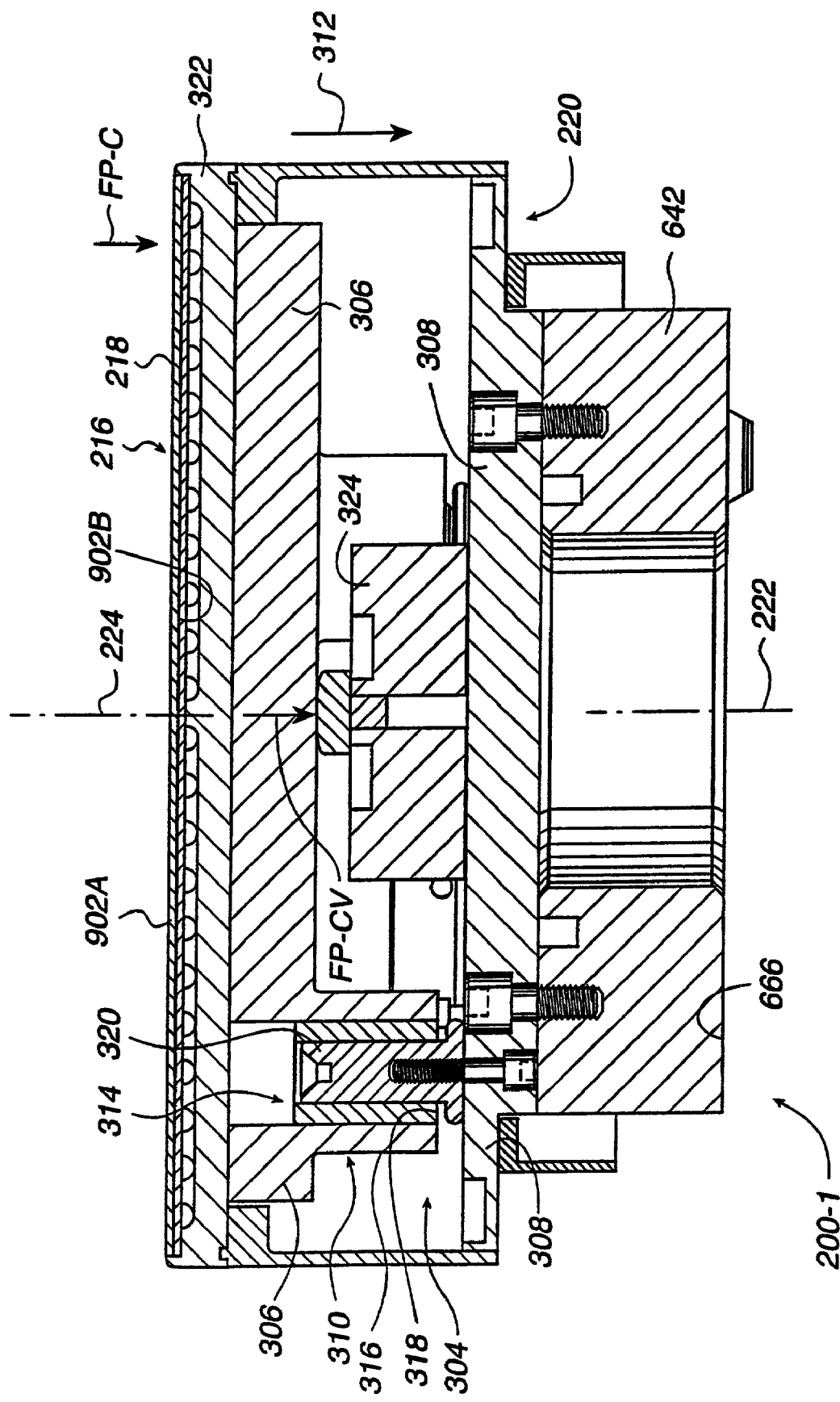
FIG. 19B is a cross section taken along lines 19B-19B in FIG. 18, showing a linear bearing used with the chuck.
Figure 20:
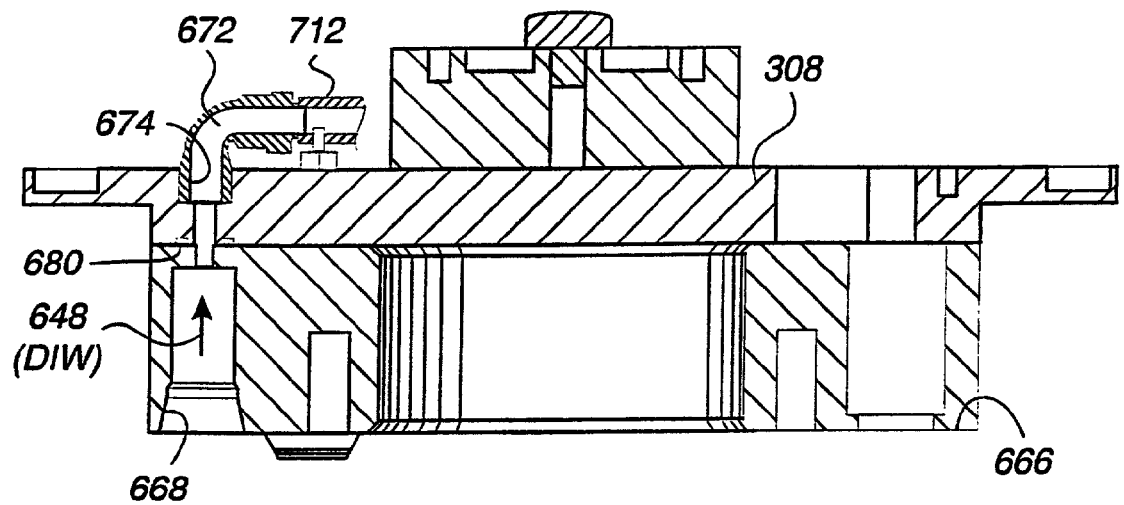
FIG. 20 is a cross section taken along lines 20-20 in FIG. 18, showing a conduit for supplying DI water for purging the puck on the chuck.

FIGS. 2B and 19B show the pad conditioning head 220, illustrating a linear bearing assembly 304 for limiting the direction of relative movement between a main bearing housing 306 and a puck bearing and load cell plate 308. It is recalled that in the exemplary situation, the polishing head 202 is designed to rotate on the axis 210 that is vertical. The CMP system 200-1 includes additional multiple linear bearing structures 310 of the pad conditioning head 220. Generally, the structures 310 are similar to the structures 230. Thus, the structures 310 function in the same manner as the above-described functioning of the structure 230. In more detail, the structure 310 facilitates making repeatable measurements of the eccentric forces FP-C. Thus, the force FP-C applied to the area APC of the puck 218 may be accurately measured, as defined above, even though such force FP-C is eccentrically applied to such puck 218. The structure 310 therefore enables the providing of the above defined accurate indication of an amount of such eccentric force FP-C.

In more detail, the structures 310 are resistant to all except a vertical component FP-CV of the force FP-C applied to the area APC of the puck 218 at the location that is eccentric with respect to the initial orientation of the central axis 222 of the pad conditioning head 220. In this manner, the linear bearing structures 310 assure that the structure of the head 220 is not allowed to move in an undesired manner in response to such an eccentric force FP-C. For example, the head 220 and the puck 218 are permitted to move only parallel (see arrow 312) to the initial orientations of those respective central axes 222 and 224, which are coaxial. The arrow 312 is parallel to the vertical component FP-CV.

FIG. 2B schematically depicts two of three of the multiple linear bearing structures 310 in more detail, and FIGS. 16A, 16B, and 19B show the three multiple linear bearings 310 in more detail. The main bearing housing 306 is provided with three linear bearings 314, including three hollow cylindrical sleeves 316. The sleeves 316 have an open bottom 318 to receive and allow the sleeves 316 to cooperate with respective shafts 320. The sleeves 316 of the linear bearings 314 may be the same Model Number FL08 sold by Pacific Bearing, of Rockford, Ill. as in the bearings 230 and 232, for example, and are depicted in FIG. 2B in a manner similar to that shown in FIG. 2A. The shafts 320 may be made in the same manner as described above with respect to the shafts 258. The main bearing housing 306 is fixed to, and carries, a chuck 322 of the pad conditioning head 220. The chuck 322 carries the puck 218, which during contact with the polishing pad 209 is subjected to the eccentric force FP-C, indicated in FIG. 2B as a puck load imposed on the puck 218.

As described above, FIG. 1B shows the initial orientation of the pad conditioning head 220 and the puck 218 before the pad 209 of the polishing head 202 engages the exposed surface 216 of the puck 218, e.g., at the initial time TOPP. Thus, there is initially no force FP-C applied by the pad 209 on the puck 218, and initially the respective axes 222 of the head 220 and 224 of the puck 218 are vertical in the exemplary situation. It is recalled that in such situation, the polishing head 202 is designed to rotate on the axis 210 that is vertical, and at any of the times TN described above may apply the eccentric force FP-C (FIG. 2B) vertically downwardly on the puck 218 and the head 220. The structure 310 is resistant to all except the vertical component FP-CV of this eccentric force FP-C applied to the puck 218. In detail, the three linear bearings 314 assure that structure of the head 220 is not allowed to move in an undesired manner in response to such an eccentric force FP-C. Thus, the linear bearings 314 assure that such eccentric force FP-C does not move such head 220 nor the puck 218 except vertically, which is parallel to the initial orientations of the respective central axes 222 and 224 of the respective head 220 and puck 218. As a result, the eccentric wafer load FP-C (shown in FIG. 2B acting on the puck 218), minus a corresponding force FF, is transferred to the main bearing housing 306 as the vertical component force, or net force, FP-CV and acts on a load cell 324 (FIGS. 2B, 16B, and 19B. The load cell is secured to the puck bearing and load cell plate 308. The permitted movement of the main bearing housing 306 is sensed by, or actuates, the load cell 324, which outputs a puck load signal 326 (FIG. 16B). The load cell 324 may be the same as the load cell 263 and the load cell signal 326 may be used in a manner similar to that of the load cell signal 264.

In view of the above discussion, it is to be understood that a tendency of the chuck 262 or of the wafer carrier 208, or of the pad conditioning head 220, to tilt, or to move out of the described initial orientation, is only a tendency, i.e., an action not taken. The action of tilting is not taken because of the above-described operation of the linear bearing structures 230, 232, and 3120, for example.

Figure 3A:
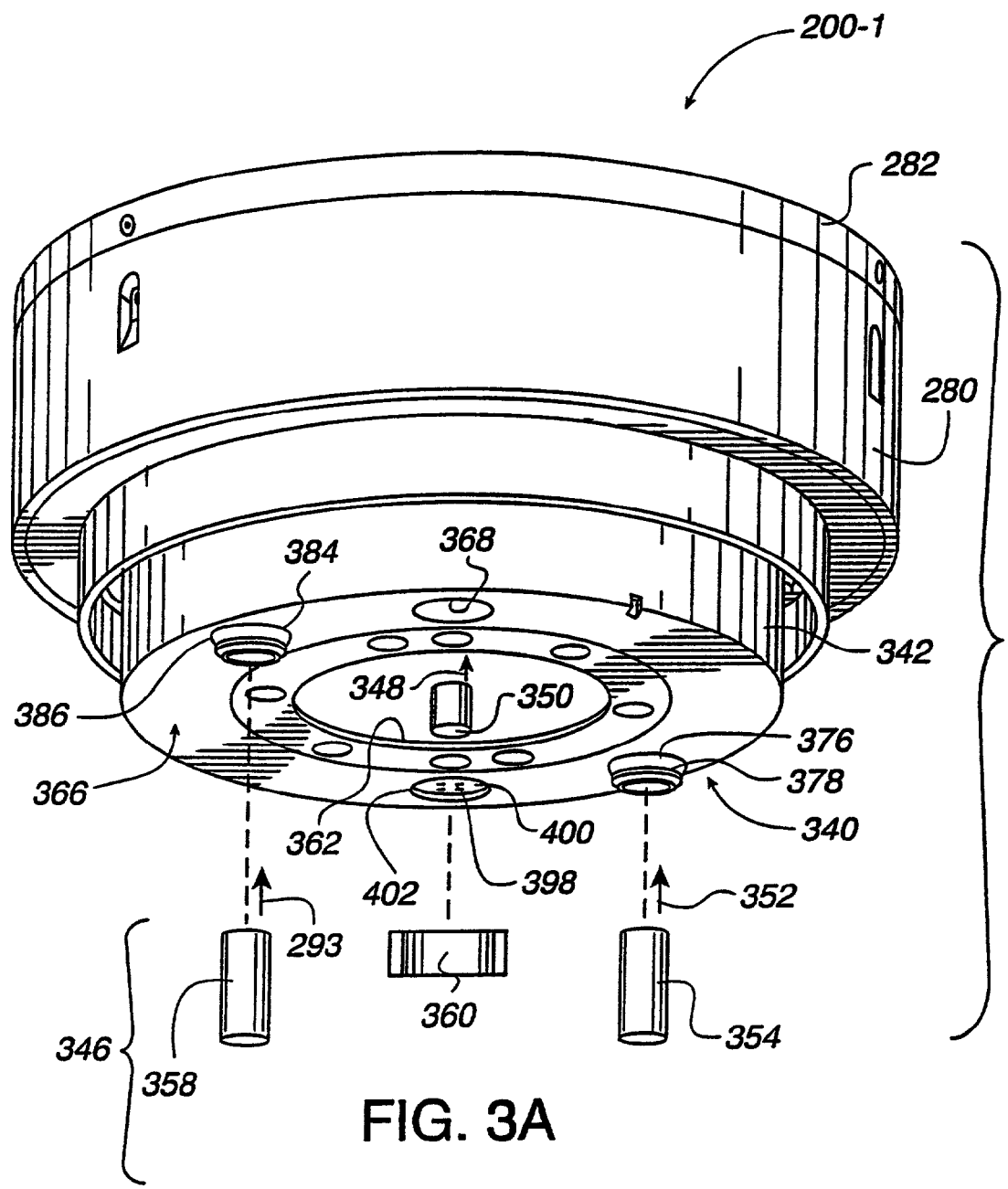
FIG. 3A is a three dimensional schematic view showing the structural elements of the wafer carrier of the first embodiment, illustrating the bottom of an upper section of a rotary tool changer (RTC)
Figure 3B:
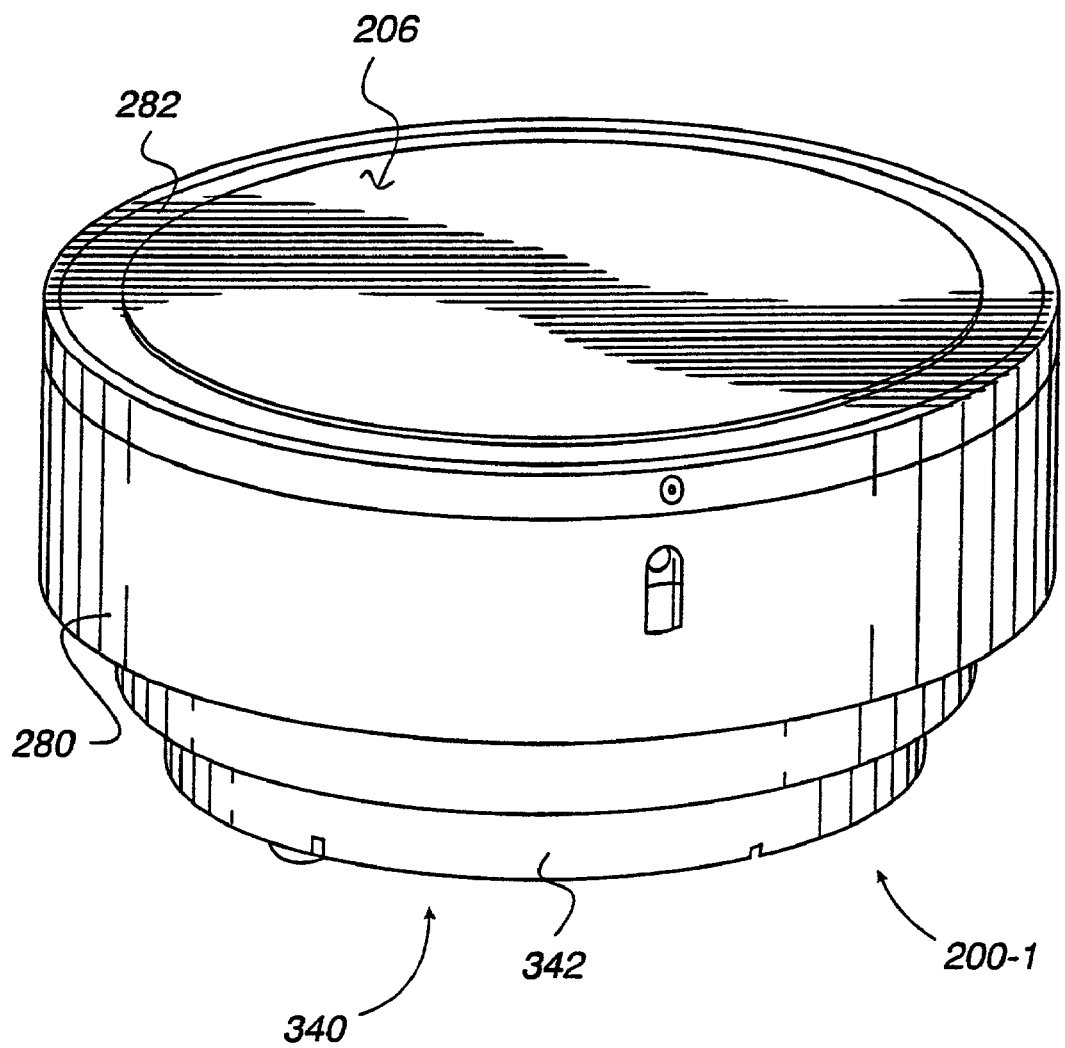
FIG. 3B is a three dimensional schematic view showing the structural elements of the wafer carrier of the first embodiment, illustrating the top of a vacuum chuck of the wafer carrier.
Figure 3C:
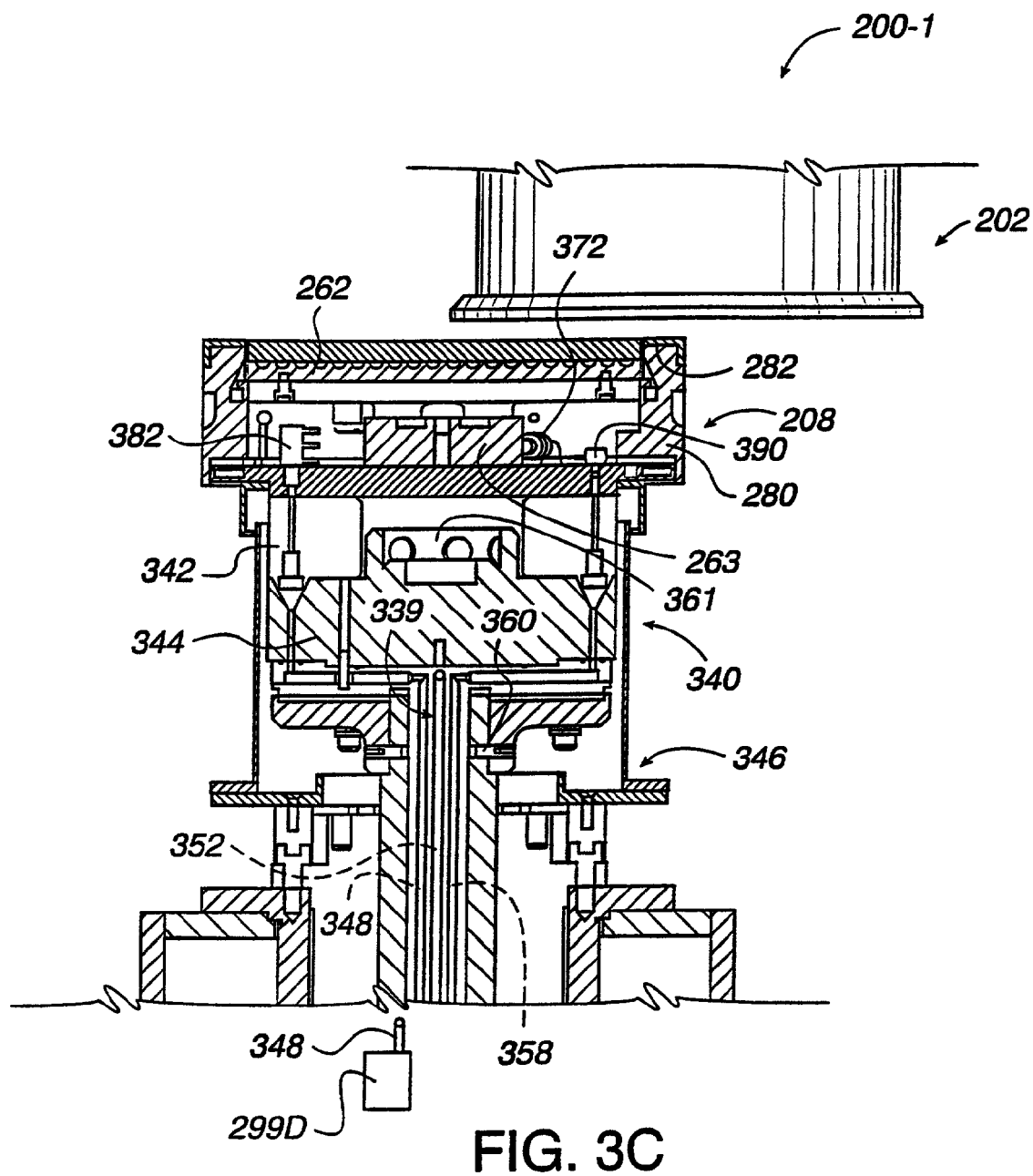
FIG. 3C is a schematic view of the wafer carrier, showing in dashed lines a spindle for supporting and supplying facilities to the carrier head, and a polishing head.

The CMP system 200-1 is not only provided with the above-described features that facilitate making repeatable measurements of the eccentric forces FP-W, for example, but is also provided with facilities (generally referred to using the reference number 338) for other CMP operations. The facilities 338 of the wafer carrier 208, for example, include facilities 338C for the vacuum chuck 262; facilities 338B for the bladder 292; facilities 338S for the retainer ring 282; and facilities 338 LC for the load cell 263. Such facilities 338 are provided for the CMP operations without interfering with the CMP operations. Considering these facilities 338 of the wafer carrier 208, reference is made to the three dimensional views of FIGS. 3A, 3B, and 3C and to the exploded views of FIGS. 4A and 4B, and to the enlarged perspective views of FIGS. 5A-1 through 5A-3 and FIGS. 5B-1 through 5B-3. FIGS. 3A through 3C show assemblies of structural elements of the first embodiment 200-1, including a rotary tool changer 340 to which the chuck bearing and load cell plate 260 is secured. The rotary tool changer 340 includes an upper section 342 and a lower section 344 (FIG. 3C). The lower section 344 is attached to a spindle 346 that rotates and applies vertical forces in up and down directions to the lower section 344. The upward vertical force is shown as forces F in FIG. 1B and result in the force that the polishing pad 209 resists in applying the force FP-W, for example. As shown in FIGS. 3A and 3C, the spindle 346 also provides the facilities 338C by supplying fluid, such as deionized water (DI water) 348 and vacuum, through a conduit 350 through a conduit 354 to the lower for use in the vacuum chuck 262. Additionally, the spindle 346 separately provides the facilities 338S by supplying fluid such as DI water 352 through a conduit 354 to the lower section 344 for cleaning the wafer 206 and the inside of the retainer ring base 280. Also, the spindle 346 separately provides the facilities 338B by supplying the fluid 293 (such as air under pressure) through a conduit 358 to the lower section 344 for operating the linear motor 290. The spindle 346 also provides the facilities 338LC by providing a slip ring 360 that connects with an electrical connector (not shown) on the lower section 344. The connector on the lower section 344 mates with a connector (not shown) to enable output of the wafer load cell signal 264 from the system 200-1.

The lower section 344 and the upper section 342 mate in a standard manner by way of a releasable connector 361 (FIG. 3C). To releasably join the sections 342 and 344, the connector 361 has a cam (not shown) driven by a piston rod (not shown) from the lower section 344 into a hollow center 362 of the upper section 342. The cam engages ball bearings (not shown) and urges the ball bearings outwardly and partially from a race (not shown) and partially into a V-shaped groove (not shown). The ball bearings releasably hold the upper section 342 and the and lower section 344 tightly joined. When it is desired to separate the upper and lower sections 342 and 344, the cam is retracted from the upper section 342 to allow the ball bearing to fully exit the V-shaped groove and release the upper section 342.

FIGS. 3A and 9 show the bottom 366 of the upper section 342. Four ports in the upper section 342 are provided for the facilities 338. A first port 368 mates with a similar port (not shown ) of the lower section 344 to supply the DI water and vacuum (see arrow 348). The port 368 receives a standard conical seal that extends from the similar port of [0] the lower section 344. The DI water 348 flows, and the vacuum 348 is applied, through the port 368, past an O-ring 370 shown in FIG. 5A-1 to a nozzle 372 shown in FIG. 5B-1 threaded into a threaded port 374 of the plate 260.

FIGS. 3A and 10 show a second port 376 that mates with a similar port (not shown) of the lower section 344 to supply the DI water (see arrow 352). The port 376 has a seal 378 mating with a standard conical seal (not shown) that extends from the similar port of the lower section 344. The DI water 352 flows through the port 376, past an O-ring 380 shown in FIG. 5A-2 to a six-outlet manifold nozzle 382 shown in FIGS. 5B-2 and 10. The nozzle 382 is threaded into a threaded port 374 of the plate 260.

FIGS. 3A, 5B-2, and 10 show a third port 384 that mates with a similar port (not shown ) of the lower section 344 to supply the air (see arrow 293). The port 384 has a seal 386 mating with a standard conical seal (not shown) that extends from the similar port of the lower section 344. The air (see arrow 293) flows through the port 384, past an O-ring 388 shown in FIG. 10 to a single outlet fluid connector 390. The connector 390 is threaded into a threaded port 392 of the plate 260, and via a conduit 393 is connected to the inlet 294 of the bladder 292.

The slip ring 360 on the spindle 346 is connected through the connector (not shown) on the lower section 344 which mates with a pogo pin connector received in a port in the lower section 344. The pogo pins extend upwardly into resiliently biased contact with electrical contacts 398 (FIG. 3A) of a connector 400 provided in a port 402 of the upper section 342. The port 402 has a shoulder (not shown) against which the connector 400 is urged when the plate 260 is connected to the upper section 342, as by six screws 404. The port 402 is aligned with a keyhole-shaped port 406 shown in FIG. 5A-2 as being provided in the plate 260. The port 406 is large enough to pass the connector 400 (to permit the connector 400 to move into the port 402). A conductor 408 extends from the connector 400 through the port 406 to a load cell amplifier 410 shown in FIG. 4A secured to the plate 260. The amplifier 410 is connected to the load cell 263 and receives the wafer load cell signal 264.

Figures 2, 5A:
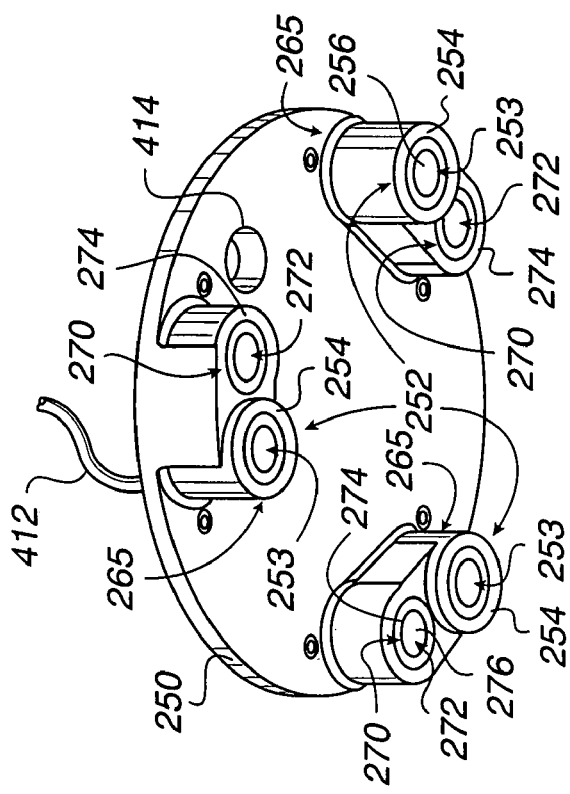
Figures 3, 5B:
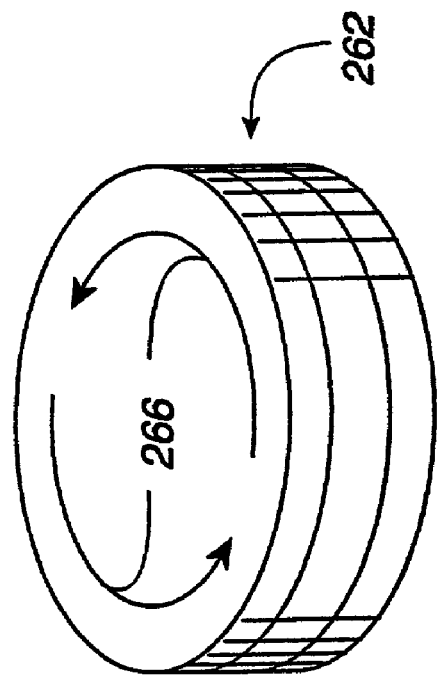
Figures 3, 5A:
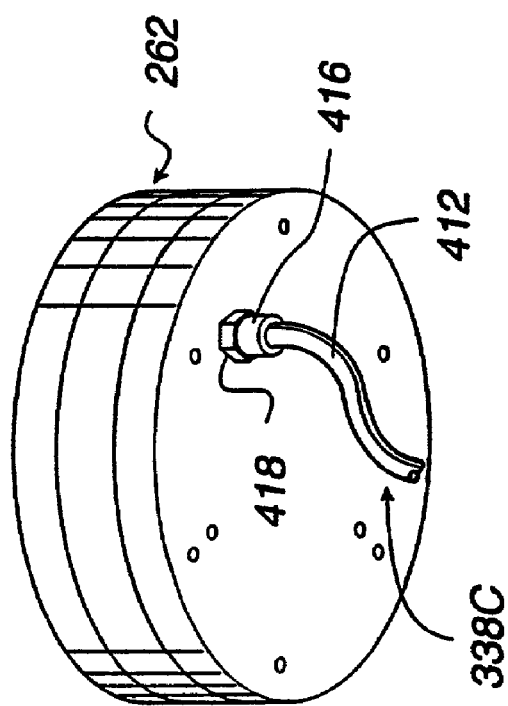
Figure 6B:
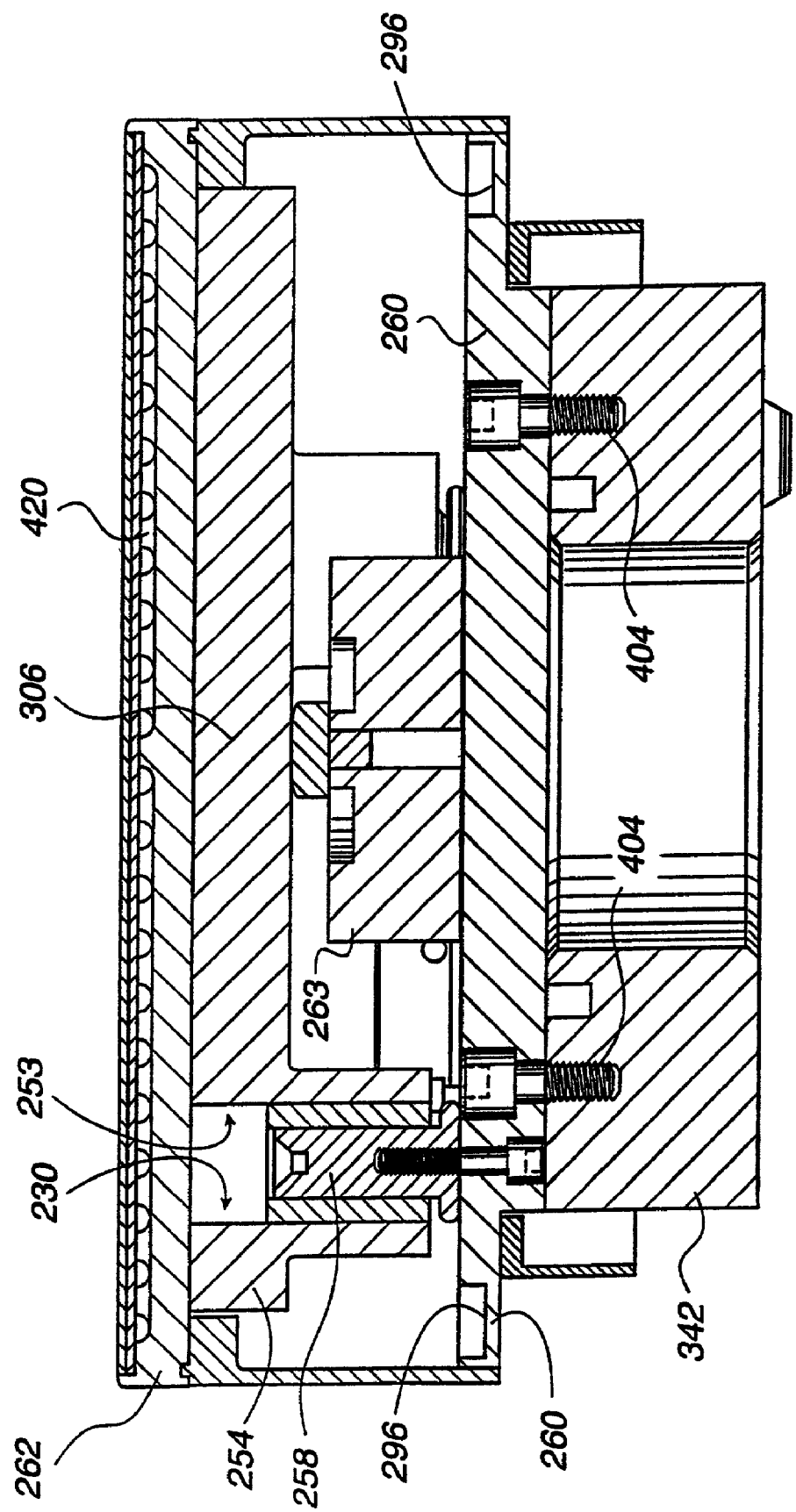
FIG. 6B is a cross sectional elevation view taken on line 6B-6B in FIG. 6A showing the main bearing housing assembled fixedly with a chuck bearing and load cell plate, showing bearing shafts of the plate in cylindrical linear bearings on the housing, and a center of the main housing pressing on a load sensor button of a load cell.

FIG. 5A-3 shows the facilities 338C in the form of tubing 412 that is connected to the nozzle 372 (FIG. 5B-1) that is mounted on the chuck bearing and load cell plate 260. The tubing 412 extends upwardly through a through-hole 414 in the main bearing housing 250 shown in FIG. 5A-2 and extends to a push-to-connect tubing connector 416 shown in FIG. 4B. The connector 416 is threaded into a port 418 drilled into the chuck 262. The port 418 supplies the vacuum or the DI water 348 to a manifold 420 (FIG. 15) of the chuck 262 to evenly distribute the vacuum or the DI water 348 across an upper surface 422 of the chuck 262.

A porous layer 297 is mounted on the upper surface 422. The layer 297 is fabricated from porous ceramic material having relatively large pores 297P (FIG. 7). The relatively large pores 297P provide passageways through which the DI water 348 flows or the vacuum 348 is applied from the manifold 420. The large pores 297P are located uniformly across the entire area of the vacuum chuck 262 and thus apply the vacuum from the manifold 420 across the entire area of the chuck 262. Similarly, the large pores 297P supply the DI water 348 all across the area of the chuck 262. Further, the large size pores 297P are not so large that the application of the vacuum 348 will deform the wafer 206 as in the prior use of relatively few (e.g., six) vacuum holes in direct contact with the wafers 206. For all of these purposes, the pores 297P may preferably have a large pore size, and more preferably a pore size in the range of from about twenty to about fifty microns, and most preferably about thirty to about forty microns, which is significantly greater than typical ceramics having pore sizes in the submicron range to one micron.

Figure 8:
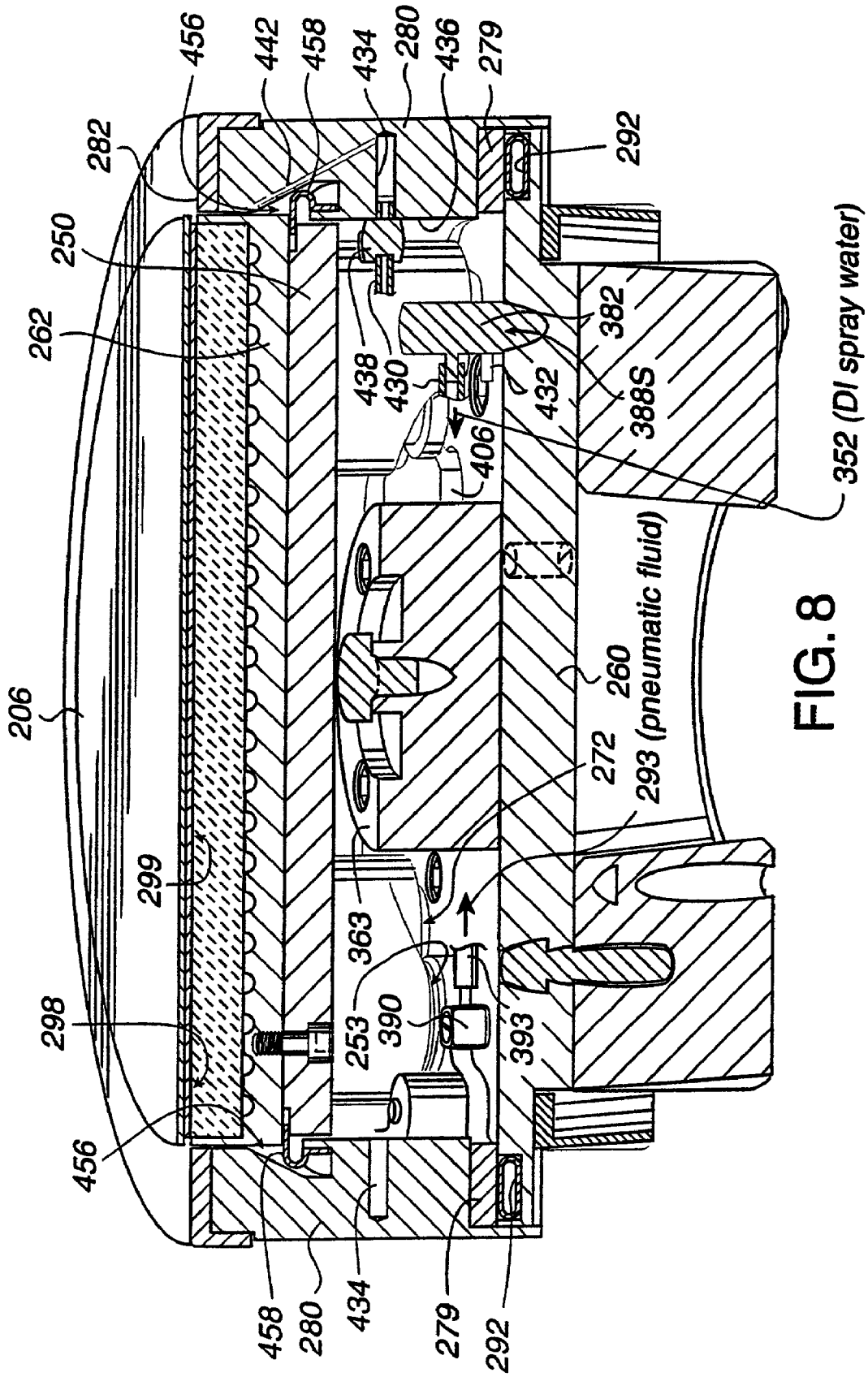
FIG. 8 is a cross section taken along line 8-8 in FIG. 6A showing facilities including various connectors that supply fluids used in the wafer polishing.

FIGS. 7 and 8 show a carrier film 298 provided on the manifold 420 and extending over an upper surface 499 of the porous layer 297 to further evenly distribute the vacuum or the DI water 348 across the area of the chuck 262. The film 298 is made from material sold under the trademark RODEL as Model Number RF 200. The film 298 is provided with cut holes or apertures having a size in a range of from 0.010 inches to 0.015 inches, for example. The layer 297 also has a porous characteristic and provides continuations of the passageways of the layer 297 through which the DI water 348 flows or the vacuum 348 is applied from the layer 297. The layer 297 and the film 298 cooperate to uniformly and finely distribute the vacuum 348 from the manifold 420 across the entire area of the chuck 262. Also, the layer 298 serves to keep particles from contacting the upper surface 422 of the vacuum chuck 262, and when washed as described below, avoids contaminating the wafers 206.

In the operation of the vacuum chuck 262, when the wafer 206 is properly mounted on the vacuum chuck 262 the axis 214 of the wafer 206 will be oriented coaxially with the axis 212 of the wafer carrier 208. To hold the wafer 206 on the carrier film298, the vacuum 348 is applied to the third port 384 and thus to the chuck manifold 420 to reduce the pressure under the carrier film 298. The reduced pressure allows ambient pressure to force the wafer 206 against the carrier film 298. In this proper mount, the wafer 206 will block all of the passageways of the carrier film 298, thus the pores 297P of the layer 297 will have a significantly reduced flow of air therein. If the wafer 206 is tipped on the film 298, or is otherwise not positioned on the film 298 in the noted coaxial orientation, the air flow into the carrier film 298 will be measurably greater as detected by a pressure detector 299D (FIG. 3C) indicating the improper orientation.

DI water 348 is fed under pressure to the port 384 and thus to the manifold 420. The DI water 348 flows from the manifold 420 into the pores 297P of the layer 297, and from the layer 297 through the carrier film 298 and under the wafer 206. The DI water 348 eliminates the pressure differential across the wafer 206, releases the wafer 206 from the chuck 262, and cleans the outer, wafer-contacting surface of the carrier film 298. Further flow of the DI. water 348 through the pores of the film 279P forces slurry 426 out of the pores 297P of the film 297 and off the film 298, cleaning the vacuum chuck 262 in preparation for polishing the next wafer 206. Such flows of the DI water 348 through the film 298 and the layer 297 avoid collection or accumulation of particles under the wafer 206 when the wafer 206 is mounted on the film298. The DI water 348 and the removed slurry 426 flow into a central containment tub (not shown). FIGS. 5B-1 and 8 show the facilities 338S for the supply of the DI water 352 from the manifold 382. Tubing 430 is provided in six lengths, one length being connected to one of six outlets 432 of the manifold 382. The manifold 382 extends upwardly through the open center of the bladder 292 and the open center of the retainer ring plate 279, such that each length of the tubing 430 is within the space between the retainer ring base 280 and the load cell 263. The retainer ring base 280 is shown in FIG. 8 having inlets 434 tapped into an inner side wall 436. Six such inlets 434 are provided at evenly spaced intervals around the inner side wall 436. The inner side wall 436 is fabricated from a hard engineering plastic, which may be an unreinforced semicrystalline thermoplastic polymer material, such as polyethylene terepthhalate sold under the trademark ERTA-LYTE PET-P by Port Plastics provide dimensionally stable inlets 434. Each inlet 434 is provided with a tubing fitting 438 that connects with one of the lengths of tubing 430.

Figure 22:
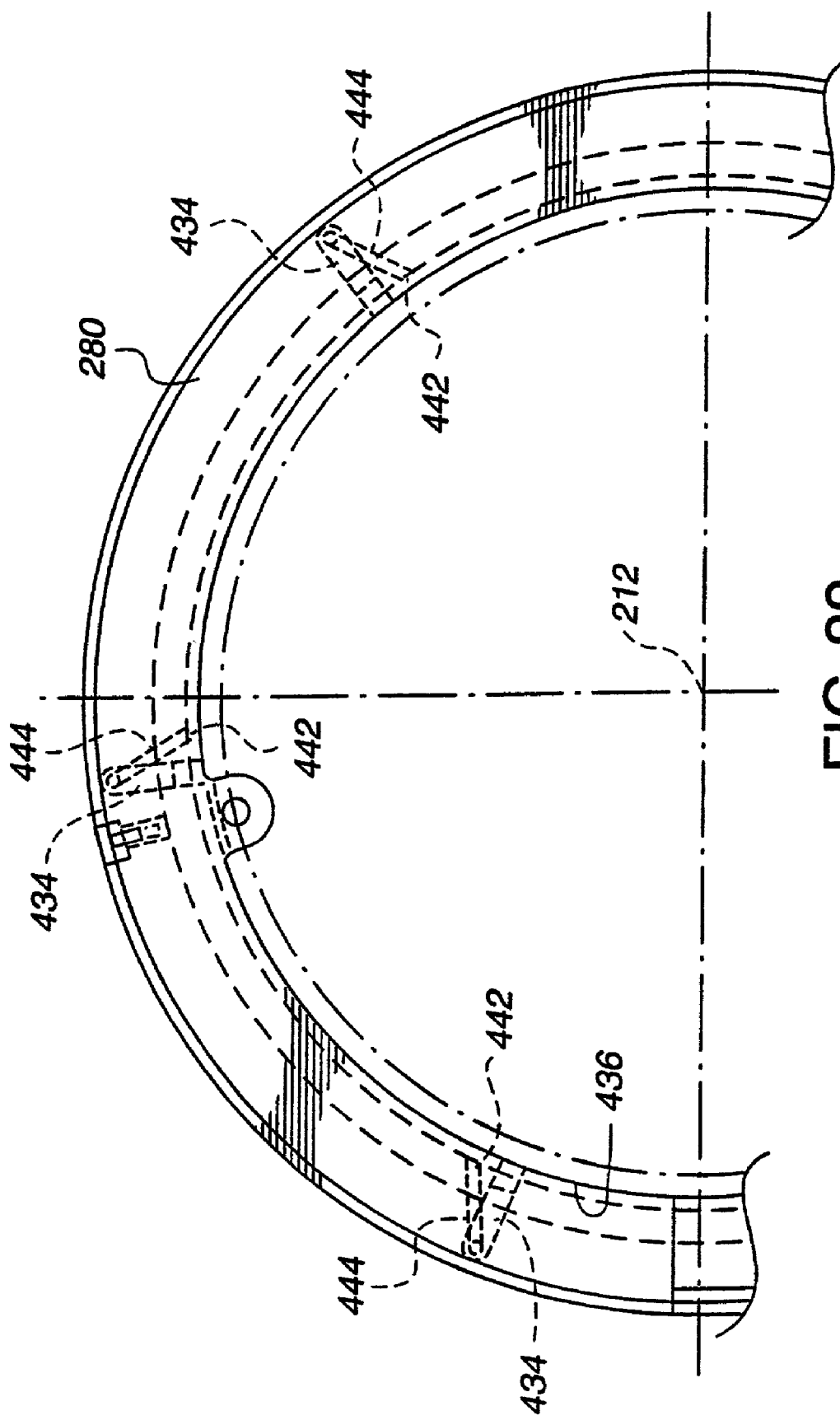
FIG. 22 is a cross sectional view of the wafer carrier taken at an angle to the plane of the exposed wafer surface in FIG. 6A, illustrating three of six DI water nozzles in the retaining ring base for supplying DI wafer wash water, showing the nozzles extending at an angle to a plane that includes the carrier axis, to direct the DI water partly in the direction of the circumference of the retaining ring.

The DI water 352 is supplied through the spindle 346 and to the manifold 382, which distributes the DI water 352 to the lengths of tubing 430 and to the fittings 438. FIGS. 14A and 14B show the general polishing position of the retainer ring 282, wherein the exposed surface 204 of the wafer 206 is coplanar, or horizontally aligned, with the top 299 of the retainer ring 282. The retainer ring base 280 is also shown separated from the vacuum chuck 262 by a space 440. As shown in FIGS. 8 and 22, each of the fittings 438 and inlets 434 is connected to a passageway 442 in the side wall 436. Each passageway 442 has an angular configuration to provide an upwardly and inwardly directed nozzle 444. FIG. 8 also shows each nozzle 444 oriented to direct the DI water352 into the space 440. FIG. 22 also shows each passageway 442 extending away from a radial direction so as to direct the DI water 352 in a circumferential (or circular) direction (see arrow 445) around the axis nozzle 444. The passageway 442 supplies the DI water 352 to the nozzle 444 which directs the DI water352 into the space 440 in the circular direction 445. In the enlarged view of FIG. 14B, the DI water (see arrow 352) from the nozzle 444 is also shown flowing against an underside (or overhang) 446 of the wafer 206 that overhangs the vacuum chuck 262. The overhang 446 may extend about 0.040 inches beyond the retainer ring base 280. Also, FIG. 14B shows (see arrow 448) a flow or seepage of the slurry 426 through a crack, or annular slit 452, between the retainer ring 282 and the wafer 206. The flow 448 allows the slurry 426 to enter the space 440.

The DI water 352 directed against the underside 446 of the wafer 206 removes the slurry 450 from the upper end of the space 440. A dam 454 blocks exit of the DI water 352 and the slurry 426 from an upper end of the space 440. The dam 454 is defined by the overhanging underside 446 of the wafer 206 and the thin dimensioning of the slit 452. As shown in FIG. 14A, an outlet 456 is machined into the side wall 438 below the dam 454 and adjacent to a seal 458. The outlet 456 is configured to provide an annular-shaped lip 460 that is opposite to a sloped entry wall 462. The lip 460 and the opposed wall 462 define an outlet cavity 464. Under the action of centrifugal force during rotation of the wafer carrier 208, the slurry 426 and the DI water 352 from the nozzles 444 is urged outwardly, into the cavity 464, and through an outlet orifice 466. The outlet orifice 466 extends through the retainer ring base 280 to the containment tub (not shown). The seal 458 is annular in shape and extends from the cavity 464, over the lip 460, across the space 440, and is tightly secured (e.g., gripped) between the main bearing housing 250 and the vacuum chuck 262. In this manner, the dam 454, the seal 458, and the related adjacent structure of the carrier 208 contain the slurry 426 and the DI water 352. The DI water 352 cleans the underside 446 of the wafer 206 and the space 440. The outlet 456 receives the slurry 426 and the DI water 352 that has been urged from the space 440 without any pumping mechanism other than the rotation of the carrier 208.

The CMP system 200-1 is not only provided with the above-described feature of making repeatable measurements of the eccentric forces FP-W, but is also provided with facilities (generally referred to using the reference number 338) for other CMP operations. The facilities 338 of the pad conditioning head 220, for example, include facilities 338PS for sensing the puck 218 on the chuck 322; facilities 338PP for purging the puck 218; and facilities 338LCP for the load cell 324. Such facilities 338 are provided for the CMP operations without interfering with the CMP operations. Considering these facilities 338 of the pad conditioning head 220, reference is made to the three dimensional exploded views of FIGS. 16A and 16B, and to the three dimensional view of FIG. 17A, and to the cross sectional view of FIGS. 19A. In the following descriptions, structural elements that are the same as or very similar to those described above are described using reference numbers three hundred more than the previous reference number.

Figure 17A:
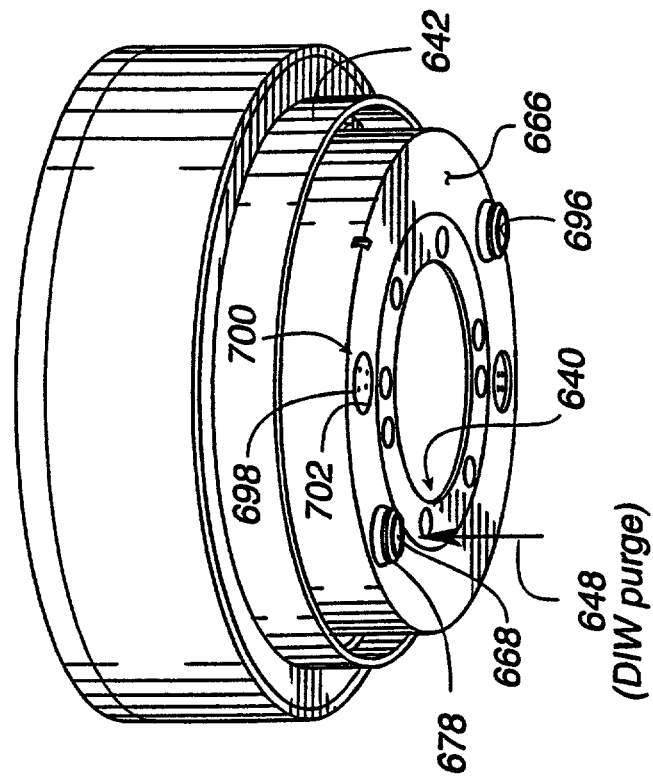
FIG. 17A is a three dimensional schematic view showing the structural elements of the puck carrier of the first embodiment, illustrating the bottom of an upper section of a rotary tool changer (RTC)
Figure 17B:
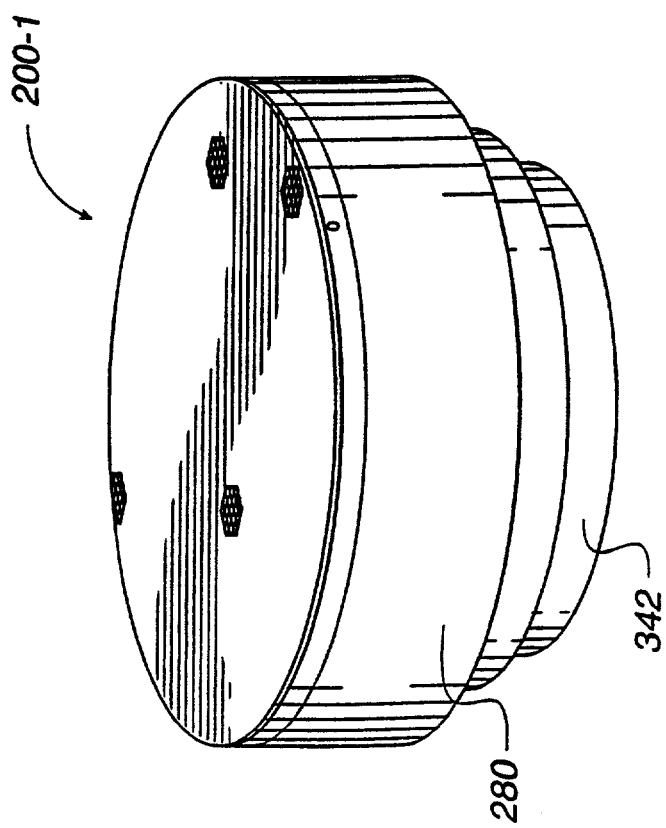
FIG. 17B is a three dimensional schematic view showing the structural elements of the puck carrier of the first embodiment, illustrating the top of the upper section of the RTC.
Figure 17C:
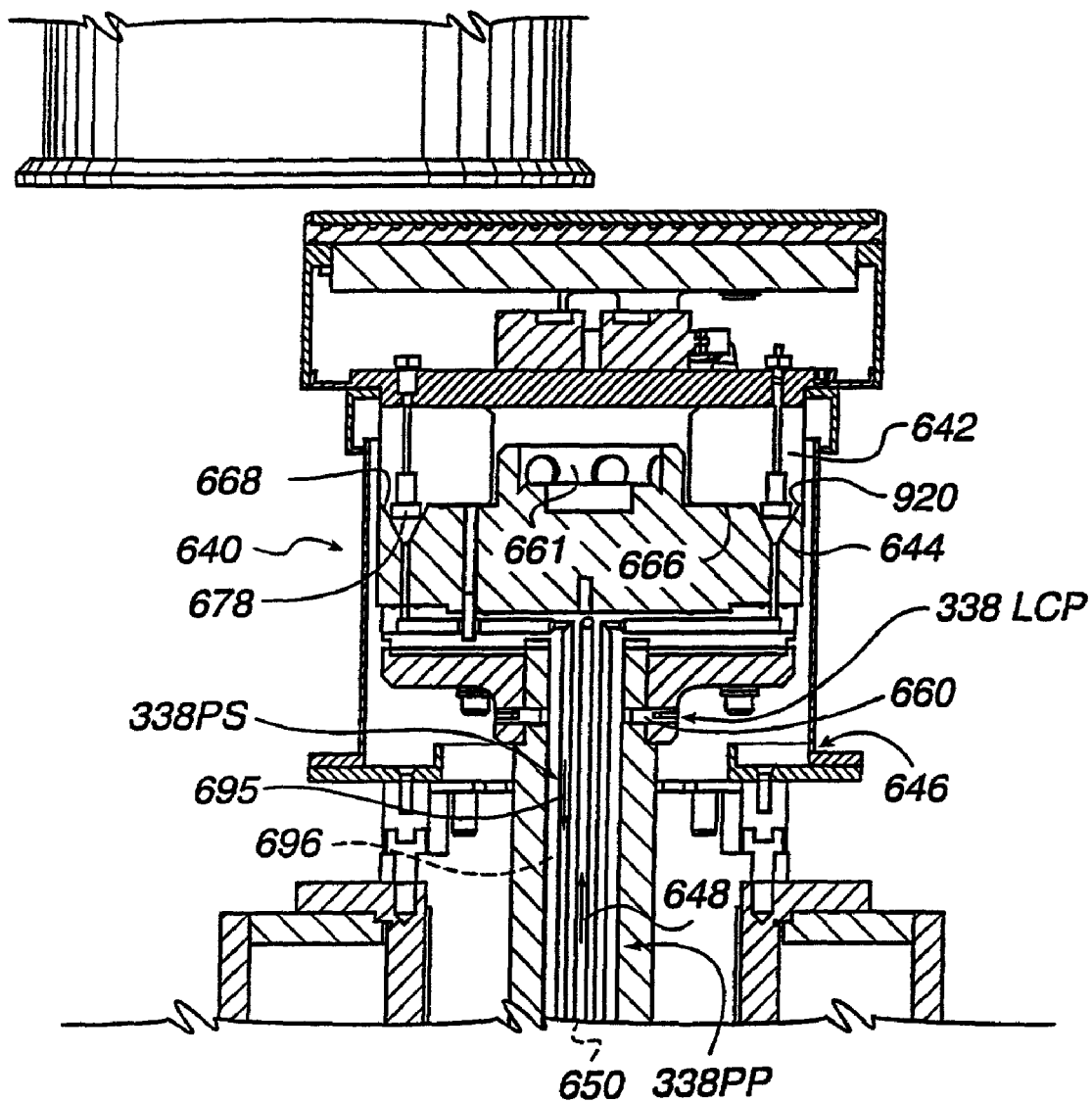
FIG. 17C is a schematic view of the wafer carrier, showing in dashed lines a spindle for supporting and supplying facilities to the carrier head, and a illustrating the polishing head.
Figure 18:
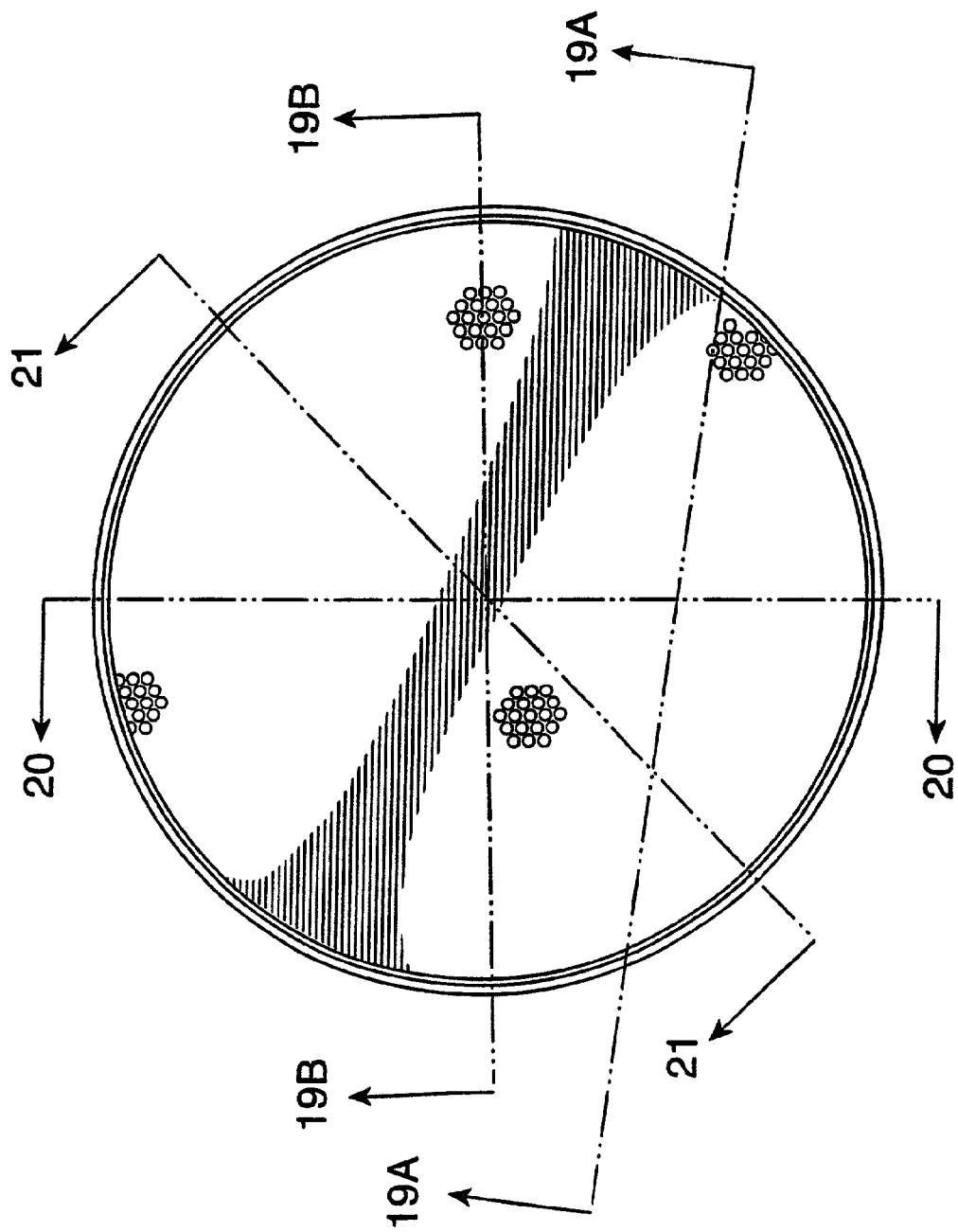
FIG. 18 is a plan view of the puck carrier, showing lines along which sections have been taken.

FIGS. 17A and 17B show assemblies of structural elements of the first embodiment 200-1, including a rotary tool changer 640 to which the puck bearing and load cell plate 308 are secured. The rotary tool changer 640 includes an upper section 642 and a lower section 644 (FIG. 17C). The lower section 644 is attached to a spindle 646 that rotates and applies vertical forces in up and down directions to the lower section 644. As shown in FIG. 17C, the spindle 646 also provides the facilities 338PP by supplying fluid, such as DI water 648, through a conduit 650 to the lower section 644 for use in the chuck 322. Additionally, the spindle 646 separately provides the facilities 338PS by applying a vacuum 695 through a conduit 696 to the lower section 644 for sensing the presence or absence of the puck 218 on the chuck 322.

The spindle 646 also provides the facilities 338LCP by providing a slip ring 660 connected to a system (not shown) for processing the amplified puck load cell signal 326 to determine the force urging the puck 218 and the polishing pad 209 together during the polishing operations. The slip ring 660 is connected through a connector (not shown) on the lower section 644 which mates with a pogo pin connector (not shown) received in a port (not shown) in the lower section 644. Referring to FIG. 17A, pogo pins extend upwardly into resiliently biased contact with electrical contacts 698 of a connector 700 provided in a port 702 of the upper section 642. The port 702 has a shoulder (not shown) against which the connector 700 is urged when the plate 308 is connected to the upper section 642, as by six screws 704. The port 702 is aligned with a port 706 shown in FIG. 16B as being provided in the plate 560. The port 706 is large enough to pass the connector 700 (to permit the connector 700 to move into the port 702). A conductor 708 extends from the connector 700 through the port 706 to a load cell amplifier 710 shown in FIG. 16B secured to the plate 560. The amplifier 710 is connected to the load cell 324 and receives the puck load cell signal 326.

The lower section 644 and upper section 642 mate in the standard manner described above, i.e., by way of a releasable connector 661 (FIG. 17C). The structure described above releasably joins the sections 642 and 644. Two pressurized air lines actuate the piston (not shown) of the connector 661 to cause the connector 661 to lock the upper section 642 to the lower section 644, or to release the two sections.

The puck is purged to remove polishing debris and other material. The puck 218 is shown in FIGS. 16A, 16B, and 19B as including two disk-like layers 902A and 902B that are adhered to each other. A first layer 902A is fabricated from carbon steel that is provided with perforations 903. The perforations 903 may be apertures having a size of about 0.150 inches, for example. The perforations 903 are uniformly spread over the entire layer 902A. The perforated carbon steel layer 902A is nickel plated. The perforated and nickel plated layer 902A is then coated with diamond material. The layer 902A is in the form of a disk having a diameter of about 9.5 inches, which conforms to the diameter of the outer portion of the retainer ring 282 and to the diameter of the second layer 902B. The second layer 902B is a magnetic disk having an adhesive backing. The layer 902B is provided with smaller perforations or openings 904. For example, the openings 904 may have a size in the range of from about 0.010 inches to about 0.015 inches. The puck 218 is mounted on the pad conditioning head 220 with the layer 902B touching the head 220 so that the diamond coated surface faces the pad 209.

The facilities 338PP for purging the puck 218 include the upper section 642. FIGS. 17A, 17C, 19B, and 20 show the bottom 666 of the upper section 642. Three ports in the upper section 642 are provided for the facilities 338. A first port 668 mates with a similar port of the lower section 644 to supply the DI water (see arrow 648) for the purging operation. The DI water 648 flows through the port 668 past an O-ring 680 to a fitting 672 shown in FIG. 20 threaded into a threaded port 674 of the plate 308. The fitting 672 is connected to a tube, or conduit, 712. The tube 712 extends upwardly from the fitting 672 through a through-hole 714 in the main bearing housing 306 (FIG. 16A) and extends to a push-to-connect tubing connector 716. The connector 716 is threaded into a port 718 drilled into the chuck 322. The port 718 is shown in FIG. 16B supplying the DI water 648 to a manifold 720 of the chuck 322 to evenly distribute the DI water 648 across an upper surface 722 of the chuck 322. The chuck 322 is provided with a lip 900 that extends above the upper surface 722. The lip 900 defines a dam that retains a pool or reservoir of the DI water 648 on the chuck 322. The DI water 648 is supplied to the chuck 322 at a preferred flow rate of about two hundred to three thousand cubic cm. per minute (ccm), and at a more preferred flow rate of about four hundred to two thousand ccm, and at a most preferred range of about 1000 ccm to 1200 ccm and flows outwardly from the manifold 720 through the perforations and openings in the puck 218, and past the puck 218 and slowly over the lip 900 forming a waterfall slowly flowing off the chuck 322. In this manner the puck 218 on the chuck 322 is immersed in the DI water 648 and the DI water flowing past the puck 218 purges, or cleans, the puck 218, thereby assisting in the desired conditioning of the polishing pad 209 by the puck 218.

Figure 21:
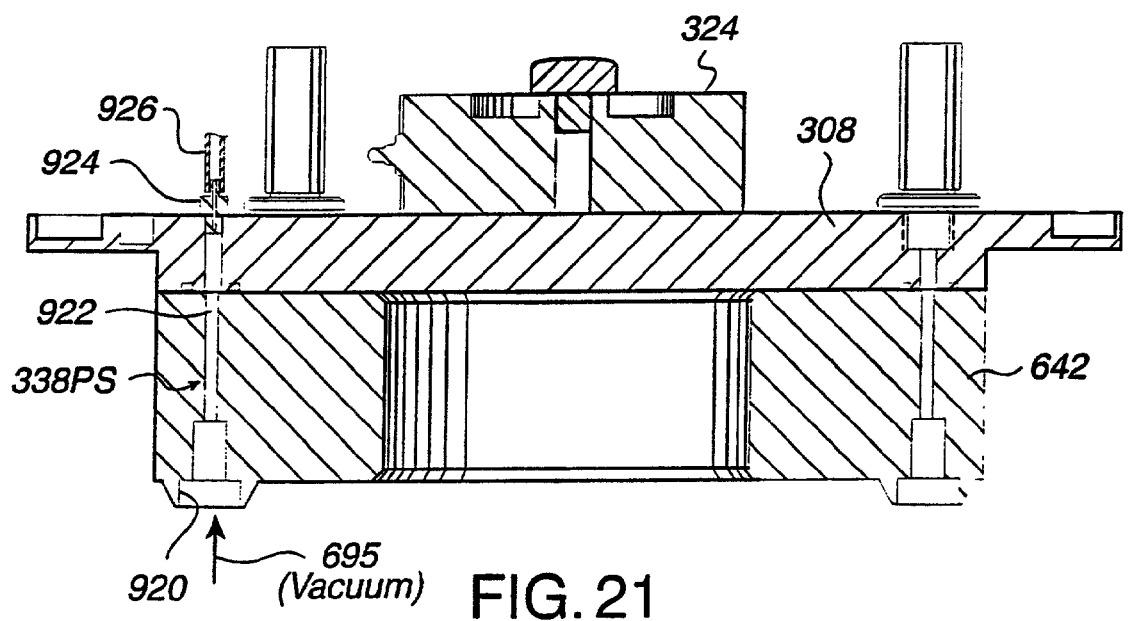
FIG. 21 is a cross section taken along lines 21-21 in FIG. 18, showing the vacuum conduit exiting a base of the puck carrier.

FIGS. 19A and 21 show the facilities 338PS configured as a port 920 to which the vacuum 695 is applied by the conduit 696. A bore 922 connects the port 920 to a nozzle 924 that is mounted on the puck bearing and load cell plate 308. Tubing 926 is connected to the nozzle 924 and extends upwardly through a through-hole 928 in the main bearing housing 306. The tubing 926 is connected to a fitting 930 secured to the housing 306. The fitting 930 applies the vacuum 695 to a bore 932 drilled into the housing 306 and aligned with a ridge 934 of the manifold 720. The bore 932 extends to the top of the ridge 934. In this manner, the presence of the puck 218 properly on the chuck 322 will block the flow of air into the bore 932, causing the pressure in the bore 932 to decrease. This decreased pressure is reflected as decreased pressure in the conduit 696. The conduit 696 is connected to a pressure sensor, such as a pressure sensor similar to the pressure sensor 299D (FIG. 3C). The pressure sensor detects the decreased pressure and determines that the puck 218 is properly on the chuck 322. If the puck 218 is only partly on the chuck 322, or is not at all on the chuck 322, the flow of air into the bore 932 will not be blocked and the pressure in the bore 932 and thus in the conduit 696 will not decrease. As a result, the pressure sensor will determine that the puck 218 is not properly on, or is not at all on, the chuck 322, such that the polishing operation should be interrupted.

Figure 23:
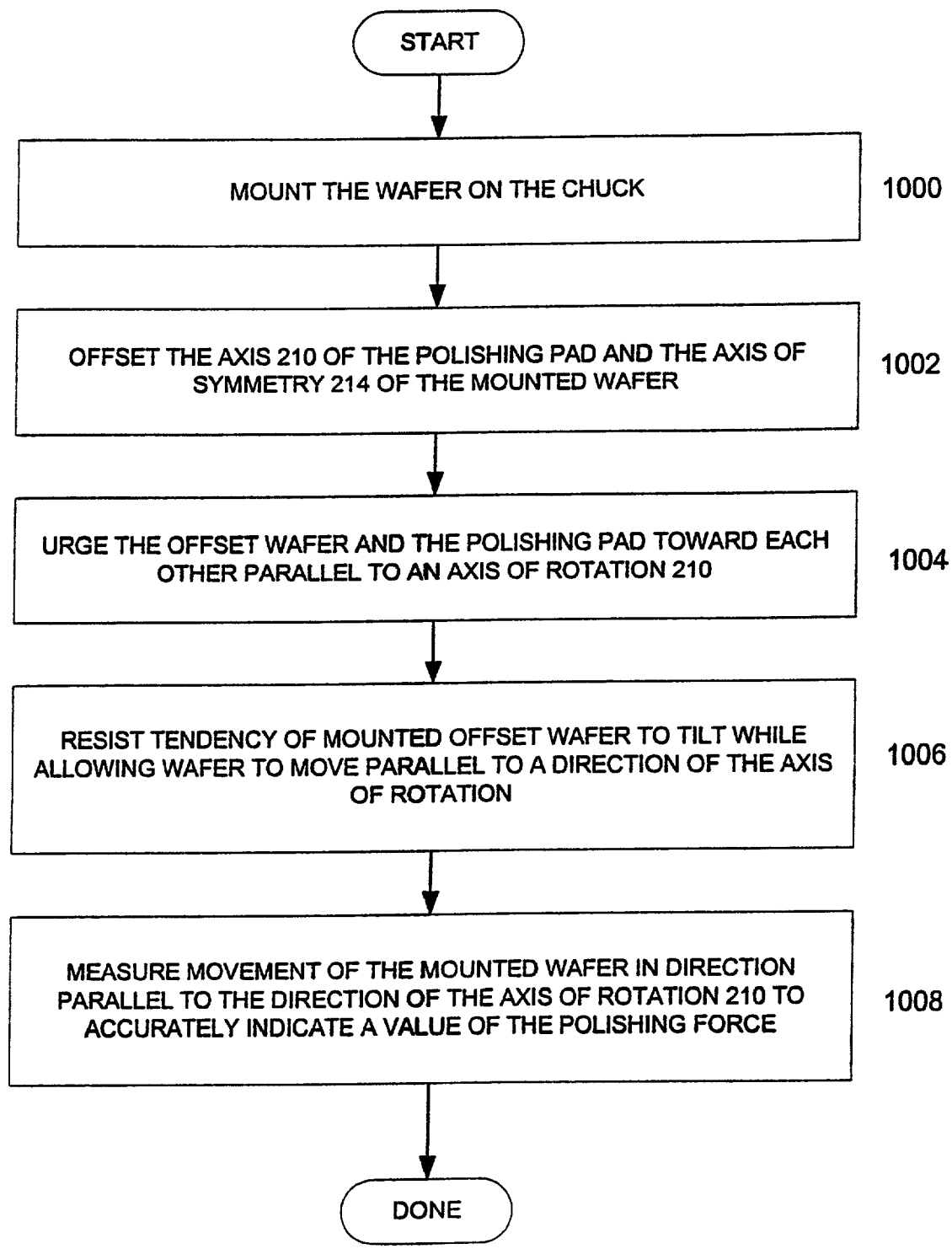
FIGS. 23 through 37 depict flow charts illustrating operations in various methods of the present invention.

Referring to FIG. 23, the present invention provides a method for controlling relative movement between the wafer 206 and the CMP polishing pad 209. The method may include an operation 1000 of mounting the wafer 206 on the chuck 262. It may be recalled that the wafer 206 has an axis 214, which may be referred to as an axis of symmetry. This mounted position is described above as the initial position of the wafer axis 214. The method moves to operation 1002 by offsetting the axis 210 of the polishing pad 209 and the axis of symmetry 214 of the mounted wafer 206, which is shown in FIG. 1B. The axis 210 is the axis on which the pad rotates. The method then moves to an operation 1004 by urging the pad 209 and the offset wafer 206 toward each other parallel to the axis of symmetry 214. With the rotary tool changer urging the wafer carrier 208 upwardly and holding the chuck 262 at a fixed position in the direction of the axis 212 of the wafer carrier 208, the urging operation 1004 causes the pad 209 to impose a polishing force, such as the force FP-W, on the contact area APW of the mounted wafer 206 eccentrically with respect to the axis of symmetry 214. In response to the polishing force FP-W, the wafer 206 has the above-described tendency to tilt such that the axis of symmetry 214 tends to move out of parallel with the axis 210, which is the axis of rotation of the pad 209. During the urging, the method moves to an operation 1006 by resisting the tendency of the mounted offset wafer 206 to tilt while allowing the wafer 206 to move parallel to the direction of the axis of rotation 210, and along the initial position of the wafer axis 214. The movement along the initial position of the wafer axis 214 is in response to the force FP-WV in FIG. 2A, for example, and reflects the operation of the linear bearings 232 in response to the eccentric force FP-W. The method may also move to an operation 1008, which during the urging operation and the resisting operation, is performed by measuring the movement of the wafer 206 parallel to the direction of the axis of rotation 210 to indicate a value of the polishing force, i.e., the force FP-W. The operations shown in FIG. 23 are then done.

Figure 24:
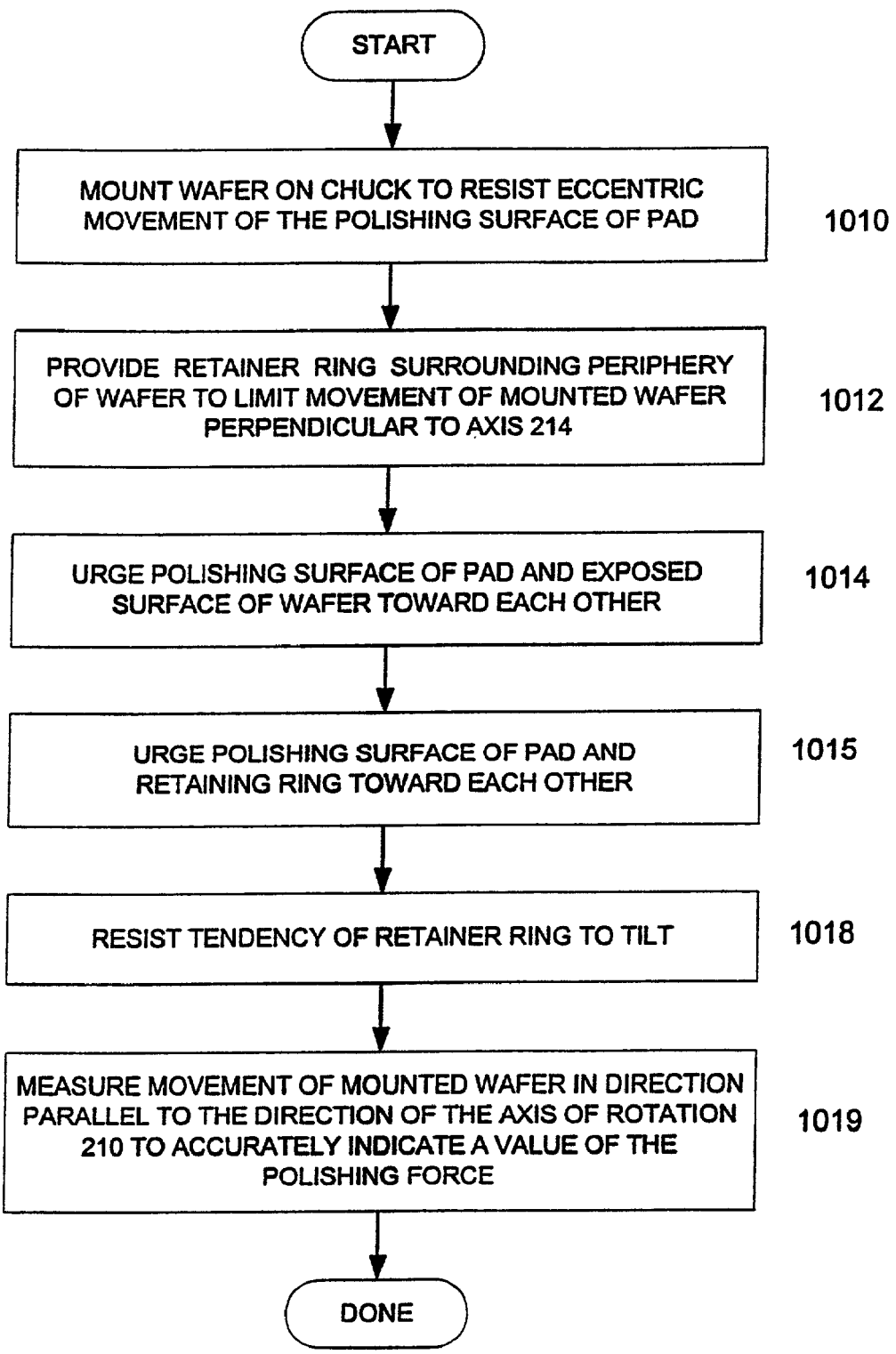

Referring to FIG. 24, another aspect of the present invention provides a method for mounting the wafer 206 for a polishing operation performed by the pad 209 having a polishing surface. From the start, the method may include an operation 1010 of mounting the wafer 206 on the chuck 262 to resist movement of the polishing surface of the pad 209 which FIG. 1B shows is applied eccentrically with respect to the axis of symmetry 214 of the wafer 206. The wafer 206 is shown in FIG. 14B as having the edge, or periphery, 301 symmetric with the axis of symmetry 214. The axis 214 is normally perpendicular to the exposed surface of the pad 209. The method moves to operation 1012 by providing the retainer ring 282 having a first position (FIG. 12A) surrounding the periphery 301 of the wafer 206 to limit movement of the wafer 206 perpendicular to the axis 214. The method moves to operation 1014 by urging the exposed surface of the pad 209 and the wafer 206 toward each other so that the pad 209 exerts on the contact area APW the polishing force FP-W tending to tilt the wafer 206 and the axis of symmetry 214 into respective positions out of perpendicularity with respect to the polishing surface. The method moves to operation 1015 by urging the exposed surface of the pad 209 and the retaining ring 282 toward each other so that the pad 209 exerts the polishing force FP-W on the contact area APRR tending to tilt the retaining ring 282 and the axis of symmetry 288 into respective positions out of perpendicularity with respect to the polishing surface of the pad 209. The method moves to operation 1018 by the action of the linear bearings 253 resisting the tendency of the retainer ring 282 to tilt. Such resisting limits the movement of the retainer ring 218 to movement perpendicular to the exposed surface of the pad 209. As described above, in this manner the permitted movement of the retainer ring 282 in response to the force FP-R (i.e., movement parallel to the initial position of the axis 212 and 214) is in the same direction as the permitted movement of the chuck 262 and the wafer 206 on the chuck 262 in response to the force FP-W (i.e., the direction parallel to the initial position of the axis 212 and 214). Further, the resisting in this manner facilitates making repeatable measurements of the eccentric forces FP-W. Thus, the resisting in operation 1018 of the force FP-W applied to the wafer carrier 208 assists in accurately measuring the force FP-W, as defined above, even though the force FP-R is eccentrically applied to the retainer ring 282. The method may also move to an operation 1019 which, during the urging operations 1014 and 1015 and the resisting operation 1018, is performed by measuring the movement of the wafer 206 parallel to the direction of the axis of rotation 210. As defined above, this measuring provides an accurate indication of a value of the polishing force, i.e., the force FP-W. The operations shown in FIG. 24 are then done.

Figure 25:
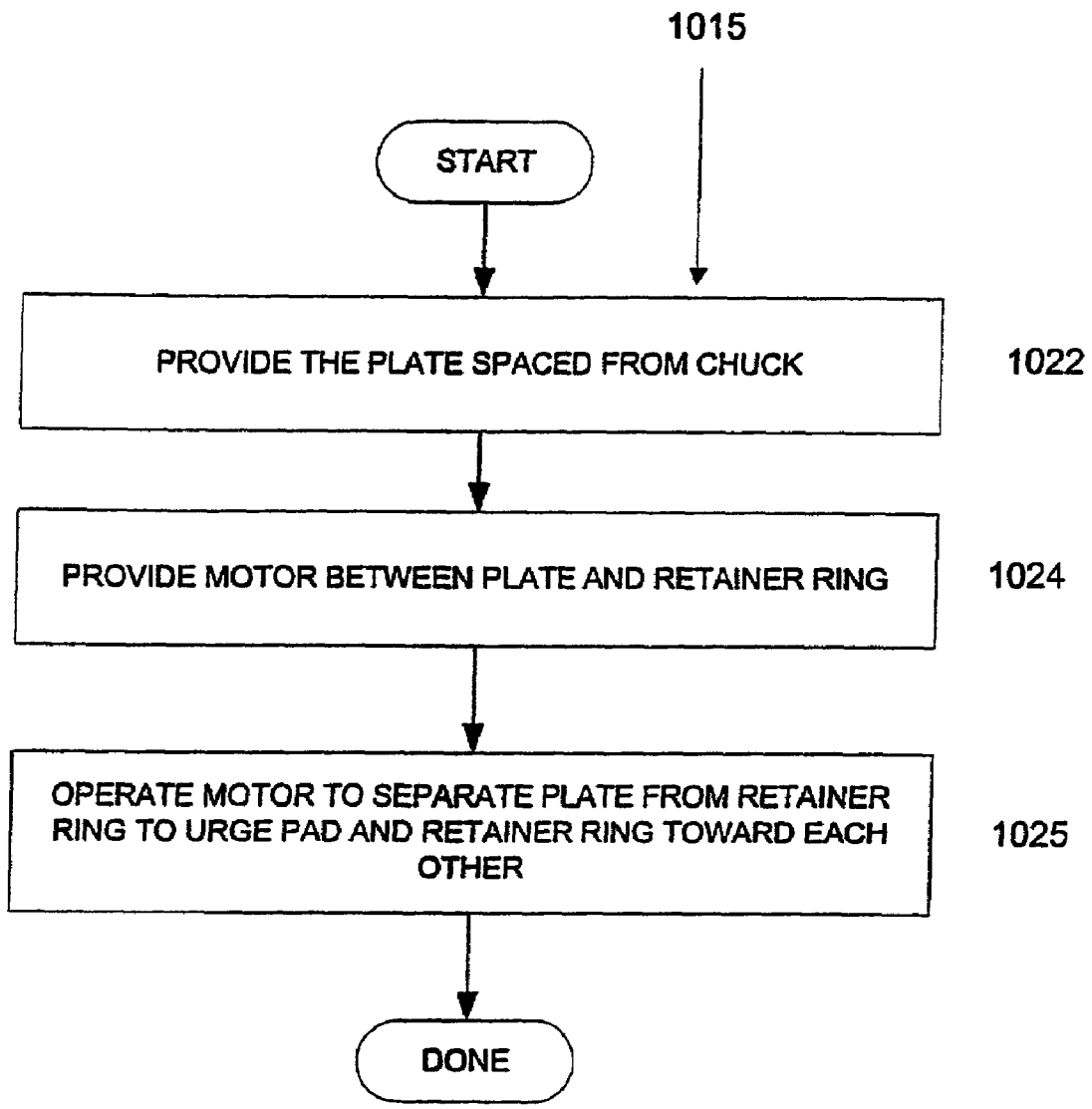

As shown in FIG. 25, operation 1015 may include a suboperation 1022 of providing the plate 260 spaced from the chuck 262. Operation 1015 may also include a suboperation 1024 of providing the bladder 292 between the plate 260 and the retainer ring 282. Operation 1015 may also include a further suboperation 1025 of operating the bladder 292, such as by inflating the bladder 292 with fluid at a first pressure. Such inflation moves the retainer ring 282 and the pad 209 toward each other.

Figure 26:
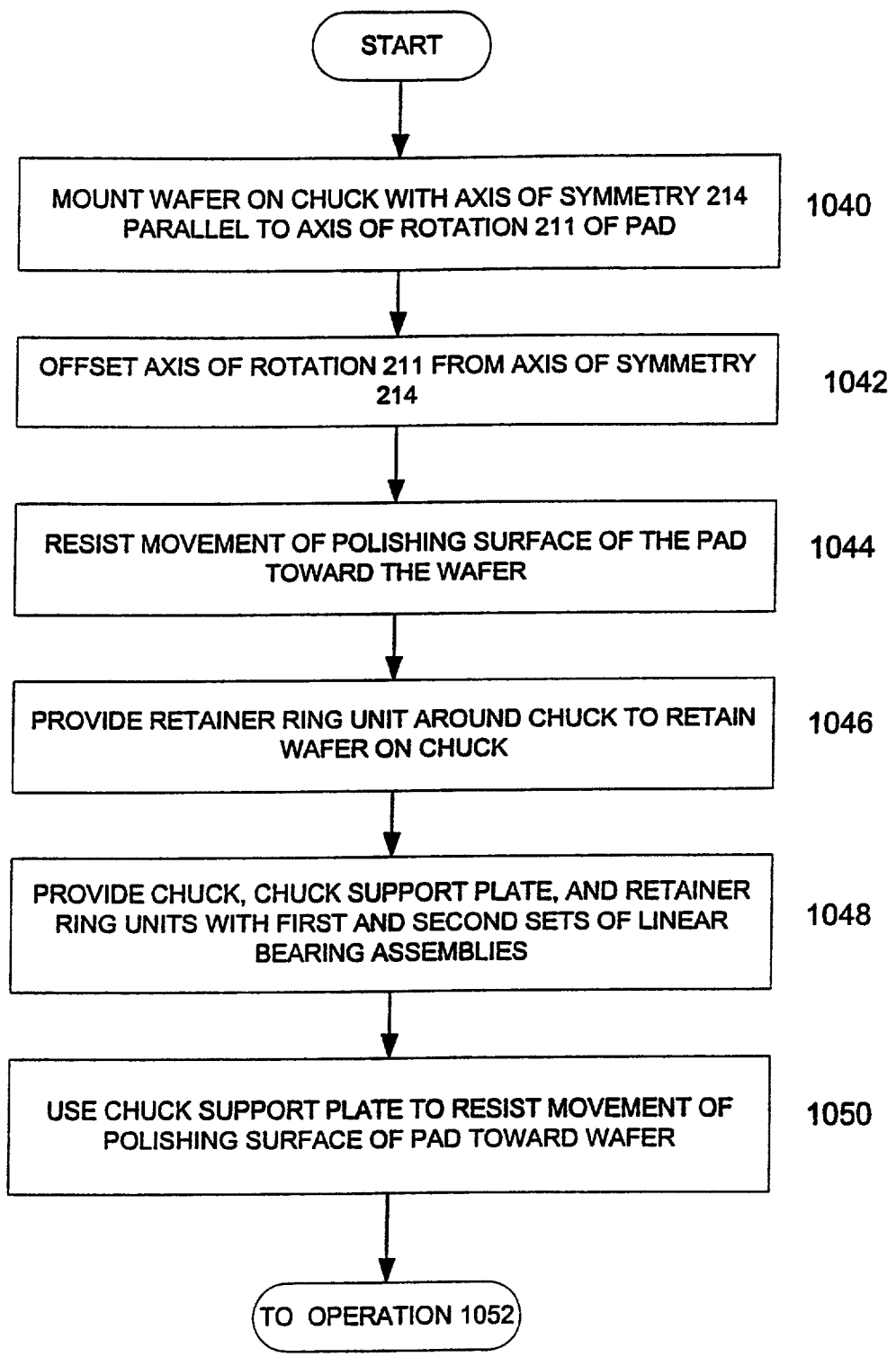
Figure 27:
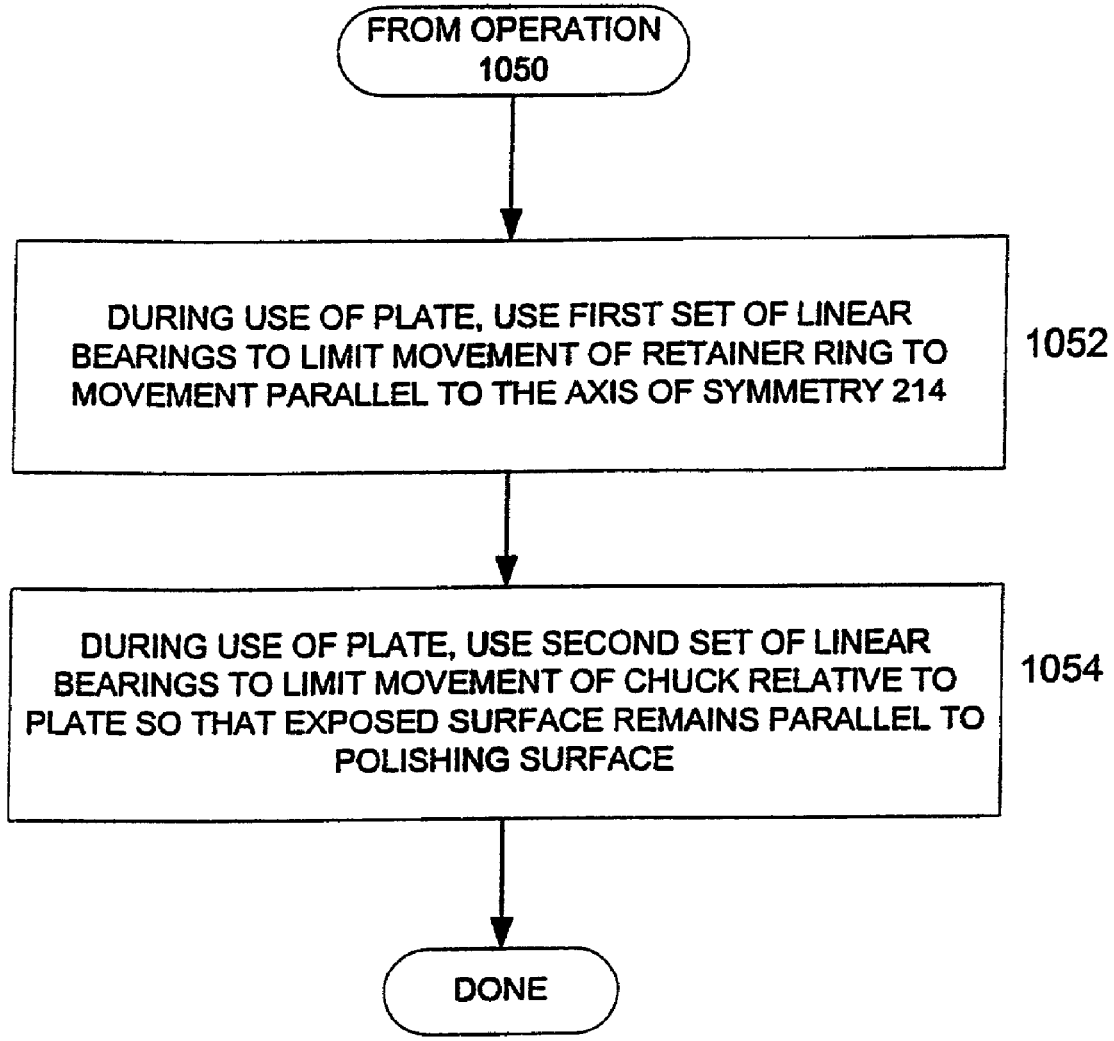

Referring to FIG. 26, another aspect of the present invention provides a method for controlling relative movement between the wafer 206 and a chemical machining pad 209. The method may include an operation 1040 of mounting the wafer 206 on the chuck 262, the wafer 206 having the axis of symmetry 214 perpendicular to a polishing surface of the pad 209 and coaxial with the carrier axis 212, and parallel to the axis of rotation 211 of the pad 209. The method moves to operation 1042 by offsetting the axis of rotation 211 of the pad 209 from the axis of symmetry 214 of the mounted wafer 206. The method moves to operation 1044 by resisting movement of the polishing surface of the pad 209 toward the wafer 206. The chuck support plate 260 is provided for this purpose. The chuck 262 is movable relative to the chuck support plate 260. The method moves to operation 1046 by providing the retainer ring unit (e.g., ring 282 and base 280) around the chuck 262 for movement to retain the wafer 206 on the chuck 262 (e.g., assist in placing the wafer 206 on the chuck 262, FIG. 12B). The retainer ring 282 may also expose the wafer 206 to the surface of the pad 209 for polishing (FIG. 14A). The method moves to operation 1048 by providing the chuck 262, the chuck support plate 260, and the retainer ring units (280 and 282) with a plurality of pairs of linear bearing assemblies 230 and 232, each of the assemblies having a housing 254 or 274 provided with a bearing axis perpendicular to the polishing surface of the pad 209. Each of the assemblies has the linear shaft 258 or 278 received in a respective one of the housings 254 or 274. The first set 252 of the assemblies is between the chuck 262 and the retainer ring units (280 and 282), and the second set 270 of the assemblies is between the chuck 262 and the chuck support plate 260. The method moves to operation 1050 by holding the chuck support plate 260 at a fixed position along the axis 212 to resist the movement of the polishing surface of the pad 209 toward the wafer 206. Alternatively, the plate 260 may be urged toward the pad 209. On either case, the pad 209 imposes the polishing force FP-W on the mounted wafer 206 and the force FP-R on the retainer ring 282, each force being eccentric with respect to the axis of symmetry 214. In response to the polishing force FP-W the wafer 206 and the chuck 262 have the tendency to tilt such that the axis of symmetry 214 tends to move out of parallel with the axis of rotation 210. Referring to FIG. 27, during the holding operation 1050 an operation 1052 is performed by which the first set 252 of the assemblies is effective to limit the movement of the retainer ring 282 to movement parallel to the axis of symmetry 214.

During the holding of the chuck support plate 260, for example, operation 1054 is performed by which the second set 270 of the assemblies is effective to limit movement of the chuck 262 relative to the chuck support plate 260 to movement parallel to the axis of symmetry 214.

Figure 28:
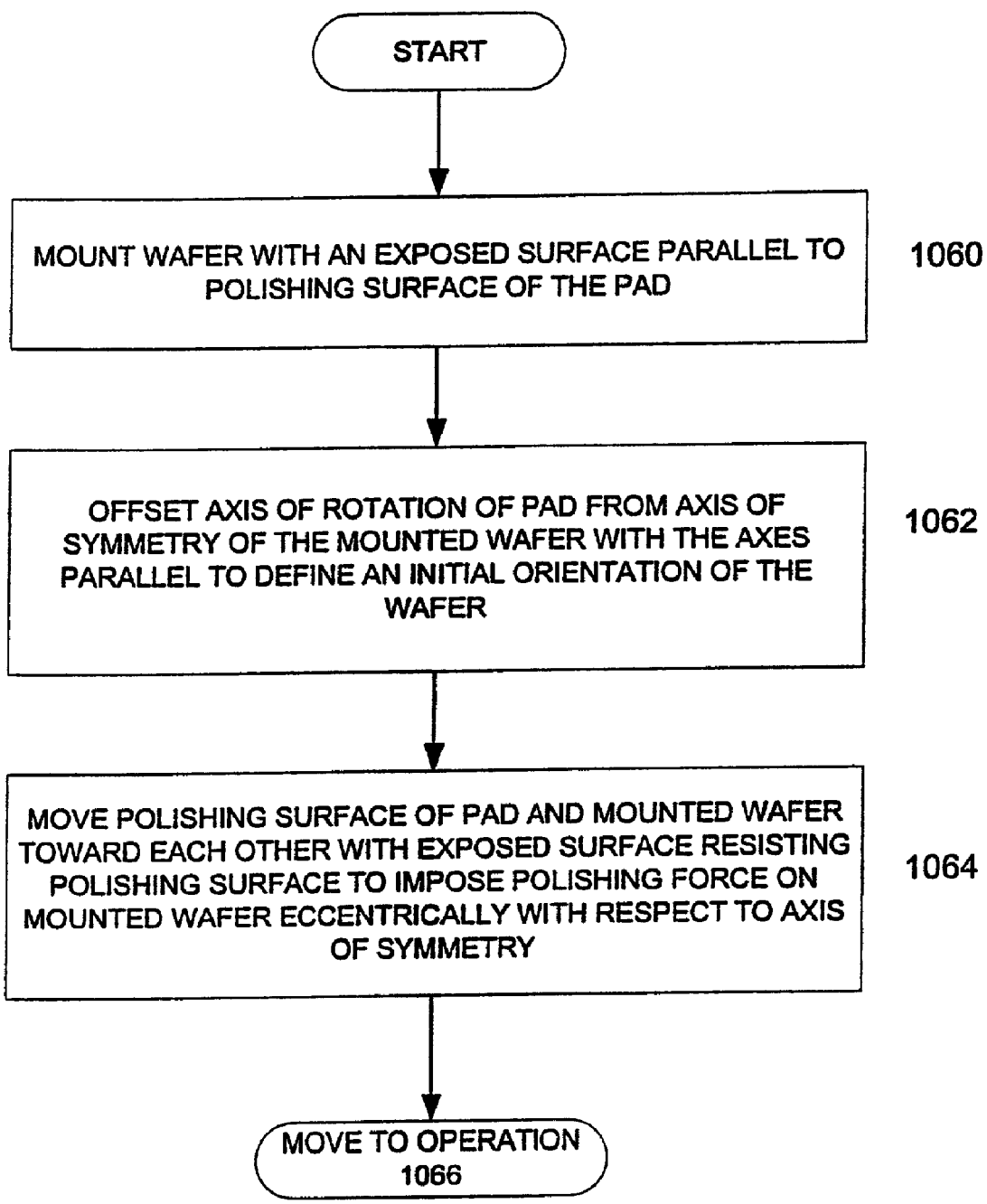
Figure 29:
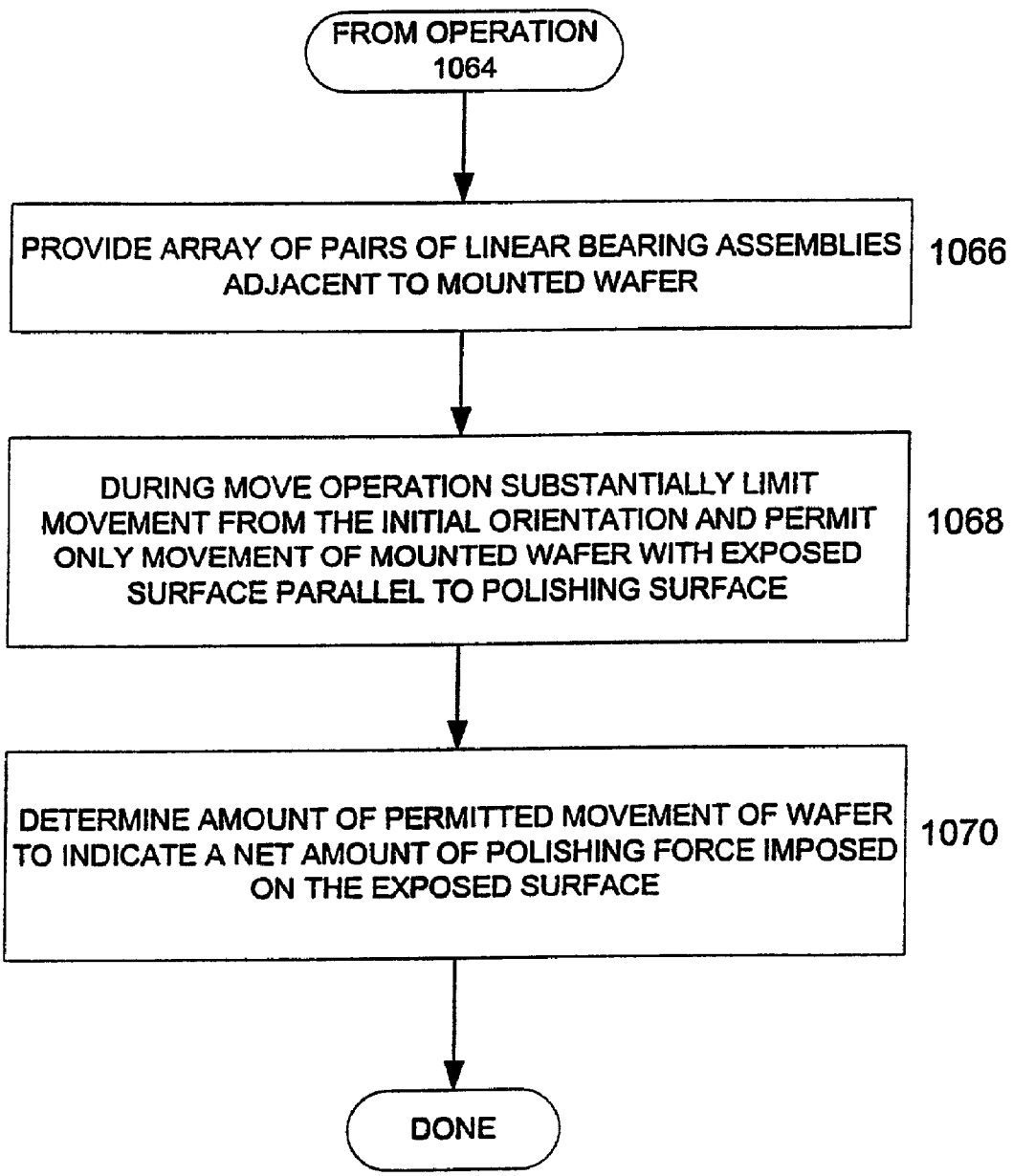

Referring to FIG. 28, the present invention provides a method for controlling relative movement between the wafer 206 and the CMP polishing pad 209. The method may include an operation 1060 of mounting the wafer 206 on the chuck 262 with an exposed surface 204 parallel to the polishing surface of the pad 209. The method moves to operation 1062 by offsetting the axis of rotation 210 of the polishing pad 209 from the axis of symmetry 214 of the mounted wafer 206 with the axes parallel to define an initial orientation of the wafer 206. The method then moves to an operation 1064 by moving the polishing surface of the pad 209 and the mounted offset wafer 206 toward each other with the exposed surface 204 resisting the polishing surface so that the force FP-W is imposed on the mounted wafer 206 eccentrically with respect to the axis 214. Referring to FIG. 29, an operation 1066 provides the array 265 of linear bearing assemblies 253, for example, adjacent to the mounted wafer 206. During the moving of operation 1064, the method moves to an operation 1068 by substantially limiting movement from the initial orientation of the wafer 206 and permitting only movement of the mounted wafer 206 with the exposed surface 204 parallel to the direction of the polishing surface of the pad 209. The method also moves to an operation 1070, which during the urging operation and the resisting operation, is performed by measuring the amount of the permitted movement of the wafer 206 with the exposed surface 204 parallel to the direction of the polishing surface of the pad 209. This indicates a value of a net amount of the polishing force imposed on the exposed surface 204.

Figure 30:
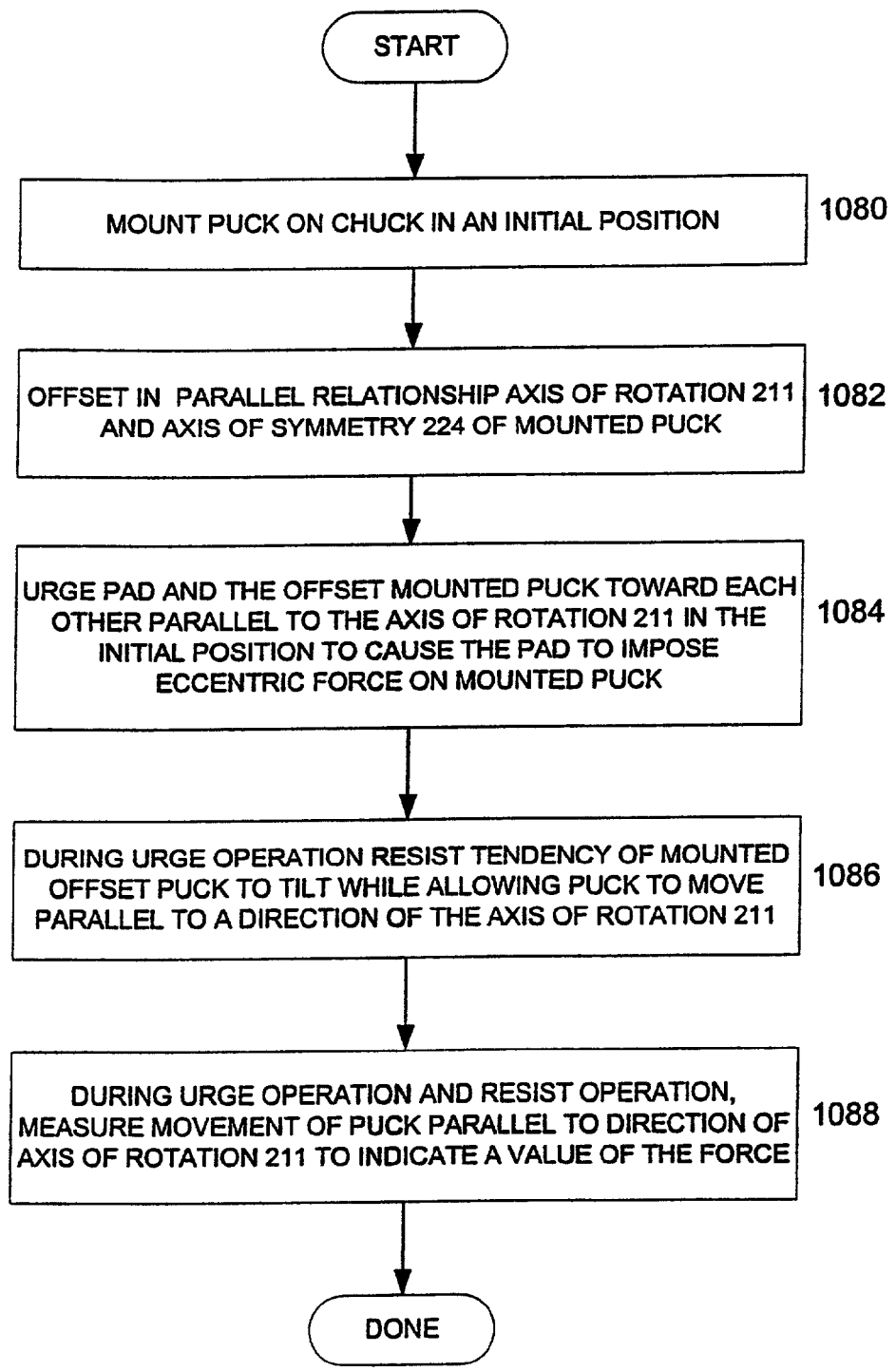

The present invention also provides a method for controlling relative movement between the pad conditioning puck 218 and the pad 209 Referring to FIG. 30, the method may include an operation 1080 of mounting the puck 218 on the chuck 322, the puck 218 having an axis of symmetry 224 (in an initial position). The method moves to operation 1082 by offsetting the axis of rotation 211 of the pad 209 and the axis of symmetry 224 of the mounted puck 218 in parallel relationship. The method moves to operation 1084 by urging the pad 209 toward the offset puck 218 parallel to the axis of rotation 210 (in the initial position) to cause the pad 209 to impose the conditioning force FP-C on the area APC of the mounted puck 218 eccentrically with respect to the axis of symmetry 224. In response to the conditioning force FP-C the puck 218 has a tendency to tilt such that the axis of symmetry 224 tends to move out of parallel with the axis of rotation 211. The method moves to operation 1086 during the urging operation 1084 by resisting the tendency of the mounted offset puck 218 to tilt while allowing the puck 218 to move parallel to a direction of the axis of rotation 211. The method may also include an operation 1088 performed during the urging operation 1084 and the resisting operation 1086, by measuring the movement of the puck 218 parallel to the direction of the axis of rotation 211 to indicate a value of the conditioning force FP-CV. Such indication may, according to the present invention, be an accurate indication as defined herein.

Figure 31:
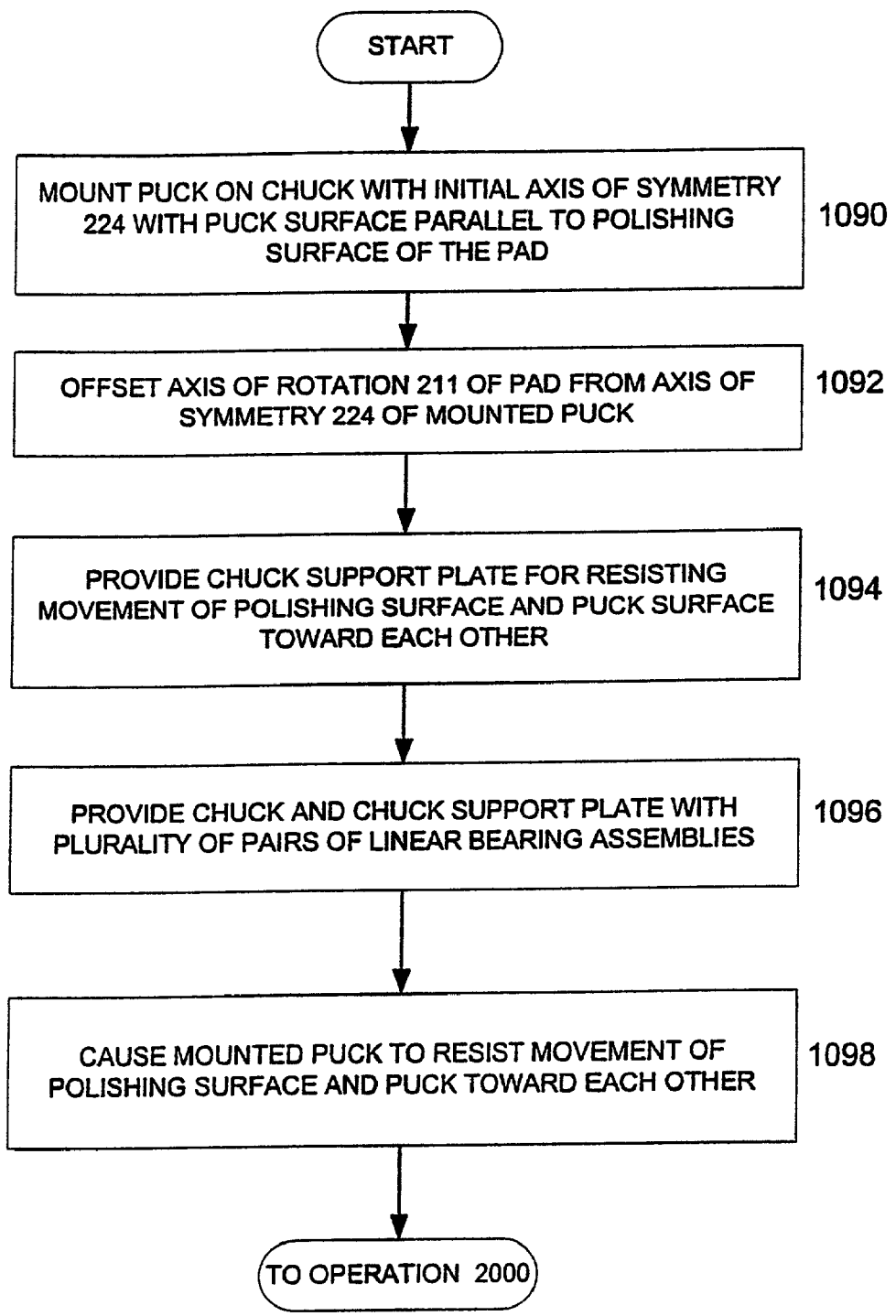
Figure 32:
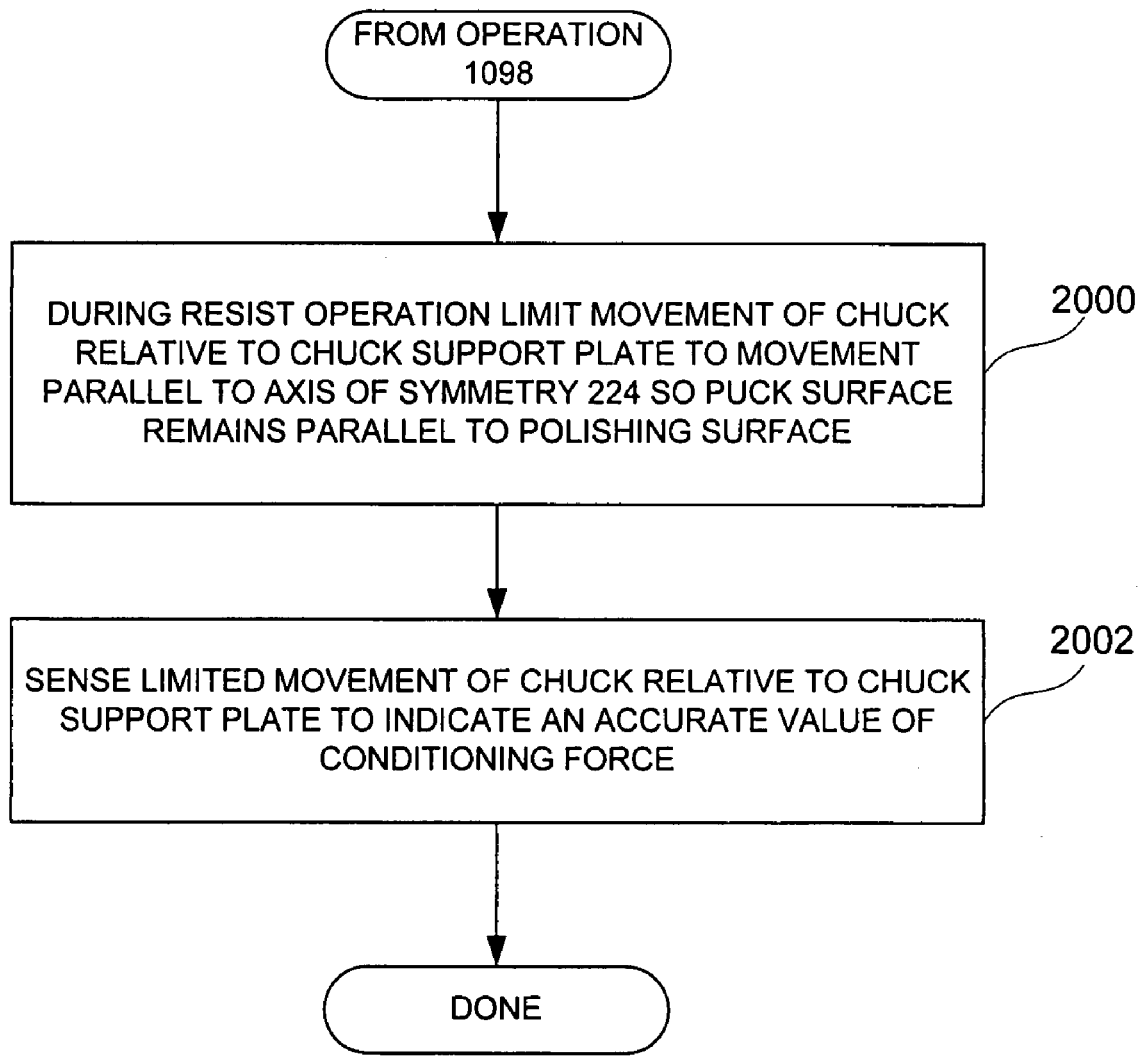

Referring to FIG. 31, the present invention also provides a method for controlling relative movement between the chemical machining pad 209 and the pad conditioning puck 218. The method may include an operation 1090 of mounting the puck 218 on the chuck 322, the puck 218 having the initial axis of symmetry 224 and a puck surface parallel to the polishing surface of the pad 209. The pad 209 has the axis of rotation 211. The method moves to operation 1092 by offsetting the axis of rotation 211 of the pad 209 from the axis of symmetry 224 of the mounted puck 218. The method moves to operation 1094 by providing the chuck support plate 308 for resisting movement of the polishing surface of the pad 209 toward the puck 218, the chuck 322 being movable relative to the chuck support plate 308. The method moves to operation 1096 by providing the chuck 322 and the chuck support plate 308 with a plurality of pairs of linear bearing assemblies 304. Each of the assemblies 304 has a housing 316 provided with a bearing axis perpendicular to the polishing surface of the pad 209. Each of the assemblies 304 has a linear shaft 320 received in a respective one of the housings 316. The assemblies 304 are between the chuck 322 and the chuck support plate 308. The method moves to operation 1098 by holding the chuck support plate 308 at a fixed position to resist the movement of the polishing surface of the pad 209 toward the puck 218. The pad 209 imposes the conditioning force FP-W on the area APC of the mounted puck 218 eccentrically with respect to the axis of symmetry 224. In response to the conditioning force FP-C, the chuck 322 and the puck 209 on the chuck 322 have a tendency to tilt such that the axis of symmetry 224 tends to move out of parallel with the axis of rotation 211. During the holding of the chuck support plate 308 at the fixed position the method moves to an operation 1098 in which the assemblies 304 are effective to cause the mounted puck 218 to resist movement of the polishing surface of the pad 209 and the puck 218 towards each other. Referring to FIG. 32, the method moves to an operation 2000 to limit movement of the chuck 322 relative to the chuck support plate 308 to movement parallel to the initial position of the axis of symmetry 224. In this manner the puck surface remains parallel to the polishing surface. The method may move to operation 2002 by sensing the limited movement of the chuck 322 relative to the chuck support plate 308 to indicate an accurate value of the conditioning force FP-CV.

Figure 33:
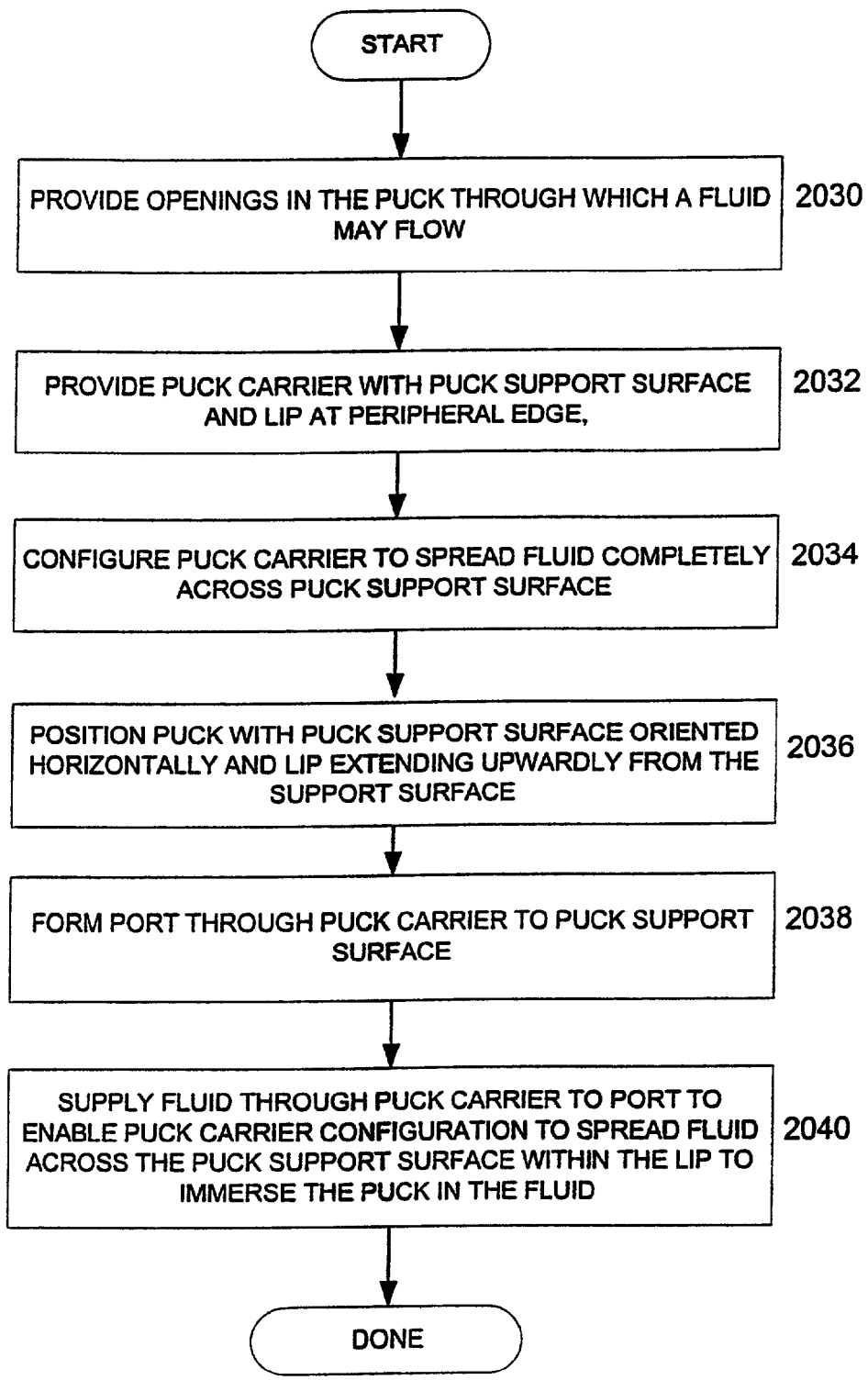

Referring to FIG. 33, another aspect of the method of the present invention relates to a method of purging the puck 218 for conditioning the chemical mechanical polishing pad 209. The method starts by an operation 2030 of providing the openings 903 and 904 in the puck 218 through which the fluid 648 may flow. The method moves to an operation 2032 in which the puck carrier 220 is provided with an upper surface and the lip 900 at the peripheral edge of the puck 218. The method moves to operation 2034 in which the puck carrier is configured conforming to the configuration of the manifold 420 of the chuck 262 to spread the fluid 648 completely across the surface of the puck support carrier 220. The method moves to operation 2036 in which the puck 218 is positioned with the puck support surface oriented horizontally and the lip 900 extending upwardly from the support surface. The method moves to operation 2038 in which the port 920 and ducts 926 are formed through plate 308 and section 642 of the puck carrier 220 to the puck support surface on which the puck 218 is to be placed. The method moves to operation 2040 in which the fluid DI water 648 is supplied through the puck carrier 220 to the port 932 to enable the configuration of the puck carrier 220 (i.e., a manifold) to spread the DI water 648 across the puck support surface within the lip 900 to immerse the puck 218 in the DI water 648 in the reservoir. The supply is such as to make the DI water 648 flow outwardly from the manifold 720 through the perforations 903 and openings 904 in the puck 218, past the puck 218 and slowly over the lip 900 forming a waterfall slowly flowing off the chuck 322. In this manner the puck 218 on the chuck 322 is immersed in the DI water 648 and the DI water 648 flowing past the puck 218 purges, or cleans, the puck 218, thereby assisting in the desired conditioning of the polishing pad 209 by the puck 218.

Figure 34:
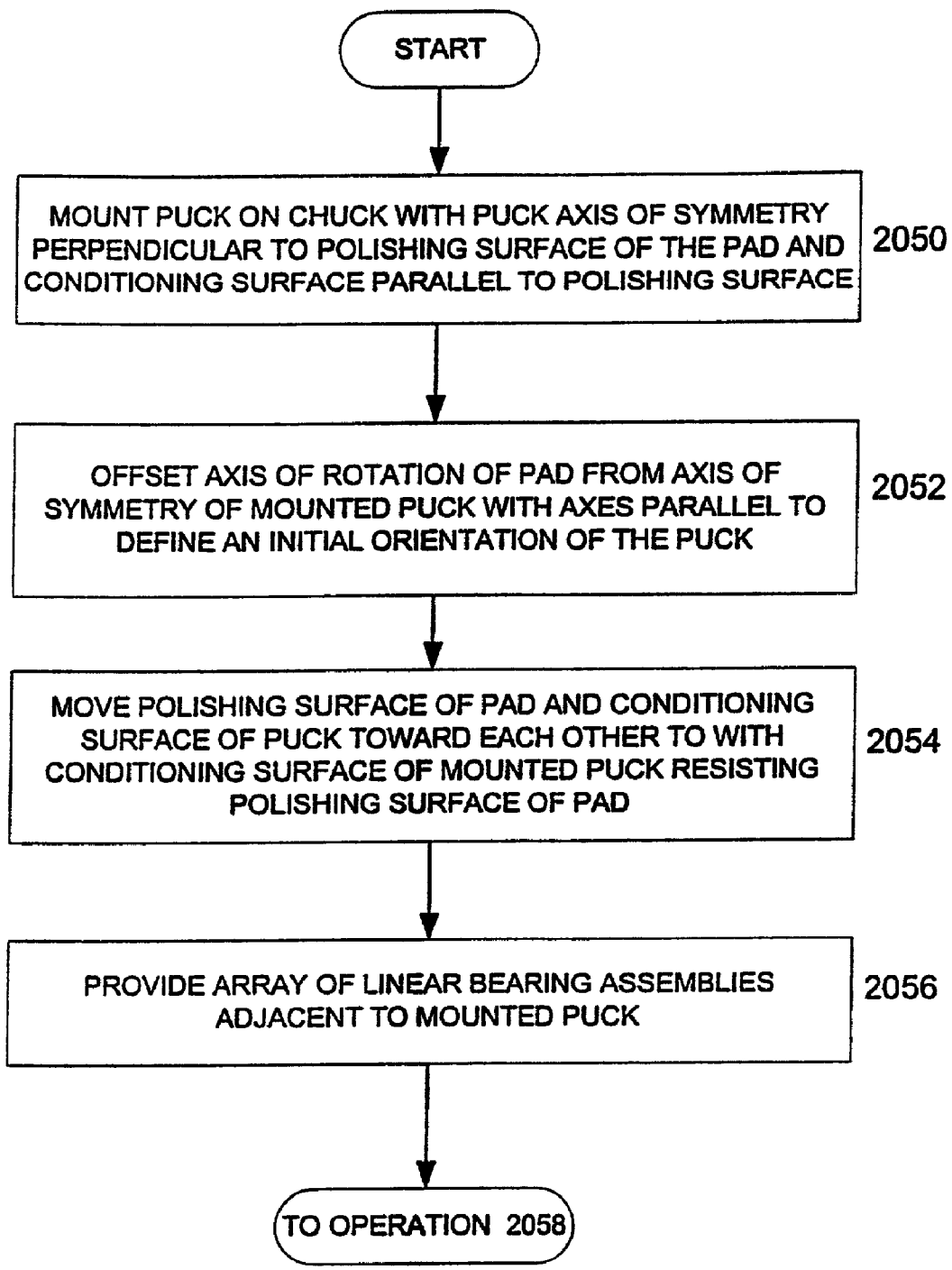

Referring to FIG. 34, another aspect of the method of the present invention relates to a method of conditioning a polishing pad. The method starts with an operation 2050 in which a puck 218 is mounted on a chuck 322 with the puck axis of symmetry 224 perpendicular to polishing surface of the pad 218 and the conditioning surface of the pad 209 parallel to the polishing surface. The method moves to an operation 2052 in which the axis of rotation 211 of the pad 209 is offset from the axis of symmetry 224 of the mounted puck 218 with the axes 224 and 211 parallel to define an initial orientation of the puck 218. The method moves to an operation 2054 in which the polishing surface of the pad 218 and the conditioning surface of puck 218b are moved toward each other to with the conditioning surface of the mounted puck 218 resisting the polishing surface of the pad 209. The method moves to an operation 2056 to provide the array 265 of linear bearing assemblies such as 310 adjacent to the mounted puck 218.

Figure 35:
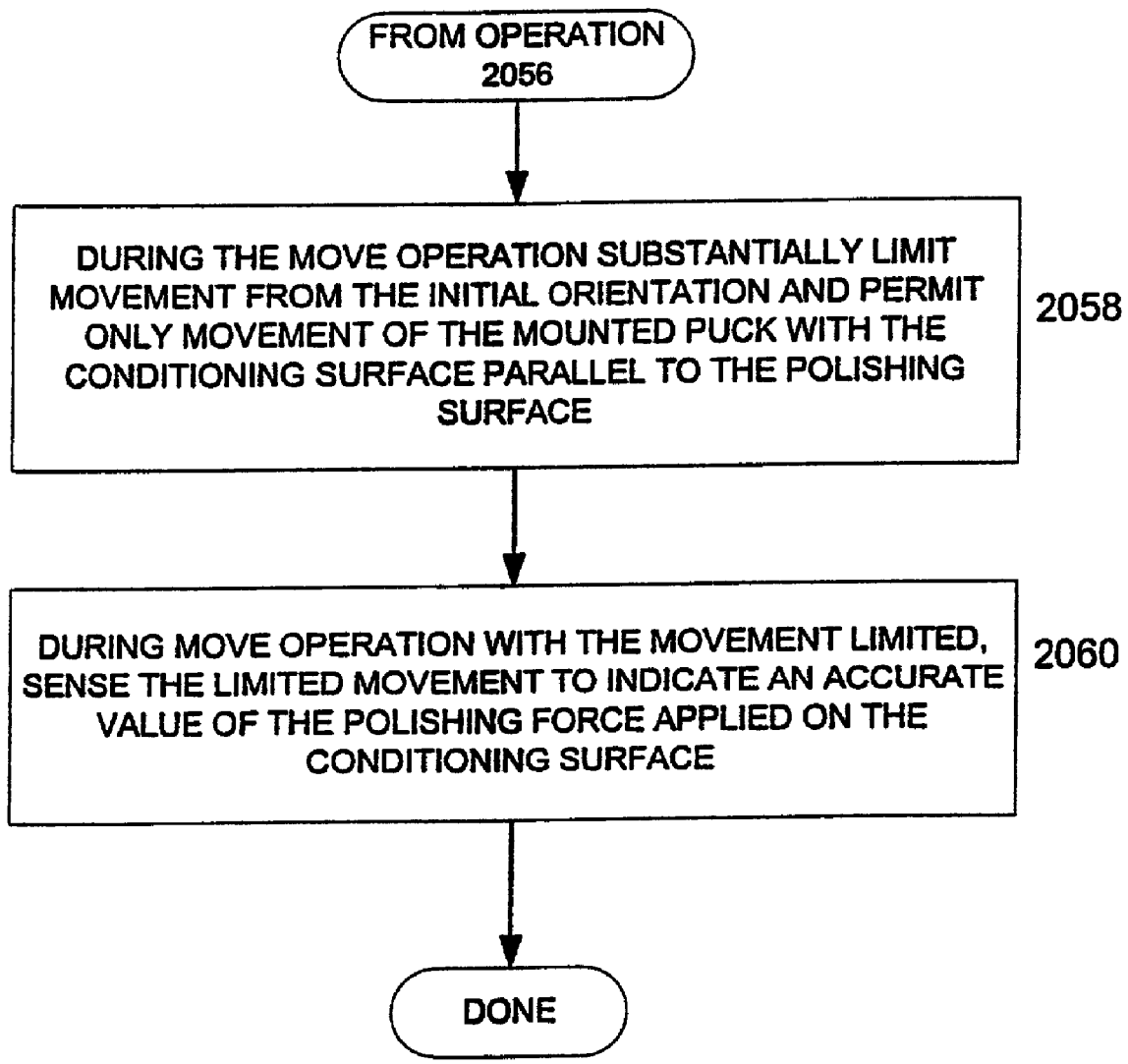

Referring to FIG. 35, the method moves to operation 2058 in which during the move operation 2054 there is substantial limiting of the movement from the initial orientation and permitting only movement of the mounted puck 218 with the conditioning surface of the puck 218 parallel to the polishing surface of the pad 218. The method moves to operation 2060 in which during the move operation 2054 with the movement limited, the limited movement is sensed to indicate an accurate value of the polishing force FP-C applied on the area APC of the puck 218.

Figure 36:
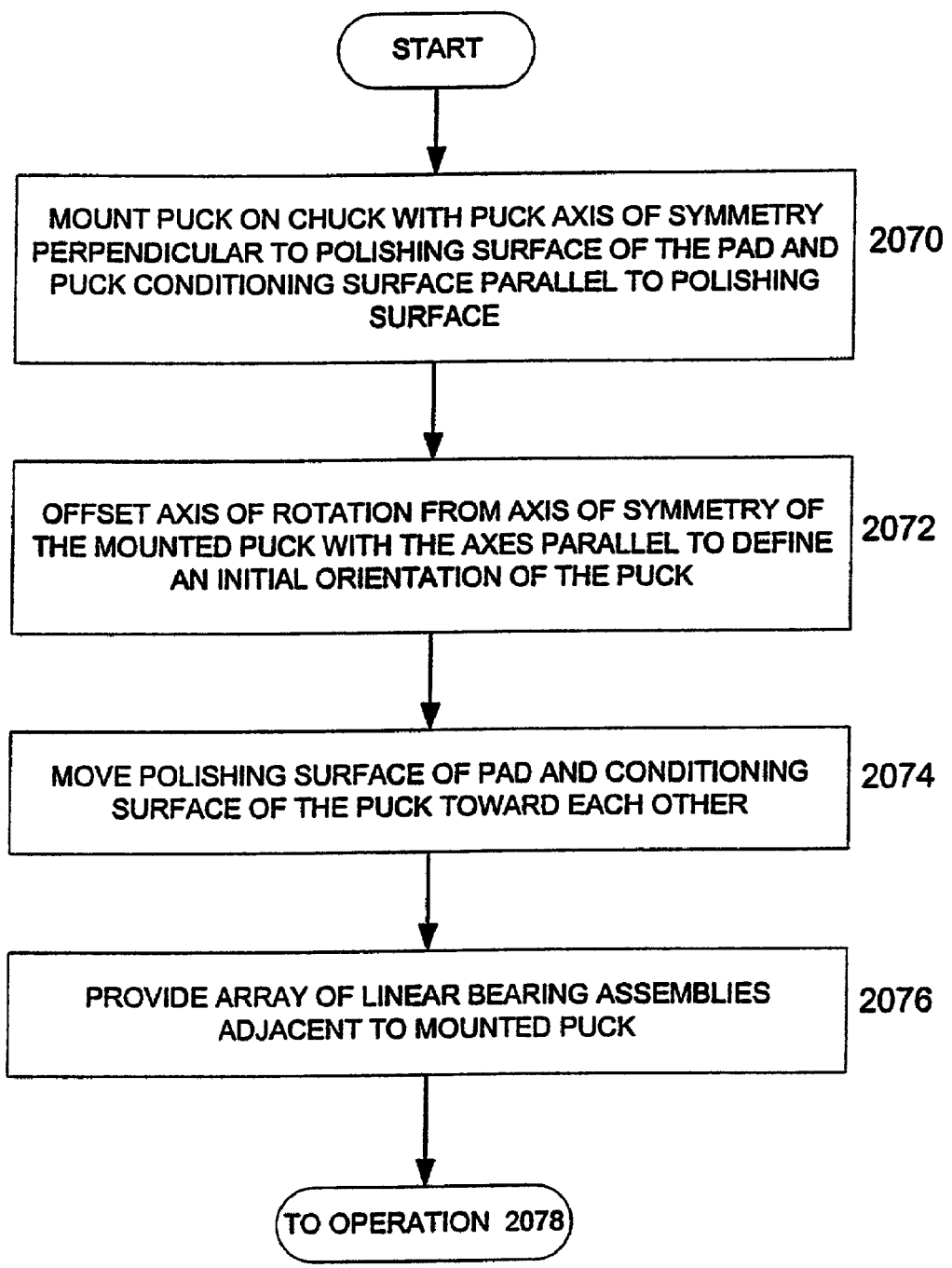
Figure 37:
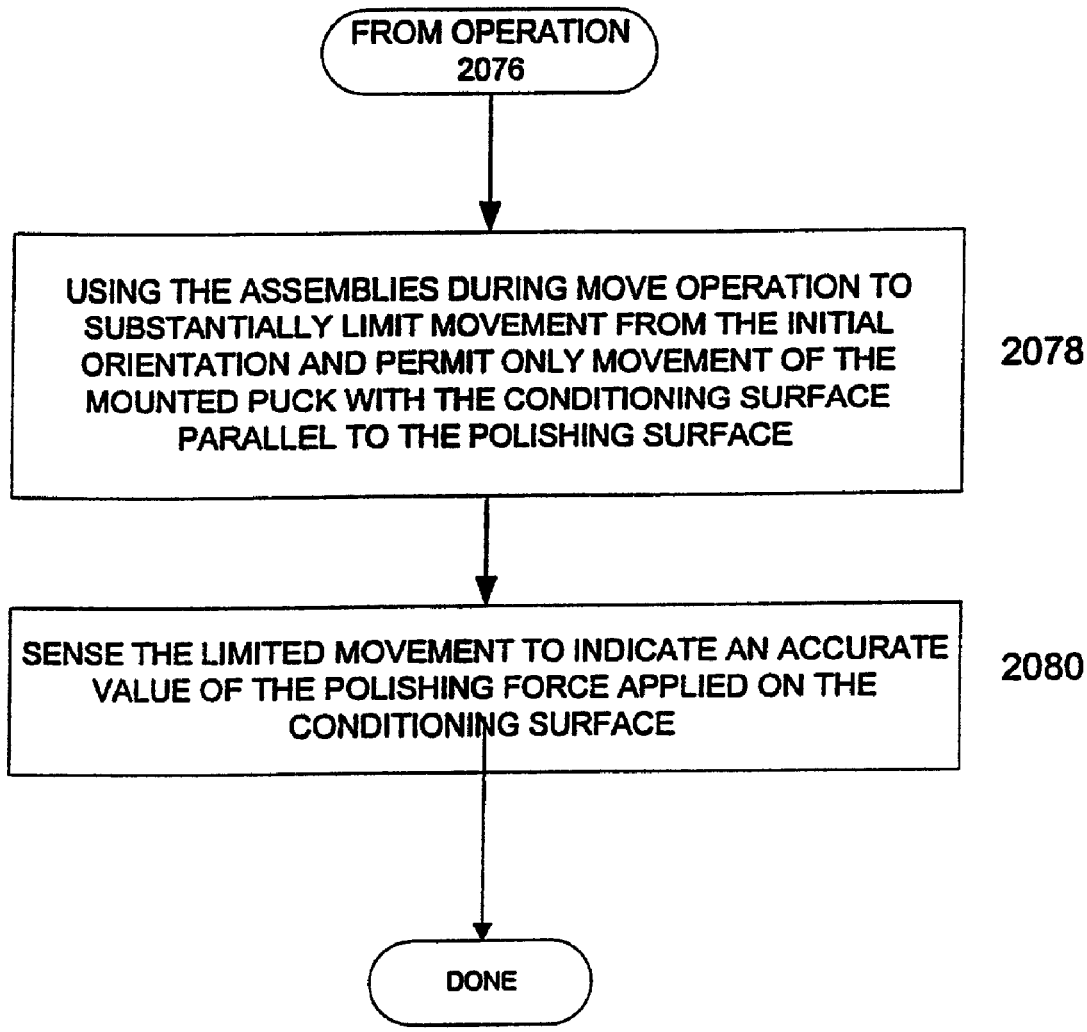

Referring to FIG. 36, another aspect of the method of the present invention relates to a method of conditioning a polishing pad. The method starts with an operation 2070 of mounting the puck 218 on the chuck 322 with the puck axis 224 of symmetry perpendicular to polishing surface of the pad 218 and the puck conditioning surface parallel to the polishing surface. The method moves to an operation 2072 of offsetting the axis of rotation 210 from the axis of symmetry 224 of the mounted puck 218 with the axes 210 and 224 parallel to define an initial orientation of the puck 218. The method moves to an operation 2074 of moving the polishing surface of the pad 218 and the conditioning surface of the puck 218 toward each other. The method moves to an operation 2076 of providing the array 265 of linear bearing assemblies 310 adjacent to mounted puck 218. Referring to FIG. 37, the method moves to an operation 2078 of using the assemblies 310 during the move operation 2074 to substantially limit movement from the initial orientation and permit only movement of the mounted puck 218 with the conditioning surface parallel to the polishing surface. The method moves to an operation 2080 of sensing the limited movement to indicate an accurate value of the polishing force FP-C applied on the conditioning surface.

Figure 38:
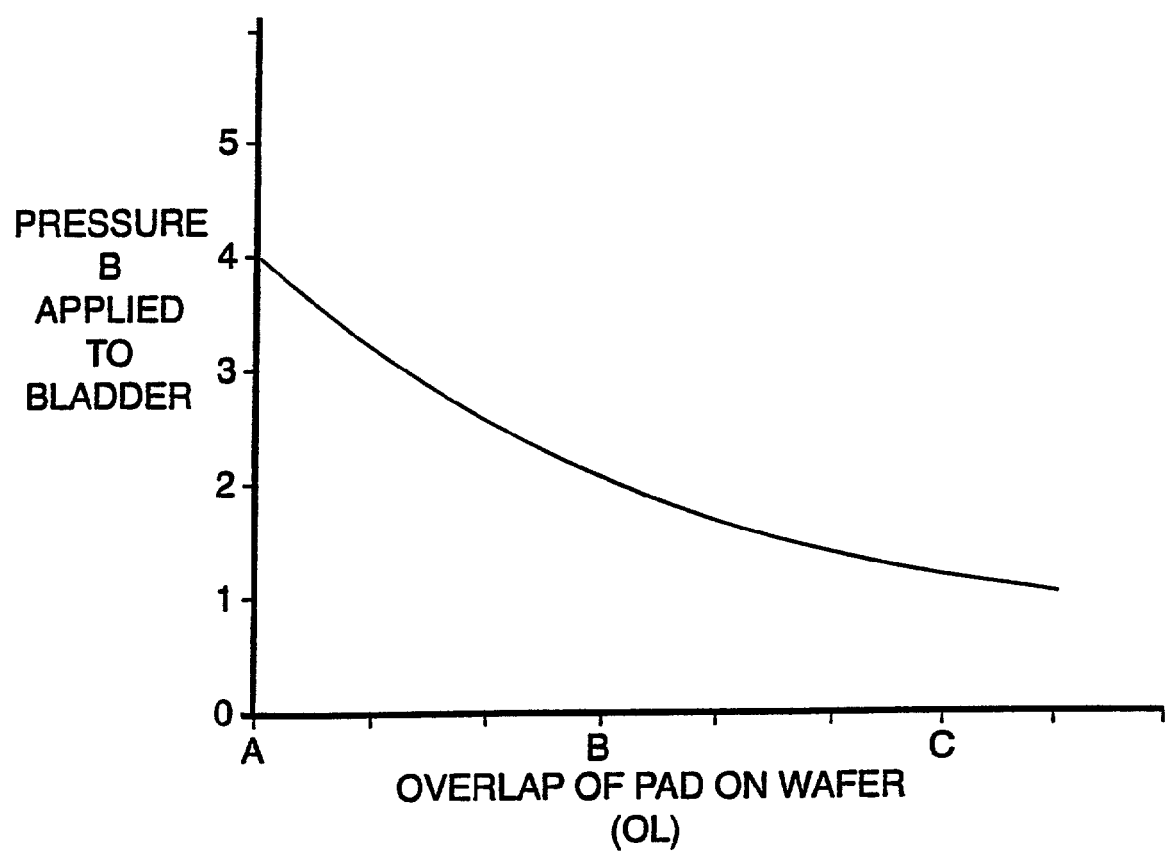
FIG. 38 is a graph schematically illustrating how the pressure applied to the motor for the retainer ring varies with the amount of overlap between the polishing pad, on the one hand, and the retainer ring and wafer, on the other hand.

Referring to FIG. 38, there is shown a graph schematically illustrating how the pressure B applied to the fluid 293 admitted to the linear motor 290 may be varied with the amount of overlap OL (FIG. 1B) between the polishing pad 209 on the one hand, and the retainer ring 282 and the wafer 206, on the other hand.). As described above, one polishing pressure profile may provide that during a step in a CMP cycle, uniform amounts of pressure should be applied to the different exposed and contacted regions 204R. In that situation, as the area APW of the exposed and contacted regions 204R increases the force FP-W is increased to have the amounts of pressure be uniform. Processing of the wafer load signal 264 is performed by the system 2100 described below, and the force on the wafer carrier 208 in the upward direction (see F in FIG. 1B) is adjusted as necessary to provide the appropriate force FP-W applied by the polishing pad 209 on the area APW of the wafer 206. A graph of the type shown in FIG. 38 may be used to select the pressure B applied to the fluid 293 admitted to the linear motor 290 according to the amount of overlap OL (FIG. 1B) between the polishing pad 209 on the one hand, and the retainer ring 282 and the wafer 206, on the other hand that is experienced at any given time TN.

Providing Controllable Pressures Central Pressure Control

In the above description, it was noted that the size, or value, of the contact (or overlap) area AP will vary with respect to time TN, and reference was made to FIGS. 1C-1 through 1C-3, 1D-1 through 1D-3, and 1E-1 through 1E-3. Referring again to these FIGS., FIGS. 1C-1 through 1C-3 identify the X axis-coordinate, or X-coordinate, of the center of the wafer 206 as h1, and identify the X-coordinate of the center of the retaining ring as h2, and identify the X-coordinate of the center of the polishing pad 209 as h3, and identify the X-coordinate of the center of the conditioning puck 218 as h4. In FIG. 1C-1 the wafer radius is identified as r1, the retainer ring radius as r2, the polishing pad radius as r3, and the puck radius as r4. There is a space, or gap, between the outer edge of the retainer ring 282 and the outer edge of the puck 218, and this is identified as xgap. FIG. 1C-1 shows that the value of h1 and h2 may be set as zero. As a result, the value of h3 is shown as r2, indicating that the furthest leftward movement of the polishing pad 209 in this example is to a position tangent with the Y axis center line of the wafer 206 (at center h1) and the Y axis center line (at center h2) of the retainer ring 282.

Figures 1, 1D:
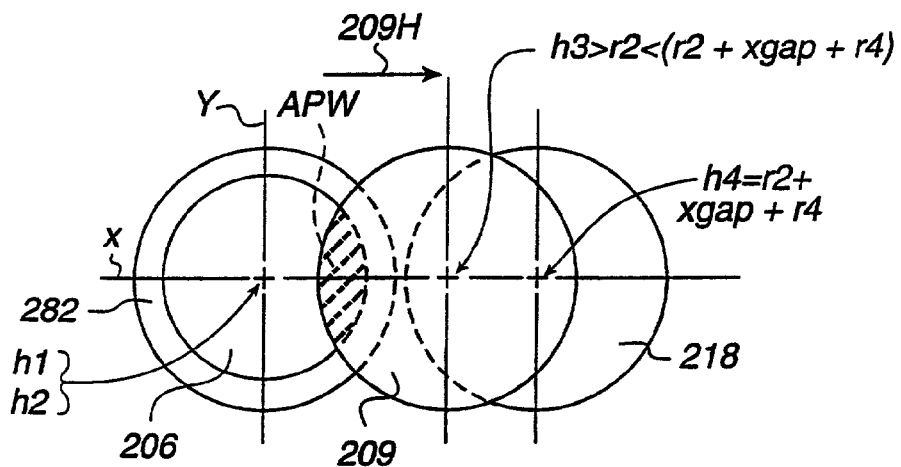
Figures 1, 1D, 2:
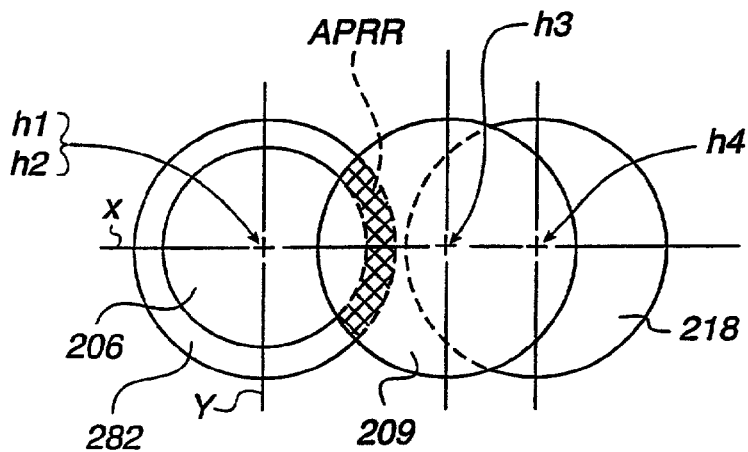
Figures 1, 1D, 2, 3:
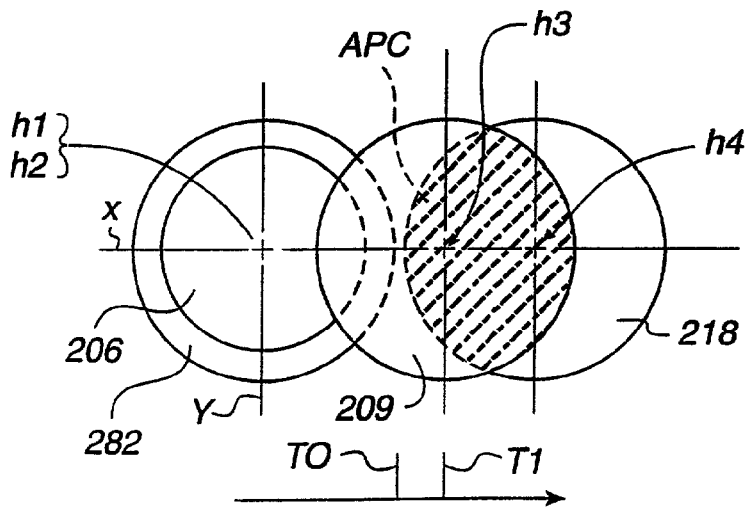

In a preferred embodiment, h3=r2 is the position of the polishing pad 209 for touchdown, which is the first contact of the polishing pad 209 with the wafer during a CMP cycle. In this situation, during the CMP polishing cycle, the polishing pad 209 may move as shown by the arrow 209H (e.g., to the right). For example, the rightward movement may be to a position at which h3 is more than r2 and less than the sum of r2, xgap and r1, which may be at a time TN=T1, which is after time T0. As this movement occurs after touchdown, there are changes in the values of these areas contact APW, APRR, and APC. To illustrate such changes in the values of the areas AP, in FIG. 1D-1 the area APW is shown at the time TN=T1 as having a smaller value than the area APW shown in FIG. 1C-1. In FIG. 1D-2 the area APRR is shown at the time T1 as also having a smaller value than the area APRR shown in FIG. 1C-1. In FIG. 1D-3 the area APC is shown at the time T1 as having a larger value than the area APC shown in FIG. 1C-3.

Figures 1, 1E:
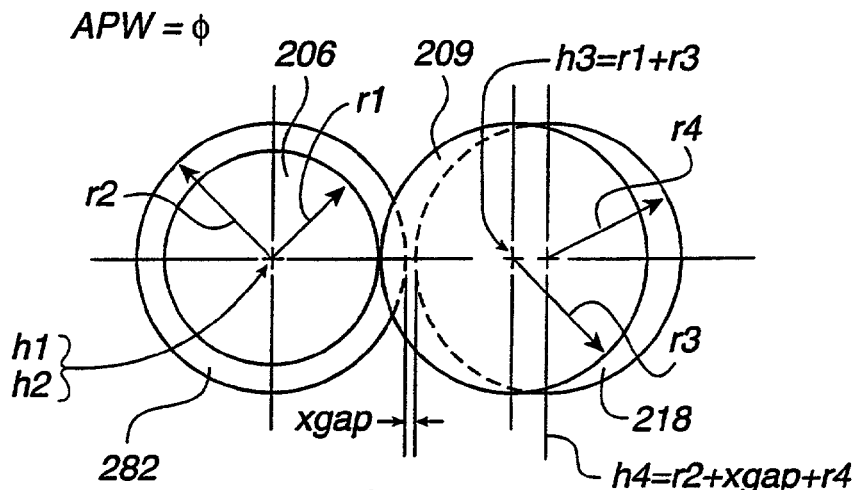
Figures 1, 1E, 2:
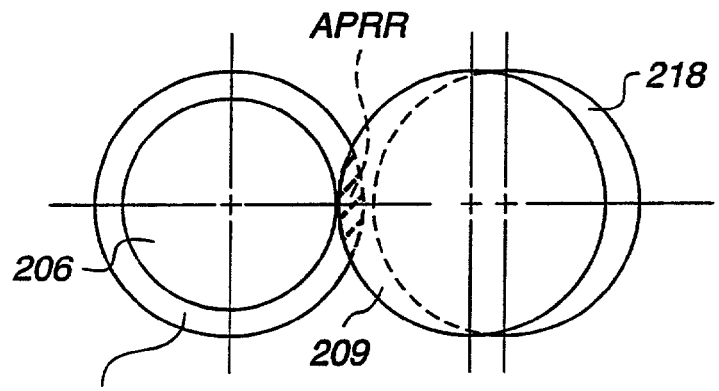
Figures 1, 1E, 2, 3:
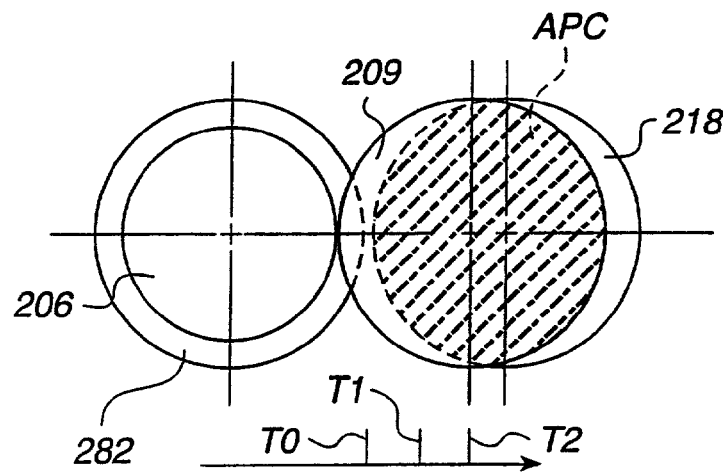

To illustrate another aspect of such changes in the values of the areas AP, in FIG. 1E-1 the area APW is shown at the time T2, after the time T1, as having no value as compared to the finite values of the area APW shown in FIGS. 1C-1 and 1D-1. The lack of a value indicates that there is no overlap (and thus no contact) between the polishing pad 209 and the wafer 206. In FIG. 1E-2 the area APRR is shown at the time T2 as also having a smaller value than the area APRR shown in FIG. 1D-2. This smaller area APRR is the diminishing area of contact between the polishing pad 209 and the retaining ring 282. In FIG. 1E-3 the area APC is shown at the time T2 as having a still larger value than the area APC shown in FIG. 1D-3. Thus, FIGS. 1C, 1D, and 1E show that, for the same relative movement "x" (e.g., of the polishing head 209) in the rightward direction of the arrow 209H, the change in the value of one of the areas AP is different than the change in the value of each of the other areas AP. In view of this, to achieve the above desired CMP operations, in the present invention the pressure P to be applied to one of these areas APW, APRR, and APC may be controlled separately from the pressure P to be applied to each of the other two areas. Detailed references below to the pressure P refer to the pressure PWP on the contact area APW, the pressure PRP on the contact area APRR, and the pressure PPC on the contact area APC. One aspect of separately controlling each such pressure P is to provide a separate set of processing instructions for each separate contact area APW, APRR, and APC.

Figure 39:
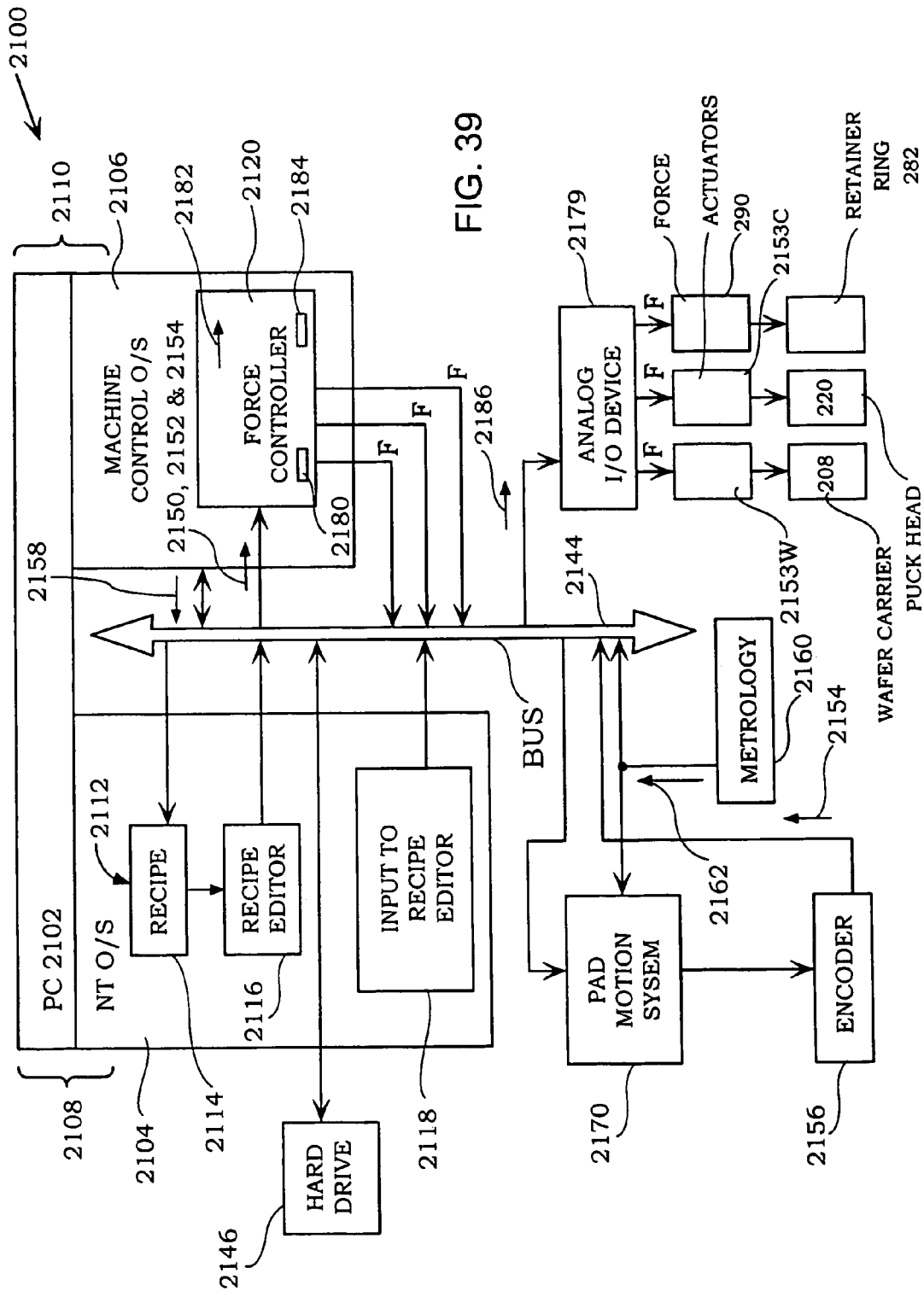
FIG. 39 is a schematic diagram of a first control system providing central processing control of the polishing pressure by use of a personal computer (PC)

FIG. 39 shows a first control system 2100 for controlling CMP operations to perform CMP of the wafer 206 according to the present invention. A complete set of CMP operations define the CMP cycle. The control system 2100 includes a PC 2102 provided with separate operating systems (O/S). The PC 2102 may be a personal computer having a rated processing capacity of a 600 MHz Pentium TM series processor, or equivalent. A preferred first, or manager, O/S 2104 may be the NT O/S; and a preferred second, or CMP control, O/S 2106 may be a machine control O/S. The O/S 2106 may be a visual logic controller (VLC) sold by Steeplechase, for example. The PC 2102 with the O/S 2104 is referred to as a processor 2108, and PC 2102 with the O/S 2106 is referred to as a processor, or machine control processor, 2110.

The processor 2108 may perform standard functions, such as video, storage to drives, keyboard, mouse, etc. The processor 2108 may also perform CMP initialization functions that are not directly related to performing a CMP cycle, including running applications 2112 for CMP recipes 2114. In an automatic mode, the recipes 2114 are sets of all possible criteria related to a CMP process. CMP recipe application 2112 includes a recipe editor 2116. Input to the editor 2116 may be by any standard input unit (e.g., disk) 2118 to select one recipe 2114 and enter into that recipe of all of the process variables necessary to define one CMP process, including all of the CMP cycles. The process variables may include, for example, polishing rate, pressure ramping, pad motion velocity, pressure profiles, and polishing duration. In a manual mode, selected variables may be entered to define limited machine process operations (e.g., for test or calibration purposes).

The machine control processor 2110 controls all of the other CMP operations, such as rotation of the wafer carrier 208 and of the pad 209, horizontal motion of the pad head 202 (e.g., changes in h3), and the forces FP-VW, FM and FP-C. A significant part of the processing by the machine control processor 2110 is to perform the functions of a force controller program 2120 which runs under the CMP O/S 2106 and controls the forces FP-VW, FM and FP-C. Once a particular CMP cycle starts, and in particular once a particular step of such cycle starts, it is important to not interrupt the processing of the force controller program 2120. In general, within the system 2100, to give priority to the processing that is necessary to perform the CMP cycles of a CMP process (as may be compared to the standard and initialization functions), the machine control processor 2110 has first priority to the available processing capacity of the PC 2102. After allowing for use of processing capacity for overhead and other necessary (non-CMP) functions (2-3 percent), about 97 to 98 percent of the processing capacity of the PC 2102 may be available.

Configuration criteria 2122 shown in Table 1 (below) are provided for determining whether such available processing capacity is sufficient for the CMP operations for which the system 2100 may be selected. As a preface to the description of the configuration criteria, it should be understood that there are many different factors that contribute to the processing workload of the machine control processor 2110 during a CMP cycle. For example, the relative movement of the wafer 206 and the pad 209 may be at a constant velocity in the direction of the arrow 209H in FIG. 1B. As shown in FIGS. 1C-1 through 1C-3, the contact area APW decreases as the location of h3 changes. This is an example of how the area APW may change with respect to time TN during which the relative movement changes. Thus, time is a factor in determining the processing workload of the machine control processor 2110 during this CMP cycle.

The position of the pad 209 may be changed for reasons other than time. For example, the polishing performed by the pad 209 may require that the relative position of the wafer 206 and the pad 209 be changed. This may be referred to as reaching a polishing point, for example. At the same time as the desired polishing pressure may be required to change for set up for further polishing after the polishing point is reached, the fact that the polishing point was reached could dictate that the pad 209 be moved to a new h3 position (e.g., as shown in FIG. 1D-1). Thus, although the area APW will change when the pad 209 is moved, the change in the area APW will be based on a factor other than time. Thus, the processing workload of the machine control processor 2110 during this CMP cycle would be based on a non-time-related process event.

The position of the pad 209 may be changed for other than process reasons. For example, when vacuum is used to hold the wafer 206 on the carrier 208, and the system 2100 experiences a loss of vacuum, the polishing performed by the pad 209 must be immediately stopped. Here, for reasons other than time and other than processing, the pressure must be reduced immediately to avoid loss of the wafer 206 from the carrier 208. Processing is necessary to reduce the pressure, such that the processing workload of the machine control processor 2110 during this CMP cycle would be based on a non-time-related, emergency event.

TABLE 1

Configuring Criteria 2122

| | |
|---|---|
| 1. | Decreasing Polishing Pressure: System 2100: not to exceed rate of curve L1 in FIG. 42B. |
| 2. | Increasing Pressure (Pressure Ramp): System 2100: not to exceed rate of curve LL1 in FIG. 42C. |
| 3. | Pressure Variation As a Function of a Variable: System 2100: pressure processing delay not to exceed curve 2136 in FIG. 42D. |
| 4. | Pad Motion Rates: System 2100: not to exceed velocity of curve 2138 in FIG. 42E. |

Figure 40:
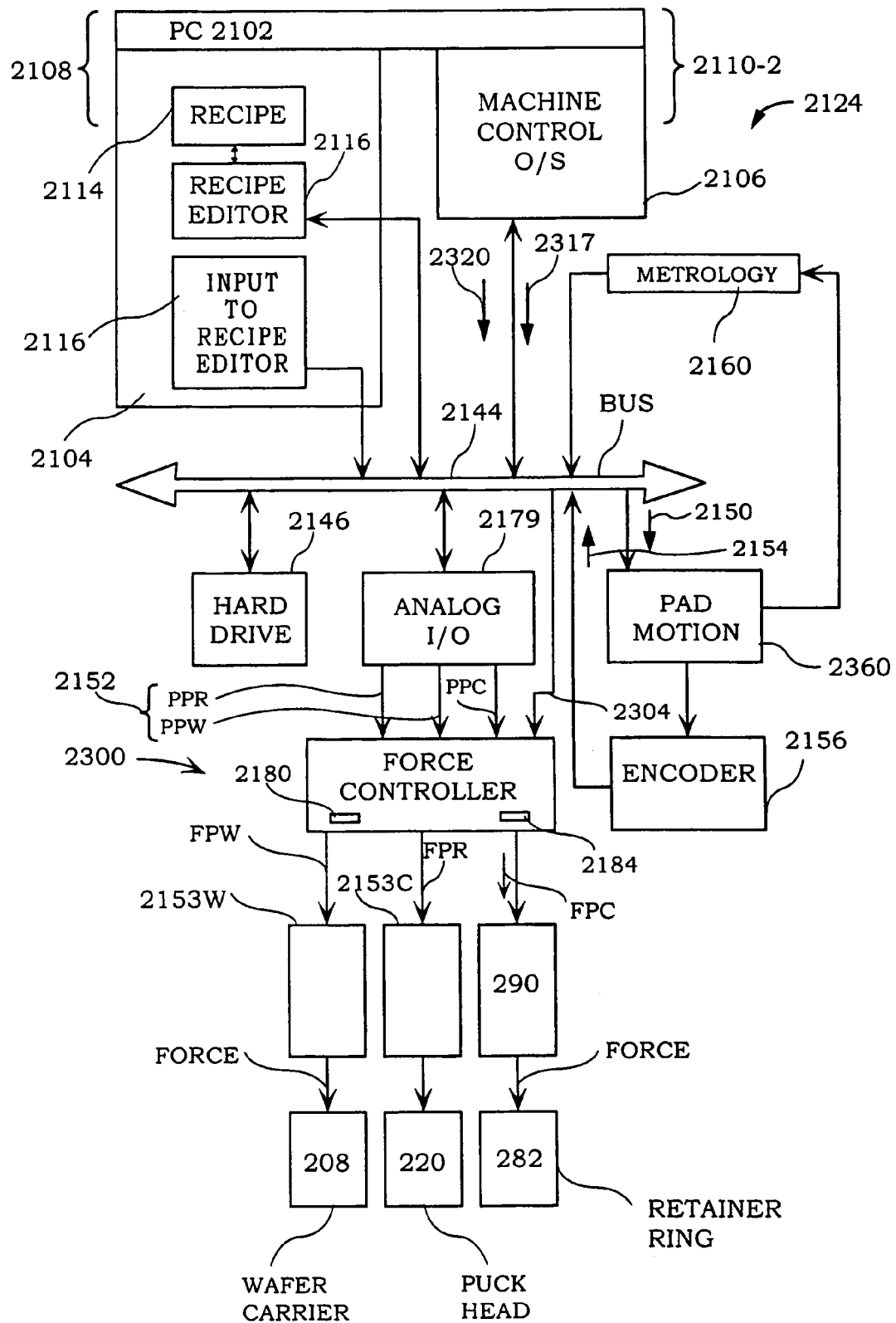
FIG. 40 is a schematic diagram of a second control system providing a force controller separate from the PC for controlling the polishing pressure in situations in which there is a high processing workload.

It may be understood that if none of the configuration criteria is exceeded, the system 2100 may be selected, and the machine control processor 2110 will generally have access to sufficient available processing capacity of the PC 2102 to timely perform all of the processing required, provided that the actual CMP operations do not exceed any of the configuration criteria. If any of the configuration criteria is exceeded, the system 2100 is not selected, and instead a second control system 2124 may be selected (FIG. 40). As described below, the system 2124 also includes the PC 2102, which is in a second architecture 2300. The system 2124 will generally have access to sufficient available processing capacity of the PC 2102 to timely perform all of the processing required by the configuration criteria that the system 2100 does not meet.

Concerning criteria 1 of configuration criteria 2122, an end detection situation related to decreasing polishing pressure is described with reference to FIG. 42A, which shows the wafer 206 overlapped by the polishing pad 209. The polishing pressure may be decreased with time in order to decrease the polishing rate of the wafer 206 as the desired wafer thickness is approached. Time TN may be an initial time T0 as shown in FIG. 1C-1 with the edge of the pad 209 tangent to the Y axis center line of the wafer 206. The time T0 identifies the point at which the edge of the pad 209 engages the contact area APW of the wafer 206, with the edge adjacent to the center line of the wafer (see h1). The corresponding contact area APW of the pad 209 is shown tending to remove the wafer 206 at a higher rate from parts of the wafer 206 that are nearest to the center line of the wafer (at h1) as compared to lower removal rates nearer to or at the edge 2126 of the wafer 26 corresponding to time Td, for example. The variation in removal rates is shown by a series of dashed lines 2128. It may be understood that in a period of time from time T0 to time Tc the pad 209 has removed a thickness of TH1 from the wafer 206 adjacent to the center line h1, whereas in the same time period the pad 209 has removed a thickness substantially less than TH1 from the wafer 206 adjacent to the edge 2126 of the wafer 206.

Figure 42A:
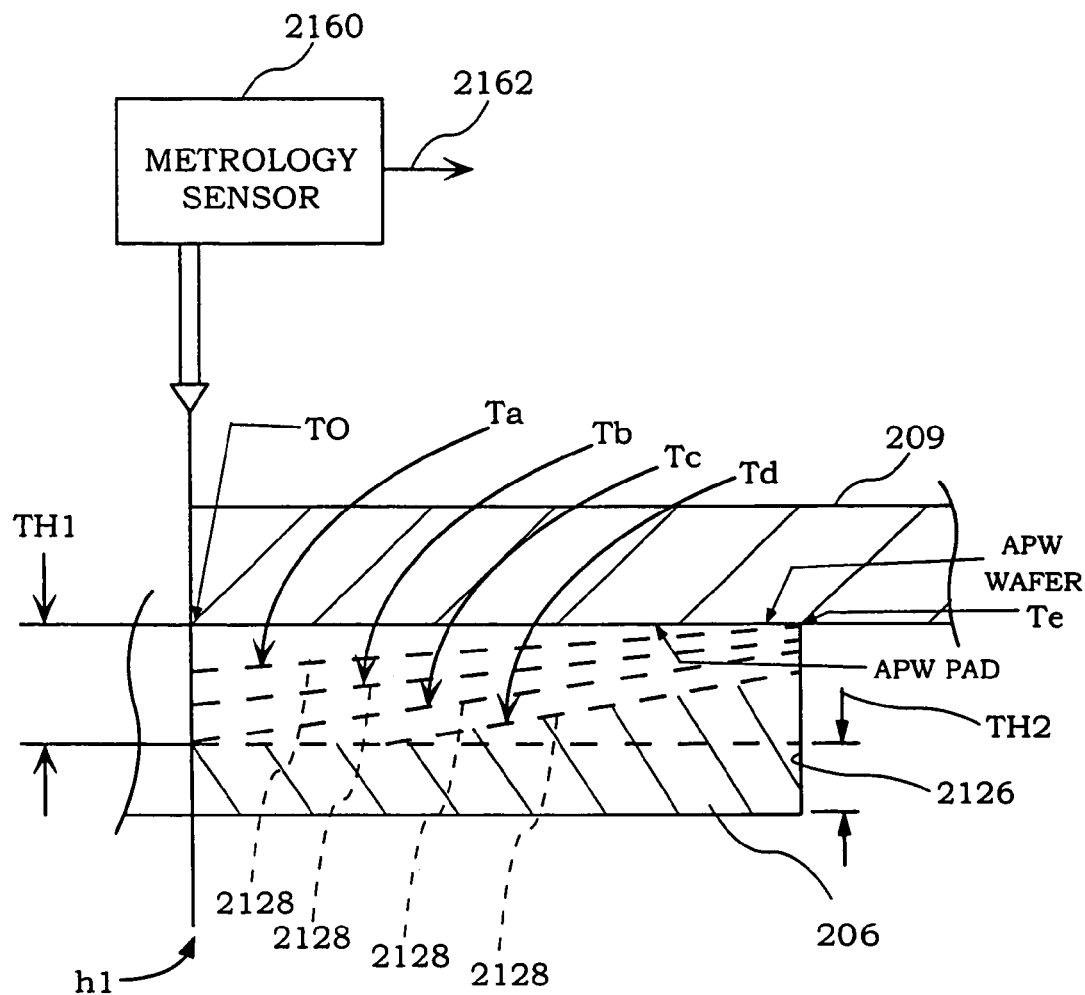
FIG. 42A is a schematic cross sectional view of a wafer overlapped by a polishing pad, illustrating a series of dashed lines that depict the varying shape of a contour of an exposed surface of the wafer as CMP operations are performed.

In the context of FIG. 42A, "end detection" relates to detection of the "end" of the step in which the polishing occurs from time T0 to Tc. For example, the end detection identifies the end of a step. In this example, the end is when the wafer 206 has the thickness TH2 adjacent to the center line h1 (FIG. 42A). When that event has occurred, a metrology sensor 2160 mounted for movement with the polishing, or pad, head 202 may output a signal 2162 having a zero value indicating the end of the step. The signal 2162 having a value other than zero may represent that the actual thickness of the wafer 206 at the metrology sensing location adjacent to the edge of the pad 209 is more than the end point thickness TH2.

In view of the variation in removal rates with respect to the distance from the center line h1, a decrease in the pressure applied to the area APW must be controlled accurately to avoid removing more than a desired amount of the wafer 206 (e.g., not more than the thickness TH1) adjacent to the center line h1 even though the desired thickness TH2 has not been attained at the wafer edge 2126, for example. The rate of this decrease in pressure may vary according to the material from which the wafer 206 is made, and/or according to the material from which the pad 209 is made, for example, among other factors.

Figure 42B:
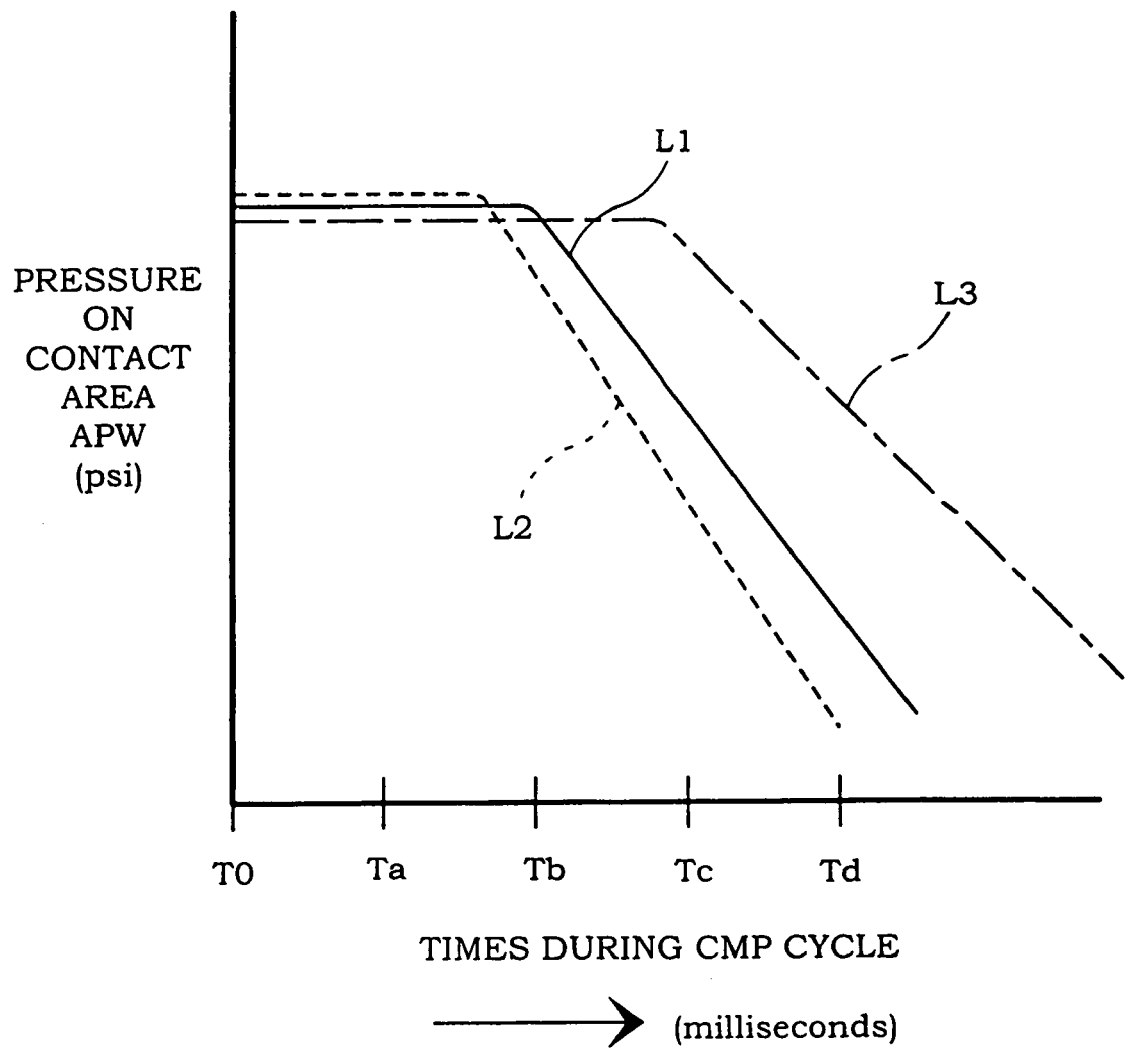
FIG. 42B is a schematic diagram of times during a CMP cycle during which the wafer is polished by the polishing pad to provide the contour shown in FIG. 42A, illustrating varying polishing pressures as one type of operational criteria that may result in a high processing workload.

With respect to the configuration criteria 2122, the graph in FIG. 42B illustrates exemplary rates of decrease of the polishing pressure. FIG. 42B shows a limit rate L1, a second rate L2 higher than the rate L1, and a third rate L3, less than L1. Rate L1 is the exemplary limit of the rate of decrease of the polishing pressure, such that the processor 2110 should not be used for rates above L1 (e.g., L2), and instead the system 2124 (FIG. 40) would be used for rates such as L2.

Figure 42C:
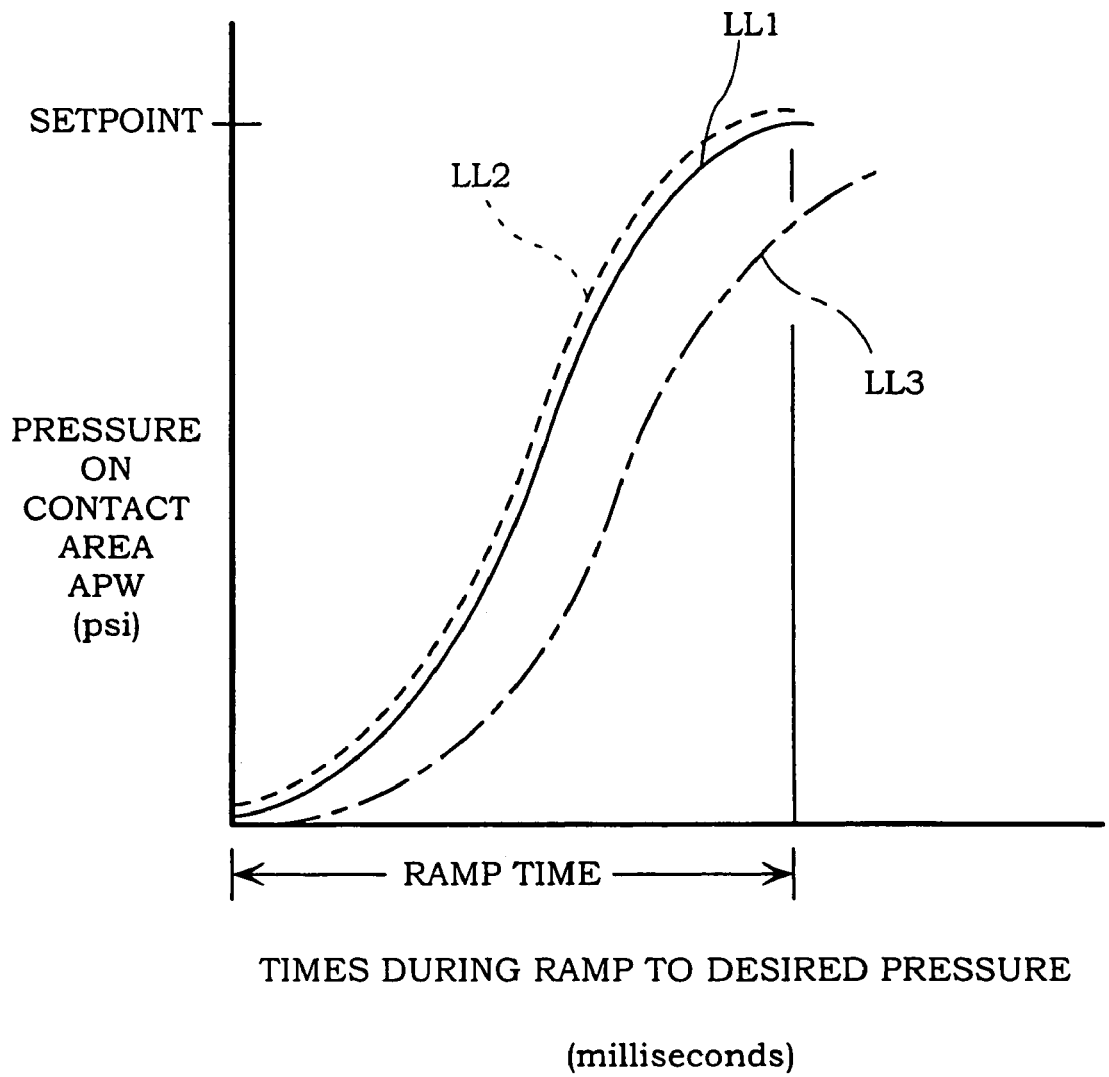
FIG. 42C is a schematic diagram of times during a CMP cycle during which the pressure applied to the wafer is increased from a first value to a next desired pressure, illustrating a pressure ramp as another type of operational criteria that may result in a high processing workload.

Concerning criteria 2 of the configuration criteria 2122, a situation related to increasing polishing pressure (a polishing pressure ramp) is described with reference to FIG. 42C. With the wafer 206 also overlapped by the polishing pad 209, the ramp curves of FIG. 42C show rates at which polishing pressure is gradually increased during ramp time to a pressure setpoint. The gradual increase reduces dynamic (motion-induced) changes in the shape of the contact area APW of the pad 209, and protects the wafer 206 from uncontrolled rates of removal. The shape of the curves in FIG. 42C may vary according to the material from which the pad 209 is made, for example, among other factors. The graph in FIG. 42C illustrates another exemplary limit rate LL1, a second rate LL3 less than the rate LL1, and a third rate LL2, more than LL1. Rate LL1 is the exemplary limit of the rate of increase of the polishing pressure, such that the processor 2110 should not be used for rates above LL1 (e.g., rate LL2), and instead the system 2124 (FIG. 40) would be used.

Figure 42D:
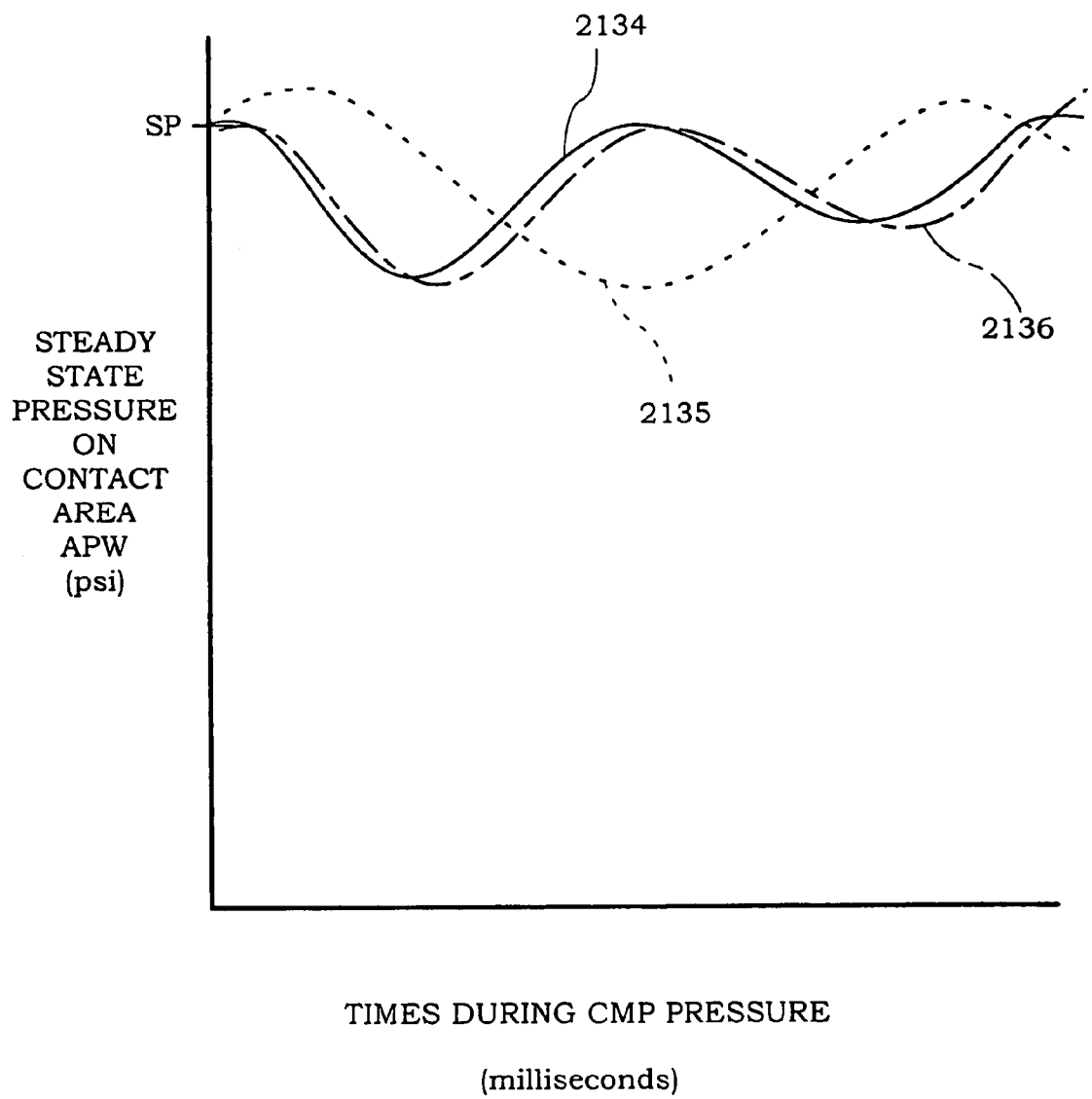
FIG. 42D is a schematic diagram of times during a CMP cycle during which the pressure applied to the wafer is varied between different, illustrating a comparison between a desired variation of the pressure with respect to time, pressure ramp as another type of operational criteria that may result in a high processing workload.

Concerning criteria 3 of configuration criteria 2122, the wafer 206 and the pad 209 are overlapped and there is a command to vary the pressure. FIG. 42D shows the changes in pressure on the contact area APW of the pad 209 as a function of time TN. The changes in the pressure over time may also be a function of another variable. FIG. 42D compares the desired change in pressure (curve 2134) with a curve 2135 representing the processing lag, or processing delay, in achieving the desired pressure that is expected to result using the expected available processing capacity of the PC 2102 to timely perform all of the processing of the pressure required. Curve 2135 represents a greater lag than a curve 2136 representing the acceptable amount of lag, such that criteria 3 indicates that the system 2124 should be used if the processing delay exceeds curve 2136 (as indicated by curve 3136).

Figure 42E:
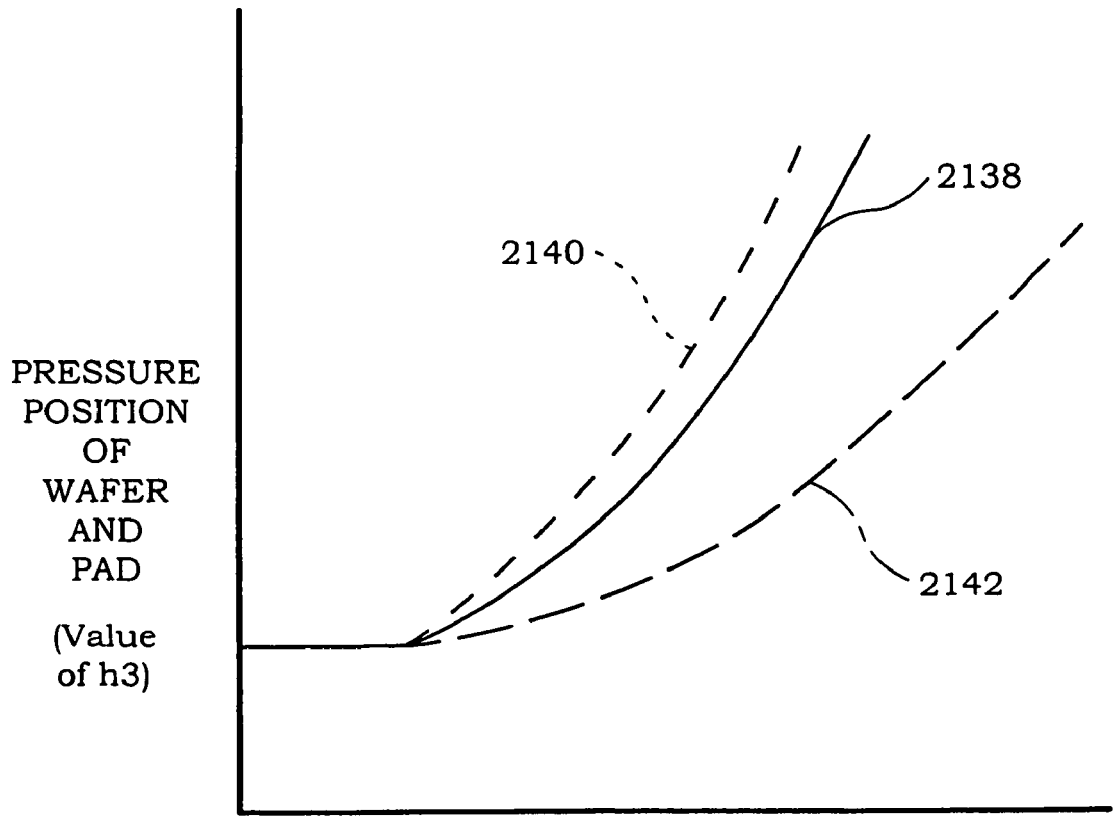
FIG. 42E is a schematic diagram of times during a CMP cycle during which the relative position of the pad and the wafer are changes, illustrating possible rates of such change and a relationship with low and high processing workloads.

In the example of criteria 4, the pad 209 is initially stopped, and there is a command to start moving the pad. FIG. 42E shows the velocity of the pad 209, i.e., change in the pad distance moved with respect to time TN. FIG. 42E compares velocities, with curve 2138 representing a desired velocity (or velocity limit). Curve 2142 represents the highest velocity that is expected to be processed by the system 2100 using the expected available processing capacity of the PC 2102 to timely perform all of the processing required. Curve 2140 represents a higher velocity than curve 2138, one that is within the processing capacity of the system 2124. Configuration criteria 4 above indicates that the system 2124 should be used to timely perform all of the processing required by the velocity represented by curve 2138. Thus, situations in which the desired velocity is represented by curve 2142 may be processed by the system 2100 using the expected available processing capacity of the PC 2102 to timely perform all of the processing required.

Assuming the system 2100 has been selected according to these configuration criteria 2122, system 2100 may be used as follows. The recipe editor 2116 has defined all criteria related to the CMP process in the form of the edited recipe 2114. The edited recipe 2114 is output to a bus 2144 and stored in a hard drive 2146, for example. The edited recipe 2114 may include data corresponding to the list of process variables set forth in Appendix A below. The processor 2110 reads the edited recipe 2114 from the hard drive 2146 and processes data necessary to set up and operate the above-described hardware of the CMP system 200-1. This includes axis motion data, including pad motion data 2150, pressure profile data 2152 (for each area AP), process sequence data, and other data necessary to operate the carrier 208, the polishing head 202 and the retainer ring motor 290, for example. The processor 2110 defines the edited recipe 2114 in terms of a table of sequences in which steps are taken to perform the CMP operations.

Referring to Appendix A, exemplary process variables are identified in terms of FIGS. 1C-1 through 3 and FIG. 48, and are shown including sixteen such variables. Variable 1 is the value of h1, the X axis coordinate of the center of the wafer 206. Variable 2 is the value of h2, the X axis coordinate of the center of the retainer ring 282. Since the center of the wafer carrier 208 does not move during the CMP cycle, the values of h1 and h2 are constant during such cycle. Variable 3 is the value of r1, the radius of the wafer 206. Variable 4 is the value of r2, the radius of the retainer ring 282. Variable 5 is the value of r3, the radius of the polishing pad 209. Variable 6 is the value of r4, the radius of the pad conditioning puck 218. Variable 7 is the value of xgap, the distance between the edge of the retainer ring 282 and the edge of the pad conditioning puck 218. The value of h4 is recalculated based on the value of xgap. Variables 8, 9 and 10 are used to set the pressures that are to be produced by the force actuator 2153W for the wafer carrier 208, by the force actuator 290 for the retainer ring 282, and by the force actuator 2153C for the puck head 220. Variables 11-13 are the respective values of the actual forces of the wafer 206 on the pad 209, and of the pad 209 on the retainer ring 282, and of the pad 209 on the puck 218. Variable 14 initiates the calculation of the forces to be applied to the respective force actuators 2153W, 290, and 2153C. Variables 15 and 16 are used in monitoring the system 2100. For example, in the event that it is necessary to stop any of the calculations without changing an output, variable 15 is used. Variable 16 is used to both stop any of the calculations and to set all of the outputs to zero.

In the operation of the system 2100, the processor 2110 defines the edited recipe 2114 in terms of a table of sequences in which steps are taken to perform the CMP operations. For each step, all of the variables are specified and actions are defined. A step may be specified by data representing a command to continue to polish the wafer 206 until an event occurs. For example, the event may be an end detection event in which the end of the step is when the wafer 206 has the thickness TH2 at a particular distance away from the center line h1 (FIG. 42A). When that event has occurred, the metrology sensor 2160 mounted on the pad head 220 may output the signal 2162. A step may also be specified by an instruction to continue polishing the wafer for a set length of time TN. The movement of the metrology sensor 2160 with the pad 209 allows the entire exposed surface 204 of the wafer 206 to be measured so as to evaluate the status of the CMP operations.

As another example, one variable of the sequence table may be the pressure P at which the CMP operation is to be conducted. Such pressure P may be selected as the pressure to be applied to either of the wafer 206 (pressure PWP), or to the retainer ring 282 (pressure PRP), or to the conditioning puck 218 (pressure PPC). Alternatively, such pressure P may be selected as each respective separate pressure PWP, PRP, and PPC to be applied to each respective wafer 206, retainer ring 282, and conditioning puck 218. As another example, such pressures P may be selected by specifying one pressure (e.g., that pressure PWP to be applied to the wafer 206). The values of the other pressures may then be stated in terms of the difference with respect to the pressure PWP. Thus an exemplary pressure PRP that is to be the same as the pressure PWP would be specified by a difference of zero psi. A pressure PPC that is to be about 1.5 psi when the pressure PWP is about 7 psi would be specified by a difference of about 5.5 psi.

Recalling that the processor 2110 defines the edited recipe 2114 in terms of a table of sequences in which steps are taken to perform the CMP operations, a method of the present invention is described with reference to FIGS. 39 and 43. For ease of description, FIG. 39 shows the system 2100 as being capable of processing any of the separate pressures P to be applied to the wafer 206, to the retainer ring 282, or to the conditioning puck 218. The more detailed description of the system 2100 below notes separate aspects of the system 2100 applicable to only the wafer 206 or to only the retainer ring 282 or to only the conditioning pad 209. The pad motion data 2150 and the pressure data 2152 are received from the bus 2144 by the force controller 2120. Via the bus 2144, the controller 2120 also receives a feedback signal 2154 from an encoder 2156 that indicates the actual position of the pad 209 at the various times TN during the CMP cycle. The pad 209 has been moved to such actual position in response to motion data 2158 output to the bus 2144 by the processor 2110.

According to the sequence table, for a particular step, the pressure data 2152 may specify a polishing pressure P. FIG. 43 shows a flow chart 2164 of operations of the processor 2110. Flow chart 2164 includes a first operation 2166, in which, for one of the steps in the sequence table, the pressures PWP, PPR, and PPC are output (represented by the pressure data 2152). The output is into the force controller 2120. Such pressures may relate to a steady-state portion of the CMP polishing operations of the CMP cycle, or to any of the pressures described above with respect to FIGS. 42B or 42D, for example, and are within the configuration criteria 2122. The pressure data 2152 may provide that the wafer 206 and the polishing pad 209 are to be urged against each other by an exemplary constant pressure PWP in the range of zero to ten psi.

The method moves to an operation 2168 in which a pad motion command is output. This command is in the form of the pad motion data 2150 output to the bus 2144 and to a pad motion system 2170. The method moves to operation 2172 in which the motion system 2170 moves the pad 209 relative to the wafer 206, to the carrier 208, and to the retainer ring 282. Generally, for the first step of the sequence table, the relative movement is to the positions shown in FIGS. 1C-1 through 1C-3. The pad motion data 2150 may, for example, provide that there is to be a basic, or slow rate of polishing pad movement (velocity) as described with respect to FIG. 42E, as indicated by the curve 2142. The method moves to an operation 2174 in which the actual position of the pad 209 is determined. This operation is performed by the encoder 2156 outputting the feedback signal 2154 via the bus 2144.

The method moves to operations 2176 and 2178 performed by the force controller 2120 of the processor 2110. The pad motion data 2150 and the pressure data 2152 have been received by the force controller 2120. In operation 2176, for each of the pressures PWP, PPR, and PPC, a Contact Area Program 2180 is processed using the feedback signal 2154 (representing the then-X axis position h3 at the time TN, e.g., for the step being processed). The Contact Area Program 2180 is shown in Appendix C. In succession, in operation 2176 the processing of the Contact Area Program 2180 determines data 2182 internal to the force controller 2120 representing the respective contact areas APW, APRR, and APC.

The method moves to operation 2178 in which a Force Program 2184 is processed to determine the product of P times A for each of three sets of input data representing pressure P (based on the data 2152) and contact area A (based on the data 2182). The Force Program 2184 is shown in Appendix B. A first set includes P based on the pressure data 2152 corresponding to the desired pressure PWP on the wafer 206 and the contact area data 2182 corresponding to the contact area APW of the wafer 206 and the polishing pad 209. A second set includes pressure P based on the pressure data 2152 corresponding to the desired pressure PRP on the retainer ring 209, and the contact area data 2182 corresponding to the contact area APRR. A third set includes pressure P based on the pressure data 2152 corresponding to the desired pressure PPC on the puck 218, and the contact area data 2182 corresponding to the contact area APC. In operation 2178 the sequential processing of the three sets of P and A according to the Force Program 2184 results in three successive respective values of force, which correspond to the forces FP-VW, FM and FP-C. Data 2186 representing these forces are output through an analgog I/O device 2179.

The method moves to operation 2188 in which, for each axis (i.e., for the carrier 208, the retainer ring and the puck 218) the output from the device 2179 representing the respective forces FP-VW, FM and FP-C drives the respective force actuator 2153W, 2153C, and 290. The data 2186 representing the respective forces FP-VW, FM and FP-C are output as described above to achieve the type and duration of CMP processing for the current step, and the method is done, indicating that the current step has been processed.

Recalling that the processor 2110 defines the edited recipe 2114 in terms of a table of sequences in which steps are taken to perform the CMP operations, upon completion of processing of one step, a next step may be processed by a method of the present invention described with reference to FIGS. 39 and 44. The processor 2110 selects the pressure data 2152 corresponding to the next step according to the sequence table for the next step. Some or all of the pressure data 2152 may be different than it or they were for the processing of the prior step (FIG. 43). Those next data inputs are referred to as current data inputs to distinguish from those processed for the prior step. Also, depending on the situation, the value of the feedback signal 2154 may or may not be different from the value of the next prior feedback signal 2154.

Figure 43:
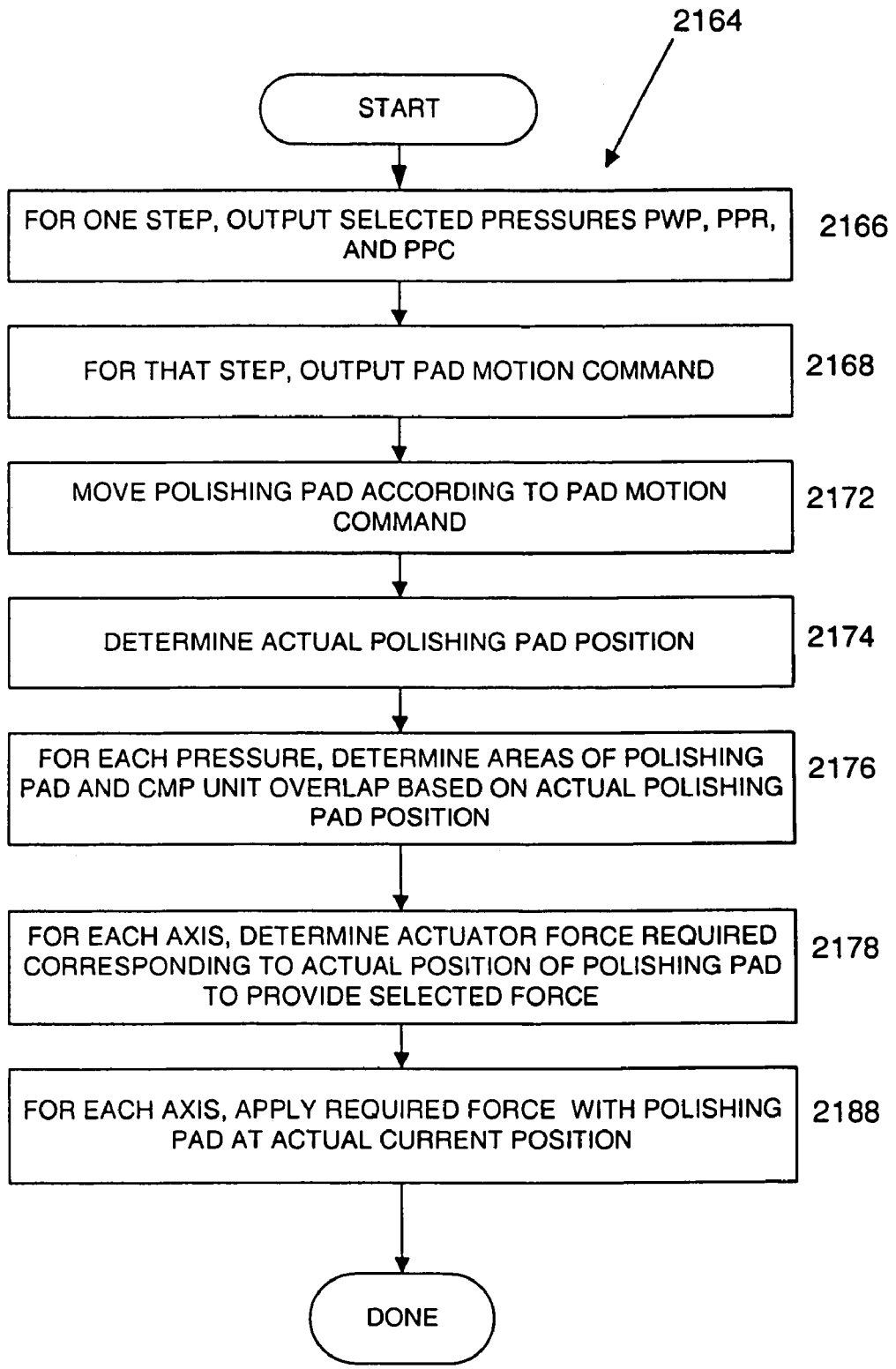
FIG. 43 is a flow chart illustrating operations of one of many polishing steps by which the systems of FIGS. 39 and 40 may provide respective central processing control of the polishing pressure, or off-board processing control of such pressure by use of the separate force controller.
Figure 44:
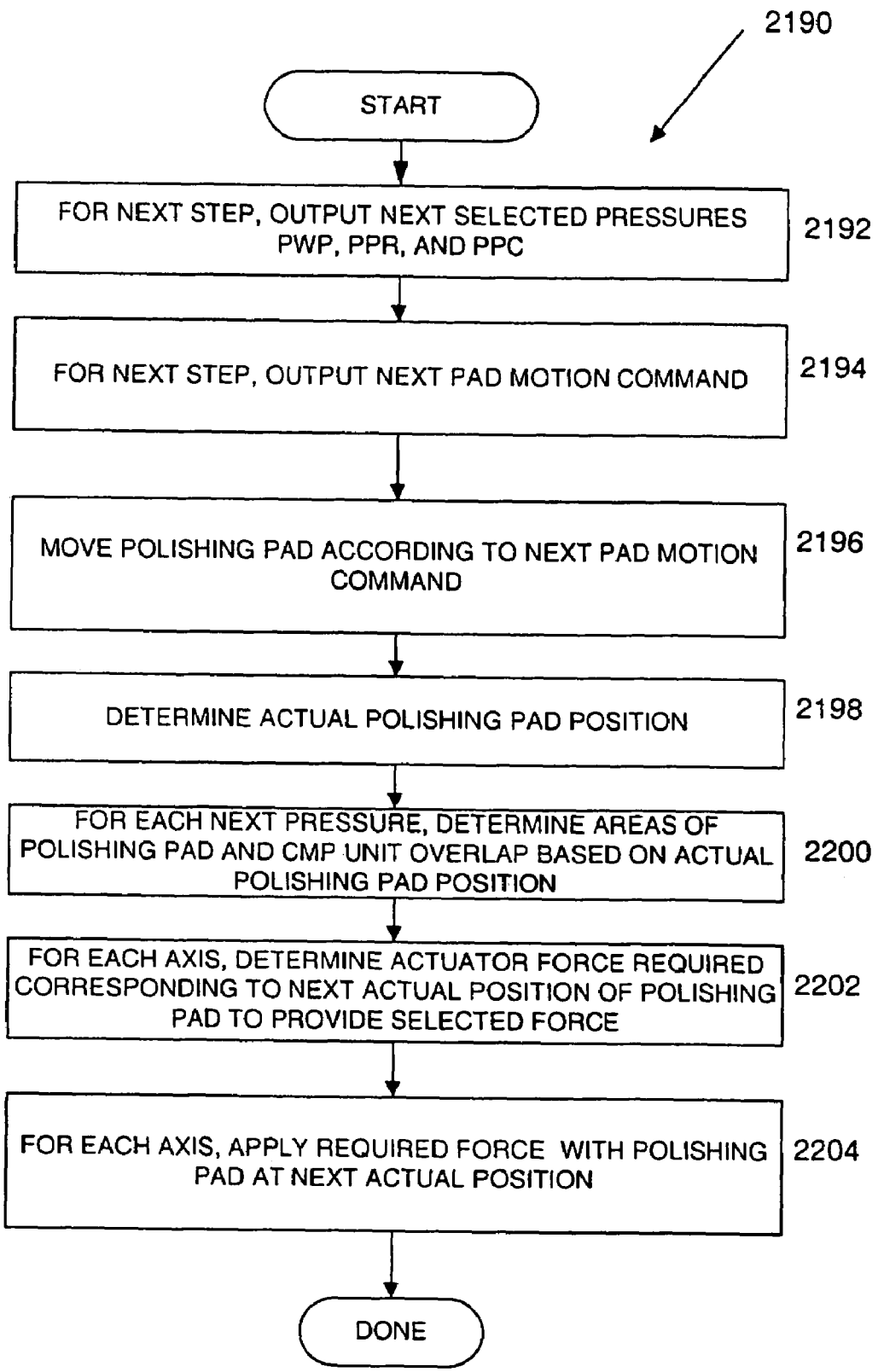
FIG. 44 is a flow chart illustrating operations of a second step by which the systems of FIGS. 39 and 40 may provide respective control of the polishing pressure.

FIG. 44 shows a flow chart 2190 of operations of the processor 2110, with the descriptions abbreviated where the description is similar to that of FIG. 43. Flow chart 2190 includes a first operation 2192, in which, for the next step in the sequence table, the pressures PWP, PPR, and PPC are sequentially output (represented by the pressure data 2152). Such pressures are again within the configuration criteria 2122.

The method moves to an operation 2194 in which a pad motion command is output. This command is in the form of the pad motion data 2150 output to the bus and to the pad motion system 2170. The method moves to operation 2196 in which the system 2170 moves the pad 209 relative to the wafer 206, to the carrier 208, and to the retainer ring 282. The pad motion data 2150 may, for example, provide that in this step there is to be polishing pad movement as described with respect to FIG. 42E, curve 2142. The method moves to an operation 2198 in which the actual position of the pad 209 is determined. This operation is performed by the encoder 2156 outputting the feedback signal 2154 via the bus 2144.

The method moves to operations 2200 and 2202 performed by the force controller 2120 of the processor 2110. The pad motion data 2150 and the pressure data 2152 have been received by the force controller 2120. In operation 2200, for each of the pressures PWP, PPR, and PPC, the Contact Area Program 2180 is again processed using the current feedback signal 2154. In succession, in operation 2200 the processing of the Contact Area Program 2180 determines data 2182 internal to the force controller 2120 representing the respective contact areas APW, APRR, and APC.

The method moves to operation 2202 in which the Force Program 2184 is again sequentially processed to determine the product of P times A for each of three sets of input data representing pressure P (based on the data 2152) and contact area A (based on the data 2182). In operation 2202 the processing of the three sets of P and A according to the Force Program 2184 results in sequential data representing the values of the forces FP-VW, FM and FP-C. The data 2186 representing these forces are output through the analog I/O device 2179.

The method moves to operation 2204 in which, for each axis (i.e., for the carrier 208, the retainer ring 282 and the puck 218) the output from the device 2179 representing the respective forces FP-VW, FM and FP-C drives the respective force actuator 2153W, 2153C, and 290. The respective forces FP-VW, FM and FP-C are output as described above to achieve the type and duration of CMP processing for this current step, and the method is done, indicating that this current step has been processed.

Having reviewed the flow charts 2164 and 2190, it may be understood that there may be millions of operations required to continually process the data for one CMP cycle until the last step has been processed. Moreover, the more the variables approach the limits of the configuration criteria 2122, the more the processing by the processor 2110 may approach a point at which the data for the actual CMP operations cannot be timely processed. If in the planning of which CMP system to use, it appears that such limits will be closely approached, then the system 2124 would be used.

Providing Controllable Pressures By Separately Processed Pressure Control

In the above descriptions of the systems 2100 and 2124, configuration criteria 2122 shown in Table 1 were provided for determining whether the available processing capacity of the PC 2102 is sufficient for the CMP operations for which one would select the system 2100. If such CMP operations would cause any of the configuration criteria 2122 to be exceeded, the system 2100 is not selected, and instead the second control system 2124 is selected. Referring to FIG. 40, the second control system 2124 may also include the PC 2102, which is in the second architecture 2300. With the second architecture 2300, the system 2124 will generally have access to sufficient available processing capacity of the PC 2102, and access to additional available processing capacity, to timely perform all of the processing required by the configuration criteria 2122 that the system 2100 does not meet. Such dual access relates primarily to a feature of the architecture 2300 in which there is a substantial reduction in the use of the available processing capacity of the PC 2102 arising out of the use of the separate force controller 2302. The separate force controller 2302 is not dependent on the PC 2102 for processing capacity, and, for example, is dedicated to the processing of operations 2176 and 2178 (FIG. 43) and the processing of operations 2200 and 2202 (FIG. 44). Secondarily, such access relates to data transfer and other protocols by which I/O delays between the processor 2110 of FIG. 40 and the force controller 2302 are minimized.

FIG. 40 shows the second architecture 2300 of the control system 2124 for controlling CMP operations to perform CMP of the wafer 206 according to another aspect of the present invention. The differences between the first control system 2100 and the second control system 2124 are noted in the following discussion. Architecturally, the PC 2102 is still provided with the same separate O/S 2104 and 2106. The PC 2102 may still be the personal computer having the rated processing capacity of the 600 MHz Pentium TM series processor or equivalent. The PC 2102 with the O/S 2104 is again referred to as the processor 2108. The PC 2102 with the O/S 2106 is referred to as a processor, or a machine control processor, and to emphasize that different functions are performed, the machine control processor of the second architecture 2300 is referred to by the reference number 2110-2.

The processor 2108 still performs the standard functions and the initialization functions that are not directly related to performing a CMP cycle. In the automatic mode, the recipes 2114 are the sets of all possible criteria related to a CMP process. The recipe editor 2116 is provided with the input by any standard input unit to select one recipe 2114 and enter into that selected recipe all of the process variables necessary to define one CMP process, including all of the CMP cycles, and the steps (with related variables) in a CMP cycle.

The machine control processor 2110-2 controls all of the other CMP operations, except for the processing of operations 2176 and 2178 (FIG. 43) and the processing of operations 2200 and 2202 (FIG. 44) to which the force controller 2302 is dedicated. Thus the machine control processor 2110-2 also controls rotation of the wafer carrier 208 and of the pad 209, and the horizontal motion of the pad head 202 (e.g., changes in the location of h3).

The architecture 2300 also includes an RS232 communication link 2304. To minimize I/O overhead of both the processor 2110-2 and of the force controller 2302, and in view of the use of the link 2304, the machine control processor 2110-2 performs an initialization method based on a flow chart 2310 shown in FIG. 41. The method moves to operation 2312 in which the machine control processor 2110-2 acquires the edited recipe 2114 (e.g., from the hard drive 2146). The method moves to operation 2314 in which the machine control processor 2110-2 executes the edited recipe 2114 and prepares a sequence of the steps of the CMP process, which may be in terms of the above-described table of sequences in which steps are taken to perform the CMP operations. The machine control processor 2110-2 also identifies a pressure profile, which is a specification of the pressures PWP, PPR, and PPC to be controlled during the CMP process. The method moves to operation 2316 in which the machine control processor 2110-2 outputs an initialization string 2317, including a command set 2320. The command set 2320 is structured for communication over the RS232 link 2304 to the force controller 2302, which is programmed to read the command set 2320. The command set 2320 has the structure shown in Appendix B, described below, and to minimize I/O processing time, is input to the force controller 2302 only once for each complete CMP cycle that is to be processed.

The method moves to operation 2319 in which a process start sequence is run. In operation 2319, the machine control processor 2110-2 processes data necessary to set up and operate the above-described hardware of the CMP system 200-1, including all axis motion data such as the pad motion data 2150 (see arrow 209H, FIG. 1B). The method moves to operation 2322 in which, based on the process sequence, the machine control processor 2110-2 outputs to the force controller 2302 instructions for the pressures PWP, PPR, and PPC to be controlled during the CMP process. The pressure instructions may be input sequentially, but are preferrably input simultaneously in view of the three axis processing capability of the force controller 2302, and the resulting ability to process the three axes at the same time. The process moves to operation 2324 which determines whether the last step of the process has been processed by the machine control processor 2110-2. If a YES answer is returned the method moves to an operation 2326 in which a process end sequence is performed, and then the process is done. If a NO answer is returned, operation 2322 is performed again and again until the last step has been processed.

The command set 2320 is shown in Appendix B, and is a low level set of parameters that are used by the force controller 2302 in processing the Contact Area Program 2180 and the Force Program 2184. Referring to Appendix B, the command set 2320 is shown including 35 exemplary parameters. Parameter H1 returns (or sets) the value of h1, which is the X axis coordinate of the center of the wafer 206. Parameter H2 returns (or sets) the value of h2, which is the X axis coordinate of the center of the retainer ring 282. Parameter R1 returns (or sets) the value of r1, described above as the radius of the wafer 206. Parameter R2 returns (or sets) the value of r2, which is the radius of the retainer ring 282. Parameter R3 returns (or sets) the value of r3, which is the radius of the polishing pad 209. Parameter R4 returns (or sets) the value of r4, which is the radius of the pad conditioning puck 218. Parameter GAP returns (or sets) the value of xgap, which is the distance between the edge of the retainer ring 282 and the edge of the pad conditioning puck 218. The value of h4 is recalculated based on the value of xgap.

In the second control system 2124 shown in FIG. 40 there is a second encoder (not shown) in the force controller 2302. The second encoder is synchronized with the encoder 2156 that outputs the signal 2154 indicating the position of the polishing pad 209. For purposes of such synchronization, a parameter POSEC returns the current position (in counts) of the second encoder, and parameter POSIN returns that current position in inches.

The motion of the polishing pad 209 should normally be within a defined range. The range is shown in FIGS. 1C-1 and 1E-1, where h3 ranges from r2 to (r2+r3), for example. Parameters EC1 and EC2 set respective left and right limits for the second encoder. Parameters IN1 and IN2 return, or set, such limits in terms of inches. To prevent operation in the event that such limits are exceeded, a parameter LIM defines the value of a maximum error in the x position h3 along the X axis of the polishing head 202 relative to the left and right limits. If this value of LIM is exceeded, the operation of the pad motion system 2170 will be stopped.

The parameters PWP, PRP, and PPC are used to set the pressures that are to be produced by the respective force actuators 2153W for the wafer carrier 208, and by the force actuator 290 for the retainer ring 282, and by the force actuator 2153C for the puck head 220. The parameter POW is the final parameter that is passed to initiate the calculation by the force controller 2302 of the forces to be applied to the respective force actuators 2153W, 290 and 2153C. The parameters NOP and NOZ are used in monitoring the system 2124. For example, in the event that it is necessary to stop any of the calculations without changing an output, NOP is used. NOZ is used to both stop any of the calculations and to set all of the outputs to zero.

The parameters V1, V2, and V3 are used in administering the system 2124. For example, for test purposes, these parameters will provide sample force voltages to drive the respective force actuators 2153W, 290 and 2153C. Parameter QUI is an exit to DOS.

The force controller 2302 is programmed to read the command set 2320 and to process each of the Contact Area Program 2180 and the Force Program 2184. For this purpose, the force controller 2302 may be a programmable signal processor (DSP) sold by Logosol, Inc. and having a per axis processing capacity of about that of a 486 series Intel TM processor or equivalent. This DSP processor 2302 has three axis, which means that the three axes may be processed at the same time TN. Further, because the force controller 2302 is dedicated to processing the data necessary to output the force data 2186 representing the forces FP-VW, FM and FP-C (shown in FIG. 40 respectively as FPW, FPR and FPC), and thus does not process any other data, the machine control processor 2110-2 does not have to use the processing capacity of the PC 2102 for processing the data necessary to output the force data 2186. As a result, the machine processor 2110-2 is relieved from the significant processing workload that the machine control processor 2110 of the first control system 2100 must perform in contention with the processor 2108 for available processor capacity. Moreover, it is expected that 0.25 milliseconds will be a typical aggregate (or total) amount of time for the force controller 2302 to simultaneously perform the operations 2176 and 2178 of FIG. 43 for the three axes (wafer force FP-W, and FP-R, and FP-C). This compares to an expectation that the processor 2110 would take about 15 milliseconds to process the same operations 2176 and 2178 of FIG. 43 for each of the three axes (wafer force FP-W, and FP-R, and FP-C). Given the large number of mips to be used to process the same operations 2176 and 2178 of FIG. 43 for each of the three axes and for each time these forces must be changed, the expected approximate 180 times saving in processing time is significant.

The foregoing indicates that such access of the machine control processor 2110-2 to sufficient available processing capacity of the PC 2102 relates primarily to the provision of the force controller 2302, because such controller 2302 is not dependent on the PC 2102 for processing capacity, and because such controller 2302 is dedicated to the processing of operations 2176 and 2178 (FIG. 43), and to the processing of similar operations 2200 and 2202 (FIG. 44). The foregoing also indicates that such access is secondarily based on the one-time data transfer of the initialization string 2317 and the command set 2320 via the RS232 link 2304. Therefore, the system 2124 presents less of a demand on the processing capacity of the PC 2102 as compared to the system 2100, which gives priority to the processing by the O/S 2106 of all operations necessary to perform the CMP cycles of the CMP process.

Figure 41:
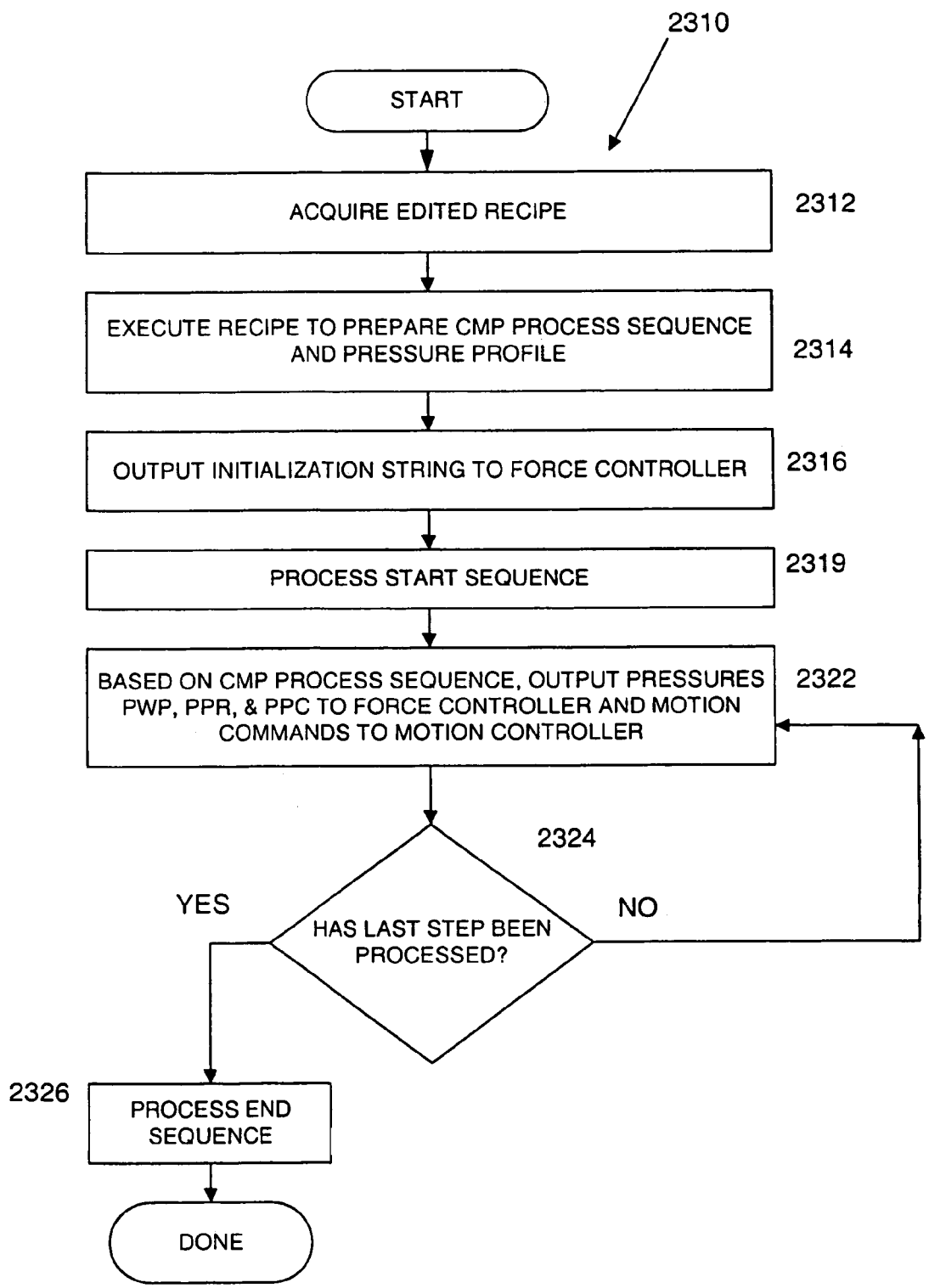
FIG. 41 is a flow chart illustrating a portion of the operations by which the system of FIG. 40 controls the polishing pressure.

It may be understood then, that the second control system 2124 performs operations of a method similar to that of the system 2100 shown in FIGS. 43 and 44, except as described with respect to FIG. 41. In particular, while the processing of CMP data may be done entirely in the machine control processor 2110 in the system 2100 as described, and while the processing of the CMP data in the system 2124 is shared between the machine control processor 2110-2 and the force controller 2302 as described, in each system 2100 and 2124 the operations 2176 and 2178 of FIG. 43 are performed. Those operations 2176 and 2178 are also similarly performed numerous times with data that is current for the step that is being processed. Thus for the operations 2176 and 2178, for example, the input data includes possibly different values of the feedback signal 2154 representing the actual position of the pad 209 relative to the wafer 206 or to the puck 218, and includes corresponding values of the pressure data 2152. In the operation of the second control system 2124, such input data may represent any of the situations described with respect to FIGS. 42A through 42E, for example, as well as other CMP processing situations.

Figure 45:
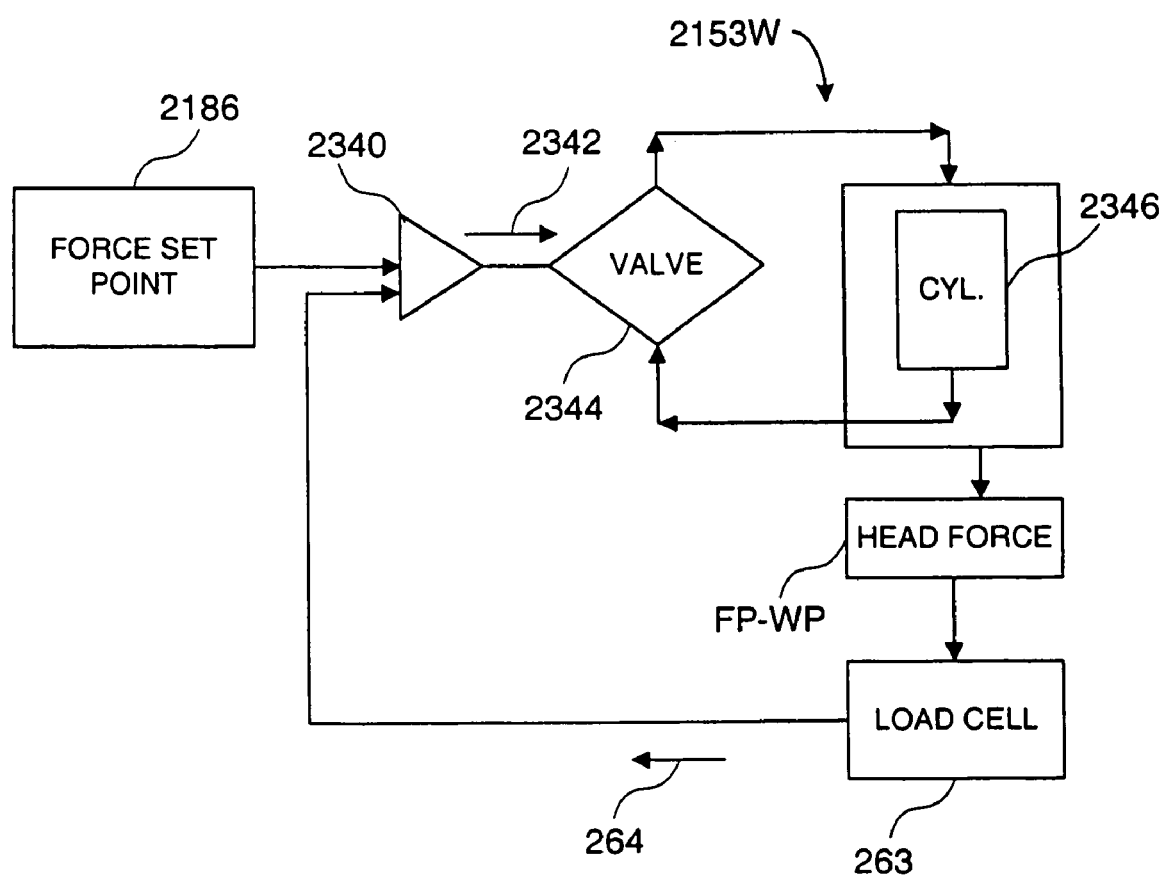
FIG. 45 is a schematic diagram of a servo system for controlling the force applied to a wafer polishing head using a differential air pressure system.
Figure 46:
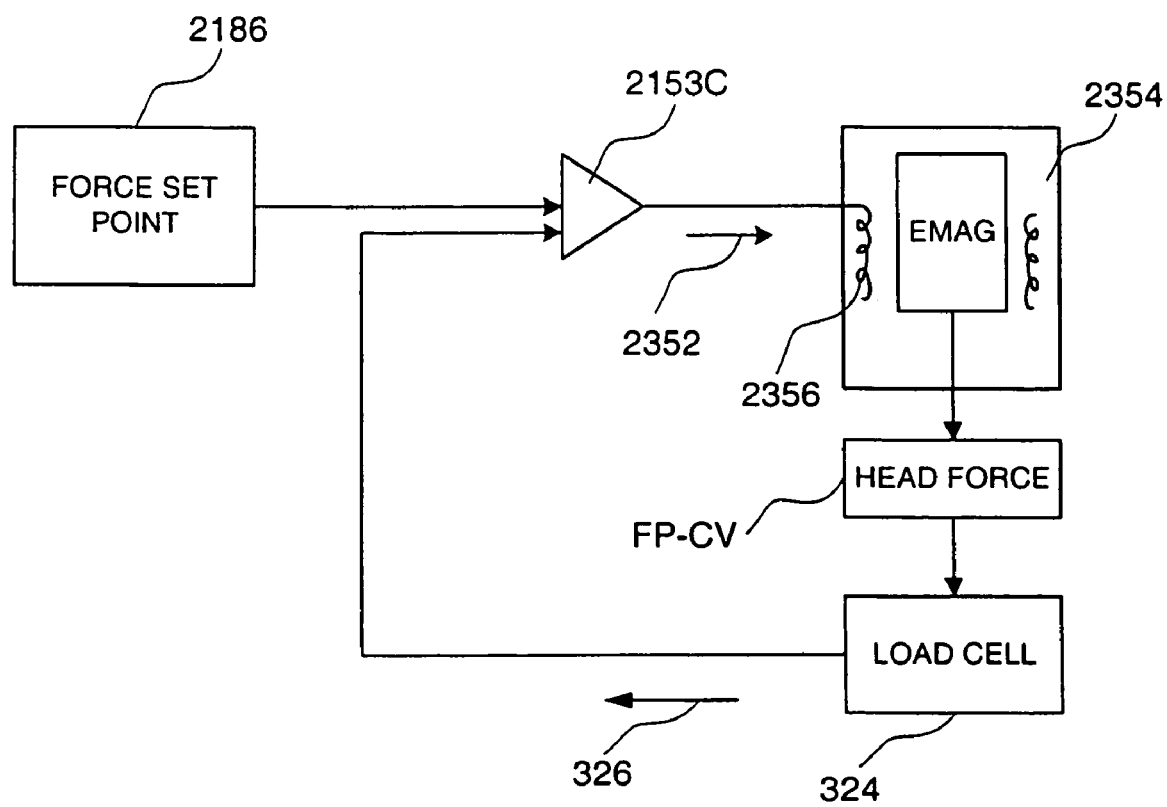
FIG. 46 is a schematic diagram of a servo system for controlling the force applied to a wafer polishing head using an electromagnetic pressure system.

FIGS. 39 and 40 show the force actuators 2153W, 2153C, and 290. The force actuator 290 is described in detail above, and may have air pressure supplied according to the output of force data 2186. Each of the force actuators 2153W and 2153C may be as shown in FIGS. 45 or 46. For convenience, FIG. 45 is described with respect to the actuator 2153W. To provide the force corresponding to the force data 2186 for the wafer 206, that force data 2186 is applied to a differential amplifier 2340. The differential amplifier 2340 is also provided with the load cell signal 264 from the wafer carrier 208. The signal 264 represents the actual force FP-WP on the carrier 208. To the extent that such force data 2186 and the signal 264 represent different forces, then the amplifier 2340 will output a signal 2342 representing the change in the force required at the time of the step that is being processed. The signal 2342 actuates a valve, such as a pneumatic valve 2344 connected to opposite sides of a piston of a cylinder 2346. The air from the valve 2344 may drive the piston (not shown) of the cylinder 2346 either of two ways in response to the differential signal 2342 so as to adjust the force FP-WP. In turn, the load cell 263 senses the adjusted actual force.

While the actuator 2153C may be the same as described with respect to FIG. 45, an electromagnetic force actuator 2153C is shown in FIG. 46. The electromagnetic force actuator 2153C may be used for the actuator 2153W, and may be as disclosed in U.S. Pat. No. 6,083,082 dated Jul. 4, 2000. To provide the force FP-CV, for example, corresponding to the force data 2186 for the puck 218, the corresponding force data 2186 is applied to a differential amplifier 2350. The differential amplifier 2350 is also provided with the load cell signal 326 from the load cell 324 of the puck head 220. The signal 326 represents the actual force FP-CV on the head 220. To the extent that such force data 2186 and the signal 326 represent different forces, then the amplifier 2350 will output a signal 2352 representing the change in the force required at the time of the step that is being processed. The signal 2352 actuates a coil 2356 of an electromagnetic motor 2354 that may be actuated to move up or down as shown in FIG. 46 to adjust the force FP-CV. In turn, the load cell 324 senses the adjusted actual force.

The structure shown in either of FIGS. 45 or 46 may be provided for the pad motion system 2360 (FIG. 40). Thus, the head 202 may be moved by either a pneumatic or an electromagnetic facility to provide the described pad motion.

Figure 47:
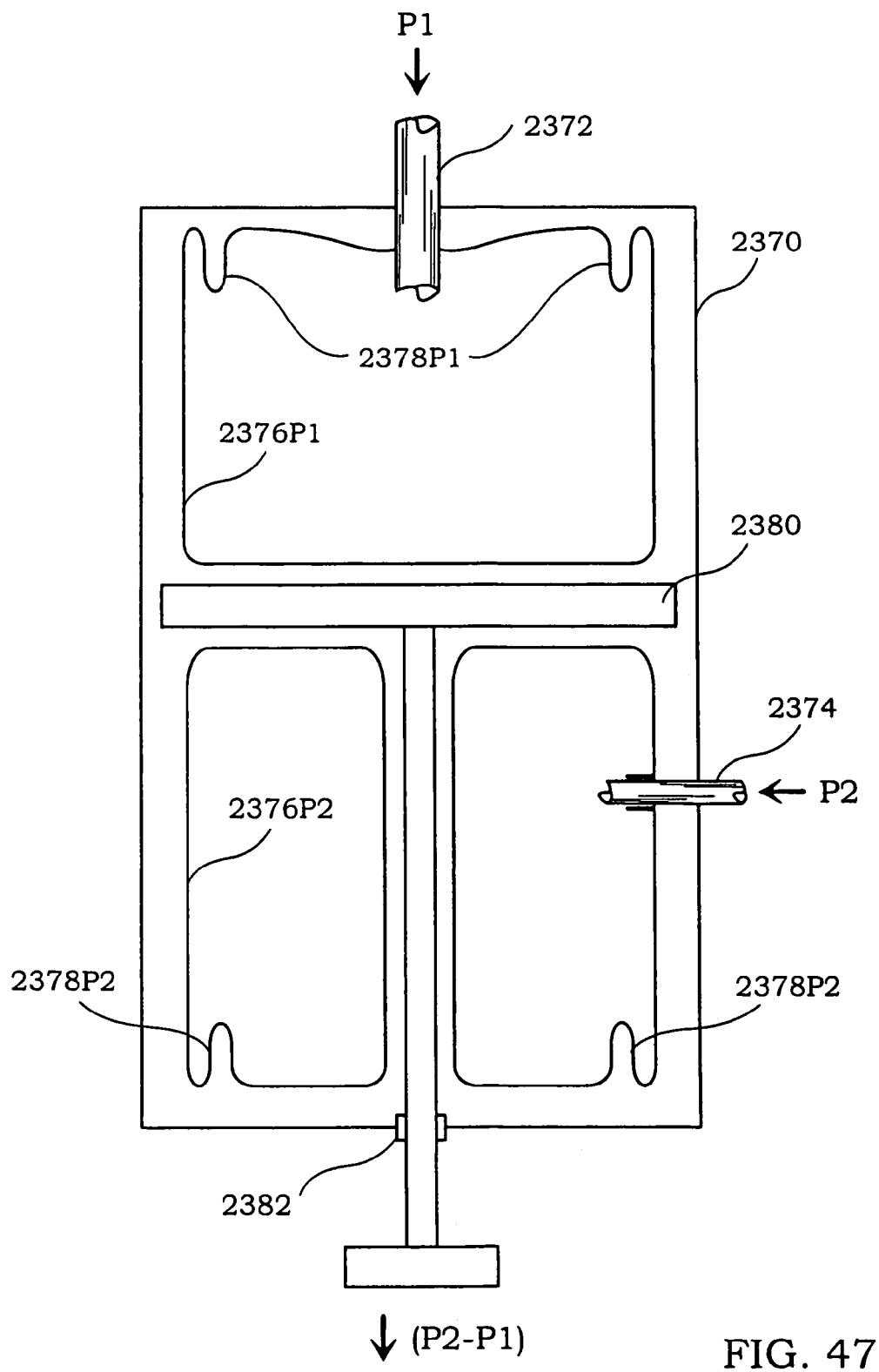
FIG. 47 is a schematic diagram of a differential air pressure system that may be used with the apparatus shown in FIG. 45.
Figure 48:
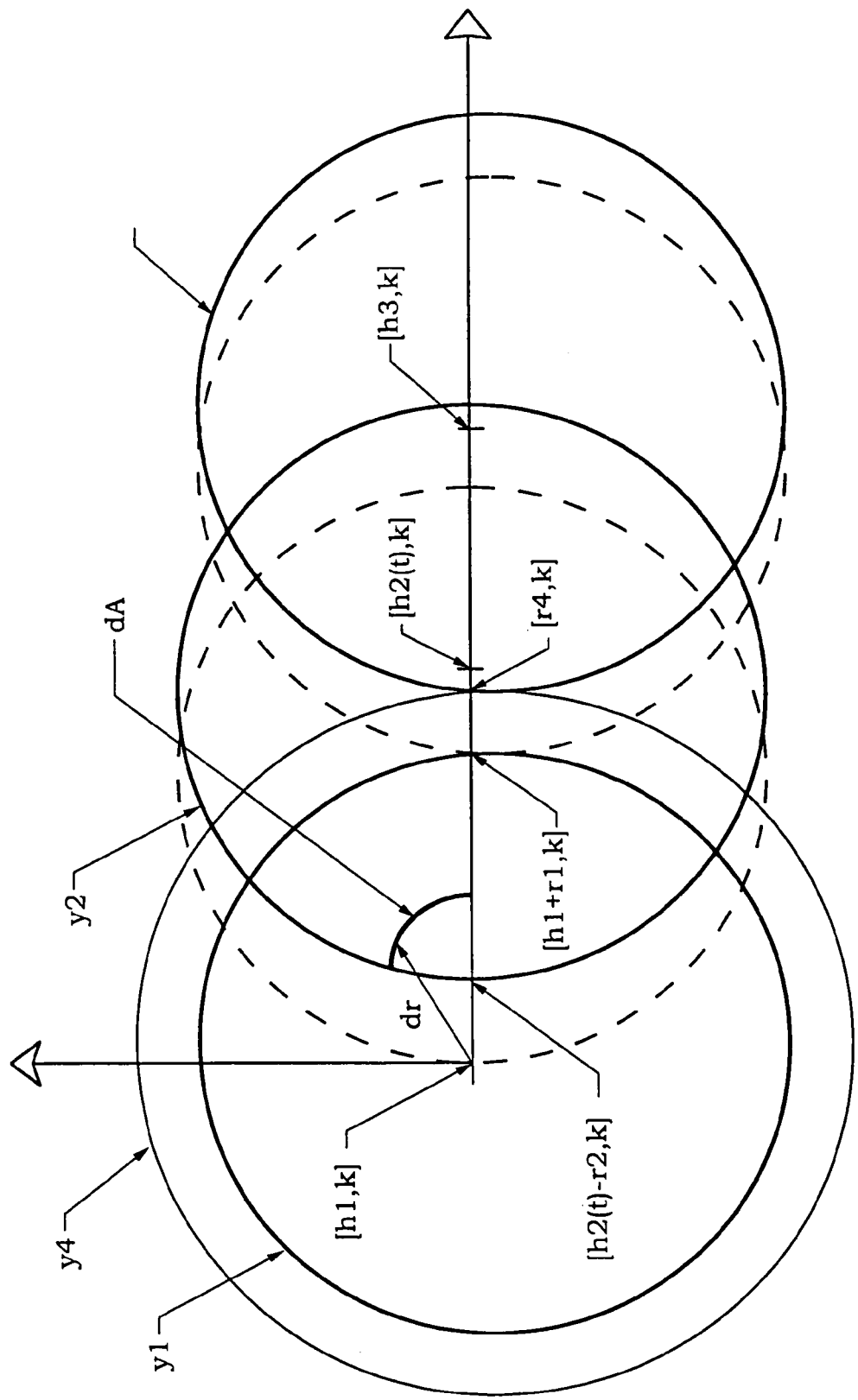
FIG. 48 is a plan view schematically showing relationships of the pad, the wafer, the puck, and the retainer ring as referred to in the Contact Area Program and Force Program set forth in Appendix C.

FIG. 47 shows a most preferred embodiment of the force actuators 2153W and 2153C. In particular, while the amplifier 2340 shown in FIG. 45 may be used with the valve 2344, FIG. 47 shows another structure of the air cylinder, referred to as a double acting rolling diaphragm cylinder 2370. The cylinder 2370 may be of the type supplied by Control Air and also has a differential pressure actuation via pressure input ports 2372 (for P1) and 2374 (for P2). Each port 2372 and 2374 is connected to a respective one of two rolling diaphragms 2376P1 and 2376P2. Each diaphragm 2376 has a diameter having a value less than that of the cylinder 2370, and an invaginated section 2378. Each section 2378 may under the respective pressure P1 or P2 fold further into itself, or unfold from itself. In more detail, when the pressure P1 exceeds the pressure P2, the section 2378P1 will unfold and lengthen, forcing a piston 2380 downwardly (in FIG. 47) to provide the desired force in one direction. When the pressure P2 exceeds the pressure P1, the section 2378P2 will unfold and lengthen, forcing the piston 2380 upwardly (in FIG. 47) to provide the desired force in the other direction. A linear bearing 2382 is provided between the cylinder 2370 and the rod of the piston 2380.

Using the cylinder 2370 instead of the cylinder 2346 in FIG. 45 to provide the force corresponding to the force data 2186 for the wafer 206, that force data 2186 is applied to the differential amplifier 2340. The differential amplifier 2340 is provided with the load cell signal 264 from the wafer carrier 208. To the extent that such force data 2186 and the signal 264 represent different forces, then the amplifier 2340 will output the signal 2342 representing the change in the force required at the time of the step that is being processed. The signal 2342 actuates the valve 2344. In turn, the load cell 263 senses the adjusted actual force.

APPENDICES A, B AND C

APPENDIX A

VARIABLES USED TO DETERMINE PRESSURE AS A FUNCTION OF CONTACT AREA 1. h1 value. Default value 0.
2. h2 value. Default value 0.
3. r1 value. Default value 3.937008 in (100 mm).
4. r2 value, recalculate h4. Default value 4.75 in.
5. r3 value. Default value 4.75 in.
6. r4 value, recalculate h4. Default value 4.75 in.
7. Xgap value, recalculates h4. Default value 0.1 in.
8. value of Pwp. Default value 10.
9. value of Prp. Default value 10.
10. value of Ppc. Default value 10.
11. current value of Fwp. Default value 0.
12. current value of Frp. Default value 0.
13. current value of Fpc. Default value 0.
14. enables the calculation of forces.
15. disables the calculation of forces. Does not change the outputs.
16. disables the calculation of forces and sets all outputs to V0 (0 V DC).

APPENDIX B

Command Set
1. H1 – returns or sets h1 value. Default value 0.
2. H2 – returns or sets h2 value. Default value 0.
3. R1 - returns or sets r1 value. Default value 3.937008 in (100 mm).
4. R2 – returns or sets r2 value and recalculates h4. Default value 4.75 in.
5. R3 – returns or sets r3 value. Default value 4.75 in.
6. R4 – returns or sets r4 value and recalculates h4. Default value 4.75 in.
7. GAP – returns or sets Xgap value and recalculates h4. Default value 0.1 in.
8. POSEC – returns current position in encoder counts.
9. POSIN – returns current position in inches.
10. EC1 – returns or sets left limit for the encoder.
11. EC2 – returns or sets right limit for the encoder.
12. LIM – maximum error in encoder counts below EC1 or above EC2.
13. IN1 – returns or sets left limit in inches (corresponds to EC1). Default value 4.75 in.
14. IN2 – returns or sets right limit in inches (corresponds to EC2).
15. WP1 – returns or sets the value of Fwp, which corresponds to 0 V DC. Default value 0.
16. WP2 – returns or sets the value of Fwp, which corresponds to 10 V DC. Default value Fwp( Pwp=10, h3=r2).

17. RP1 – returns or sets the value of Frp, which corresponds to 0 V DC. Default value 0.
18. RP2 – returns or sets the value of Frp, which corresponds to 10 V DC. Default value Frp( Prp=10, h3=r2).
19. PC1 – returns or sets the value of Fpc, which corresponds to 0 V DC. Default value 0.
20. PC2 – returns or sets the value of Fpc, which corresponds to 10 V DC. Default value Fpc( Ppc=10, h3=r2+r1).
21. PWP – returns or sets the value of Pwp. Default value 10.
22. PRP – returns or sets the value of Prp. Default value 10.
23. PPC – returns or sets the value of Ppc. Default value 10.
24. FWP – returns the current value of Fwp. Default value 0.
25. FRP – returns the current value of Frp. Default value 0.
26. FPC – returns the current value of Fpc. Default value 0.
27. V0 – returns or sets the minimum output voltage. Default value 0800h (0 V DC).
28. V10 – returns or sets the maximum output voltage. Default value 0fffh (10 V DC).
29. POW – enables the calculation of forces.
30. NOP – disables the calculation of forces. Does not change the outputs.
31. NOZ – disables the calculation of forces and sets all outputs to V0 (0 V DC).
32. V1 – outputs a given value in volts to the first board. Works only when the calculations of forces are disabled.
33. V2 – outputs a given value in volts to the second board. Works only when the calculations of forces are disabled.
34. V3 – outputs a given value in volts to the third board. Works only when the calculations of forces are disabled.
35. QUI – exits to DOS.

APPENDIX C

Given:

(a) Wafer outer diameter. Circle of diameter r1 centered on point [0,0].

$h_1 := 0 \cdot in$ ; x-coordinate of wafer head center.

$r_1 := 100 \cdot mm$ ; radius of wafer $y_1(x) := \sqrt{-x^2 + 2 \cdot x \cdot h_1 - h_1^2 + r_1^2}$ ; equation of wafer outer diameter.

(b) Retainer ring outer diameter. Circle of diameter r2 centered on point [0,0].

$h_2 := 0 \cdot in$ ; x-coordinate of retainer ring center.

$r_2 := 4.75 \cdot in$ ; radius of retainer ring $y_2(x) := \sqrt{-x^2 + 2 \cdot x \cdot h_2 - h_2^2 + r_2^2}$ ; equation of retainer ring outer diameter.

(c) Pad outer diameter. Circle of diameter r3, the center of which can range from point [r2,0] to point [r2+r1, 0].

$h_3 := r_2, (r_2 + 0.25 \cdot in) .. (r_2 + r_1)$ ; x-coordinate of pad center.

$r_3 := 4.75 \cdot in$ ; radius of pad.

$y_3(x, h_3) := \sqrt{-x^2 + 2 \cdot x \cdot h_3 - h_3^2 + r_3^2}$ ; equation of pad outer diameter.

(d) Pad conditioner outer diameter. Circle of diameter r4 centered on point [r2+xgap+r4,0]

$x_{gap} := 0.1 \cdot in$ ; gap between retainer ring and conditioner head.

$r_4 := 4.75 \cdot in$ ; radius of pad conditioner.

$h_4 := r_2 + x_{gap} + r_4$ ; x-coordinate of pad conditioner center.

$y_4(x) := \sqrt{-x^2 + 2 \cdot x \cdot h_4 - h_4^2 + r_4^2}$ ; equation of pad conditioner outer diameter

Find:

APPENDIX C (a) A function that represents the area intersection of circle r3 and circle r1 as the center of r3 varies from [r2,0] to [ 2(r2), 0].

(b) A function that represents the area intersection of circle r3 and circle r2 as the center of r3 varies from [r2,0] to [ 2(r2), 0].

(c) A function that represents the area intersection of circle r3 and circle r4 as the center of r3 varies from [r2,0] to [ 2(r2), 0].

Solution:

Generic Circle Equation:

$$(x - h)^2 + (y - k)^2 = r^2$$

or  $y(x) = k + \sqrt{-x^2 + 2 \cdot x \cdot h - h^2 + r^2}$   for the positive side of the curve only.

Intersection of two generic circle curves:

$k_1 = k_2 = 0$   ; The center of both circles lie on the x-axis.

$(x_1 - h_1)^2 + y_1^2 = r_1^2$   ; equation of curve 1

$(x_2 - h_2)^2 + y_2^2 = r_2^2$   ; equation of curve 2

APPENDIX C $$r_1^2 - (x_1 - h_1)^2 = r_2^2 - (x_2 - h_2)^2 \qquad ; \text{because:} \quad y_1 = y_2$$

$$r_1^2 - (x_{int} - h_1)^2 = r_2^2 - (x_{int} - h_2)^2 \qquad ; \text{because:} \quad x_1 = x_2 = x_{int}$$

$$\boxed{x_{int} = \frac{-1}{2} \cdot \frac{\left(r_1^2 - h_1^2 - r_2^2 + h_2^2\right)}{(h_1 - h_2)}} \qquad ; \text{This is the x coordinate of the intersection point of the two circles.}$$

The area of a segment of a circle is given by the following formula:

$$A_s = \frac{r^2 \cdot \left[\left(\frac{\pi \cdot \theta}{180}\right) - \sin(\theta)\right]}{2} \qquad \text{where theta is in degrees.}$$

but using the pythagorean theorem:

$$\sin\left(\frac{1}{2} \cdot \theta\right) = \frac{\sqrt{-x^2 + 2 \cdot x \cdot h - h^2 + r^2}}{r^2}$$

solving for the angle theta:

$$\theta = 2 \cdot \operatorname{asin}\left[\frac{\left(-x^2 + 2 \cdot x \cdot h - h^2 + r^2\right)^{\left(\frac{1}{2}\right)}}{r}\right]$$

APPENDIX C substituting the angle into the segment formula above:

$$A_s = \frac{r^2 \cdot (\theta - \sin(\theta))}{2}$$ where theta is in radians.

$$A_s = \frac{1}{2} \cdot r^2 \cdot \left[ 2 \cdot \operatorname{asin}\left[ \frac{(-x^2 + 2 \cdot x \cdot h - h^2 + r^2)^{\left(\frac{1}{2}\right)}}{r} \right] - \sin\left[ 2 \cdot \operatorname{asin}\left[ \frac{(-x^2 + 2 \cdot x \cdot h - h^2 + r^2)^{\left(\frac{1}{2}\right)}}{r} \right] \right] \right]$$

where:  x is the distance from the origin of the intersecting chord and h is the x-coordinate of the circle.

Intersection of wafer with pad $$x_{wp}(h_3) := \frac{-1}{2} \cdot \frac{\left(r_1^2 - h_1^2 - r_3^2 + h_3^2\right)}{(h_1 - h_3)}$$

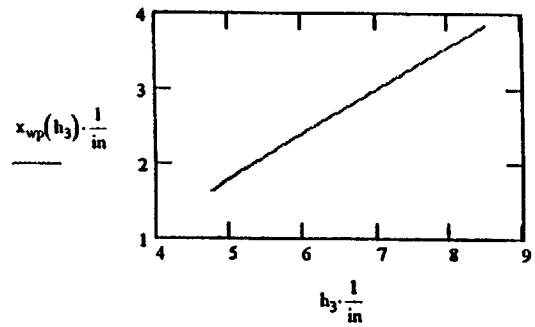

APPENDIX C $$A_w(x_{wp}) := \frac{1}{2} \cdot r_1^2 \left[ 2 \cdot \text{asin} \left[ \frac{\left(-x_{wp}^2 + 2 \cdot x_{wp} \cdot h_1 - h_1^2 + r_1^2\right)^{\left(\frac{1}{2}\right)}}{r_1} \right] - \sin\left[ 2 \cdot \text{asin} \left[ \frac{\left(-x_{wp}^2 + 2 \cdot x_{wp} \cdot h_1 - h_1^2 + r_1^2\right)^{\left(\frac{1}{2}\right)}}{r_1} \right] \right] \right]$$

$$A_{pl}(x_{wp}, h_3) := \frac{1}{2} \cdot r_3^2 \left[ 2 \cdot \text{asin} \left[ \frac{\left(-x_{wp}^2 + 2 \cdot x_{wp} \cdot h_3 - h_3^2 + r_3^2\right)^{\left(\frac{1}{2}\right)}}{r_3} \right] - \sin\left[ 2 \cdot \text{asin} \left[ \frac{\left(-x_{wp}^2 + 2 \cdot x_{wp} \cdot h_3 - h_3^2 + r_3^2\right)^{\left(\frac{1}{2}\right)}}{r_3} \right] \right] \right]$$

thus, the area of intersection of the wafer with the pad is equal to:

$$A_{wp}(x_{wp}, h_3) := \left(A_w(x_{wp}) + A_{pl}(x_{wp}, h_3)\right)$$

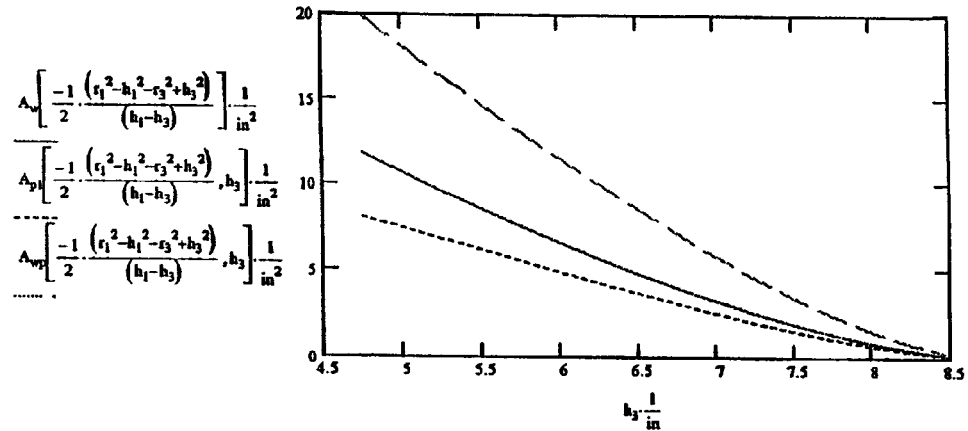

APPENDIX C

*Intersection of retainer ring with pad*

$$x_{rp}(h_3) := \frac{-1}{2} \cdot \frac{\left(r_2^2 - h_2^2 - r_3^2 + h_3^2\right)}{\left(h_2 - h_3\right)}$$

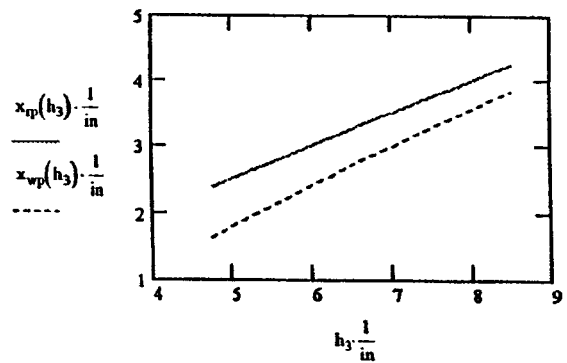

$$A_r(x_{rp}) := \frac{1}{2} \cdot r_2^2 \left[ 2 \cdot \text{asin}\left[\frac{\left(-x_{rp}^2 + 2 \cdot x_{rp} \cdot h_2 - h_2^2 + r_2^2\right)^{\left(\frac{1}{2}\right)}}{r_2}\right] - \sin\left[2 \cdot \text{asin}\left[\frac{\left(-x_{rp}^2 + 2 \cdot x_{rp} \cdot h_2 - h_2^2 + r_2^2\right)^{\left(\frac{1}{2}\right)}}{r_2}\right]\right]\right]$$

The area of intersection of the retainer ring with the pad is equal to:

$$A_{rp}(x_{rp}, x_{wp}, h_3) := 2 \cdot A_r(x_{rp}) - A_{wp}(x_{wp}, h_3)$$

APPENDIX C

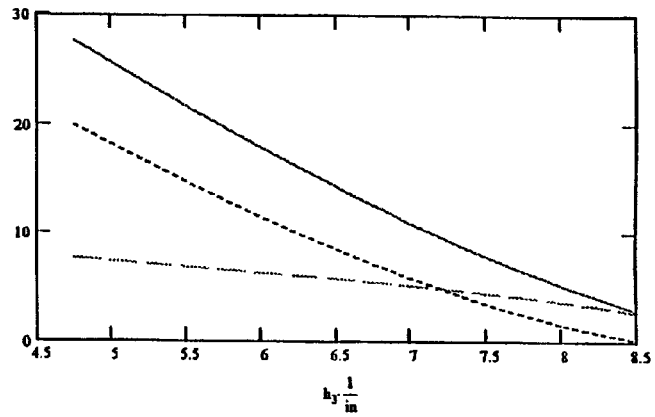

$$2 \cdot A \left[ \frac{-1}{2} \cdot \frac{\left( r_2^2 - h_2^2 - r_3^2 + h_3^2 \right)}{\left( h_2 - h_3 \right)} \right] \frac{1}{in^2}$$

$$A_w \left[ \frac{-1}{2} \cdot \frac{\left( r_1^2 - h_1^2 - r_3^2 + h_3^2 \right)}{\left( h_1 - h_3 \right)}, h_3 \right] \frac{1}{in^2}$$

$$A_p \left[ \frac{-1}{2} \cdot \frac{\left( r_2^2 - h_2^2 - r_3^2 + h_3^2 \right)}{\left( h_2 - h_3 \right)}, \frac{-1}{2} \cdot \frac{\left( r_1^2 - h_1^2 - r_3^2 + h_3^2 \right)}{\left( h_1 - h_3 \right)}, h_3 \right] \frac{1}{in^2}$$

Intersection of Pad with Pad conditioner:

$$x_{pc}(h_3) := \frac{-1}{2} \cdot \frac{\left( r_3^2 - h_3^2 - r_4^2 + h_4^2 \right)}{\left( h_3 - h_4 \right)}$$

$$A_{p3}(x_{pc}, h_3) := \frac{1}{2} \cdot r_3^2 \left[ 2 \cdot \operatorname{asin}\left[ \frac{\left( -x_{pc}^2 + 2 \cdot x_{pc} \cdot h_3 - h_3^2 + r_3^2 \right)^{\left(\frac{1}{2}\right)}}{r_3} \right] - \sin\left[ 2 \cdot \operatorname{asin}\left[ \frac{\left( -x_{pc}^2 + 2 \cdot x_{pc} \cdot h_3 - h_3^2 + r_3^2 \right)^{\left(\frac{1}{2}\right)}}{r_3} \right] \right] \right]$$

APPENDIX C
The area of intersection of the pad with the pad conditioner is equal to:
$$A_{pc}(x_{pc}, h_3) := 2 \cdot A_{p3}(x_{pc}, h_3)$$
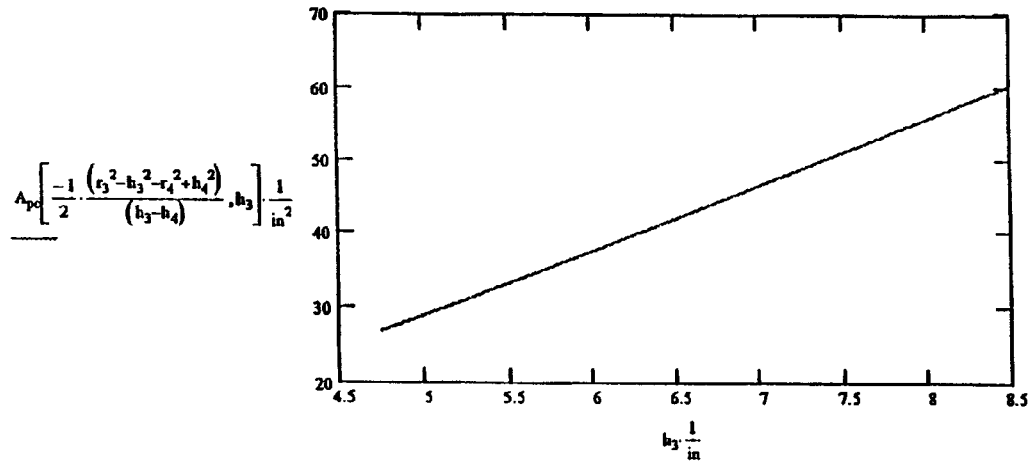
$$A_{pc}\left[\frac{-1}{2} \cdot \frac{(r_3^2 - h_3^2 - r_4^2 + h_4^2)}{(h_3 - h_4)}, h_3\right] \cdot \frac{1}{in^2}$$
$$h_3 \cdot \frac{1}{in}$$
Force versus Pad position for all three force axis:
$$P = \frac{F}{A} \qquad i := 0..2$$

APPENDIX C $P_w := 0 \cdot psi, 1 \cdot psi .. 10 \cdot psi$ $P_{w_i} :=$

| |
|---|
| 0·psi |
| 1·psi |
| 2·psi |

$P_o := 0 \cdot psi, 0.1 \cdot psi .. 2 \cdot psi$ $P_r := 0 \cdot psi, 0.1 \cdot psi .. 10 \cdot psi$ $F(A, P_w) := P_w \cdot A$ $$F\left[\left[A_{pc}\left[\frac{-1}{2} \cdot \frac{(r_3{}^2 - h_3{}^2 - r_4{}^2 + h_4{}^2)}{(h_3 - h_4)}, h_3\right]\right], P_w\right]_i =$$

| |
|---|
| 0 |
| 0 |
| 0 |
| 0 |
| 0 |
| 0 |
| 0 |
| 0 |
| 0 |
| 0 |
| 0 |
| 0 |
| 0 |
| 0 |
| 0 |
| 0 | lbf $$\left[A_{pc}\left[\frac{-1}{2} \cdot \frac{(r_3{}^2 - h_3{}^2 - r_4{}^2 + h_4{}^2)}{(h_3 - h_4)}, h_3\right]\right] =$$

| |
|---|
| 26.895 |
| 28.956 |
| 31.05 |
| 33.178 |
| 35.335 |
| 37.519 |
| 39.73 |
| 41.964 |
| 44.219 |
| 46.494 |
| 48.787 |
| 51.096 |
| 53.419 |
| 55.754 |
| 58.1 |
| 60.456 |

$in^2$ $P_{w_i} =$

| |
|---|
| 0 |
| 1 |
| 2 | psi

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. Apparatus for processing data for controlling a pressure to be applied to contact areas of a wafer and a polishing pad during a step in chemical mechanical polishing operations, the apparatus comprising:
- a first processor programmed to provide pressure data representing the pressure to be applied to the contact areas during a polishing step; and
- a second processor programmed to process data representing relative movement between the wafer and the pad in overlapped contacting positions for providing area data representing a value of the contact areas between the wafer and the pad in the overlapped positions;
- the second processor being further programmed to process the area data and the pressure data for providing force data representing the force to be applied to the contact areas during the polishing step of the sequence.

2. Apparatus as recited in claim 1, wherein the second processor has a processing capacity sufficient for real-time control of the pressure to be applied to the contact areas of the wafer and of the polishing pad during the chemical mechanical polishing operations, the sufficiency of the processing capacity being determined according to values of variations in the pressure, the time rate of change of the pressure, the frequency of the relative movement between the wafer and the pad into the overlapped positions, the rate of the relative movement, and processing points describing non-time-related actions during the chemical mechanical polishing operations.

3. Apparatus as recited in claim 1, wherein the second processor is programmed to only process the data representing the relative movement between the wafer and the pad in the overlapped contacting positions for providing the area data representing the value of the contact area between the wafer and the pad in the overlapped positions, and the area data, and the pressure data.

4. Apparatus as recited in claim 1, wherein each of the wafer and the pad is configured as a disk with the respective contact areas defined in terms of the radius of a circle, and wherein:
- the programming of the second processor defines possible overlapped contact areas of the circles of each of the wafer and the pad in terms of only one variable, the variable being the relative position of the wafer and the pad; and
- the programming of the second processor further defining the force in terms of only data representing the value of the contact areas and of the pressure.

5. Apparatus as recited in claim 1, wherein there is a sequence of the data representing the relative movement between the wafer and the pad into successive overlapped positions, and wherein there is a pressure data item corresponding to each movement data item, and wherein:
- the first processor is programmed to process each sequential item of movement data;
- the first processor is programmed to input to the second processor one relative movement item of data at a time, with the one item being input with all of the items of pressure data corresponding to the one relative movement item; and
- the second processor is programmed to simultaneously process the one item of movement data and the corresponding items of pressure data.

6. Apparatus for controlling a first pressure to be applied to first contact areas of a wafer and a polishing pad in chemical mechanical polishing operations, the pressure being applied according to force data specifying the value of forces to be applied to first contact areas, the apparatus comprising:
- a drive system configured to cause relative movement between the wafer and the pad into overlapped positions;
- a central processor for processing data to specify the chemical mechanical polishing operations, the data including a command to the drive system to cause the relative movement, the data further representing the pressure to be applied to the first contact areas of the wafer and the polishing pad;
- a feedback circuit for providing output signals representing increments of the relative movement; and
- a force control processor separate from the central processor, the force control processor being responsive to both the pressure data and the output signals representing actual values of the relative movement, the force control processor successively processing a contact area program and a force program to provide force data representing the force to be applied to one of the first contact areas of the wafer and the pad.

7. Apparatus as recited in claim 6, wherein the force control processor provides the force data in two stages, a first stage being in response to one of the output signals to provide area data representing a value of the contact areas, a second of the stages being in response to the pressure data and to the area data to provide the force data.

8. Apparatus as recited in claim 6, further comprising:
- a carrier for the wafer, the carrier including a linear bearing assembly resisting a tendency of the wafer to tilt in response to the force; the assembly further including a sensor mounted on the linear bearing assembly in a position to sense the force on the contact area, the sensor providing an accurate indication of an amount of the force.

9. Apparatus as recited in claim 6, wherein a retainer ring is provided for orienting the wafer, wherein the apparatus further controls a second pressure to be applied to second contact areas of the ring and the pad, wherein the relative movement causes relative movement of the ring and the pad, and wherein:
- the central processor further processes second pressure data representing a value of the second pressure; and
- the force control processor is further responsive to the second pressure data and to the output signals representing the relative movement of the wafer and the pad, the force control processor further successively processes the contact area program and the force program to provide second force data representing the force to be applied to the second contact areas of the ring and the pad.

10. Apparatus as recited in claim 6, wherein a pad conditioning puck is provided for conditioning the pad, wherein the apparatus further controls a second pressure to be applied to second contact areas of the puck and the pad, wherein the relative movement causes relative movement of the puck and the pad, and wherein:
- the central processor further processes second pressure data representing a value of the second pressure; and
- the force control processor is further responsive to the second pressure data and to the output signals representing the relative movement of the wafer and the pad, the force control processor further successively processes the contact area program and the force program to provide second force data representing the force to be applied to the second contact areas of the puck and the pad.

11. Apparatus for maintaining a constant pressure to be applied to respective contact areas of a wafer and of a polishing pad in chemical mechanical polishing operations, the apparatus comprising:
    a drive for causing relative movement between the wafer and the pad into a plurality of different overlapped positions;
    a force application system for urging the wafer and the pad against each other so that in each of the different overlapped positions the respective contact areas are in contact and have different values, the system being capable of providing different forces for the urging;
    a feedback circuit for providing first and second output signals representing respective first and second increments of the relative movement, the first and second increments being at spaced first and second times;
    a central processor programmed for computing first position data in response to the first output signal, the first position data representing the actual relative movement at the first time, the central processor being further programmed for computing second position data in response to the second output signal, the second position data representing the actual relative movement at the second time, the central processor being further programmed for computing pressure data representing the constant pressure to be maintained; and
    a force control processor separate from the central processor, the force control processor being programmed for converting the first position data to first area data representing the value of a first of the contact areas at the first time, the force control processor being further programmed to process the first area data and the pressure data to output first force data representing a first force to be applied to the first contact area at the first time;
    the force application system being responsive to the first force data for urging the wafer and the pad against each other with the first force to provide the constant pressure on the first contact area at the first time;
    the force control processor being further programmed for converting the second position data to second area data representing the value of a second of the contact areas at the second time, the force control processor being further programmed to process the second area data and the pressure data to output second force data representing a second force to be applied to the second contact area at the second time;
    the force application system being responsive to the second force data for urging the wafer and the pad against each other with the second force to provide the constant pressure on the second contact area at the second time.

12. A method of controlling a pressure to be applied to contact areas of a wafer and a polishing pad in chemical mechanical polishing operations, the method comprising the operations of:
    providing a first processor to input pressure data representing the pressure to be applied to the contact areas during a polishing step;
    providing a dedicated processor other than the first processor to only process three types of data, one type of data being data representing relative movement between the wafer and the pad in overlapped contacting positions, the pressure data being the second type of data;
    by use of the dedicated processor, computing area data representing a value of the contact area between the wafer and the pad in the overlapped positions, the area data being the third type of data; and
    by use of the dedicated processor, processing the area data and the pressure data to compute force data representing the force to be applied to the contact areas during the polishing step of the sequence.

13. A method of determining a value of available processing capacity of a processor for processing data to control a pressure to be applied to contact areas of a wafer and of a polishing pad in chemical mechanical polishing operations, comprising the operations of:
    characterizing steps of the chemical mechanical polishing operations according to the available processing capacity required for real-time processing of the step at a rate sufficient for controlling the pressure to be applied to the contact areas of the wafer and of the polishing pad during the chemical mechanical polishing operations, the characterizing being with respect to at least one of the following characteristics of the steps:
        values of variations in the pressure, or the time rate of change of the pressure, or the frequency of the relative movement between the wafer and the pad into the overlapped positions, or the rate of the relative movement; and
    for each of the at least one characteristic, determining a value of the available processing capacity required for the real-time processing of the step data necessary to control the pressure to be applied to the contact areas of the wafer and of the polishing pad in the step of the chemical mechanical polishing operations.

14. A method as recited in claim 13, wherein the processing is provided with an input of pressure data representing the pressure to be applied to the contact areas during a polishing step; and wherein the operation of determining a value is performed with respect to a dedicated processor that only processes three types of data, one type of the data being data representing relative movement between the wafer and the pad in overlapped contacting positions, the pressure data being the second type of data pressure data, and the third type of data being area data representing a value of the contact area between the wafer and the pad in the overlapped positions; and
    wherein the operation of determining a value is further performed with respect to the dedicated processor computing the area data, and then processing the area data and the pressure data to compute force data representing the force to be applied to the contact areas during the polishing step of the sequence.

15. A method according to claim 14, wherein:
    the characterizing operation is performed with respect to at least two of the characteristics of the steps; and
    the determining operation is performed for each of the at least two characteristics.

16. A method according to claim 14, wherein:
    the characterizing operation is performed with respect to at least three of the characteristics of the steps; and
    the determining operation is performed for each of the at least three characteristics.

17. A method according to claim 14, wherein:
    the characterizing operation is performed with respect to the four characteristics of the steps; and
    the determining operation is performed for each of the four characteristics.

* * * * *